United States Patent [19]
Kuznetsov

[11] Patent Number: 6,064,172
[45] Date of Patent: May 16, 2000

[54] METHOD AND APPARATUS FOR DETECTION, CLASSIFICATION AND REDUCTION OF INTERNAL ELECTRICAL FAULTS IN ALTERNATING CURRENT PROPULSION MACHINERY USING SYNCHRONOUS DETECTION SCHEME

[75] Inventor: Stephen B. Kuznetsov, New Castle, Pa.

[73] Assignee: Power Superconductor Applications Corporation, Ak.

[21] Appl. No.: 08/798,250

[22] Filed: Feb. 11, 1997

[51] Int. Cl.[7] ..................................... H02P 1/46
[52] U.S. Cl. .................... 318/716; 318/490; 318/434; 361/23; 324/546
[58] Field of Search .................. 361/18, 20, 21, 361/23, 28, 31, 33, 76, 77, 78, 85, 88, 93; 324/546, 545; 318/432, 434, 490, 491, 700–724

[56] References Cited

U.S. PATENT DOCUMENTS

| | | | |
|---|---|---|---|
| 4,716,648 | 1/1988 | Nel | 29/596 |
| 4,851,766 | 7/1989 | Shiobara et al. | 324/772 |
| 5,245,238 | 9/1993 | Lynch et al. | 310/116 |
| 5,252,915 | 10/1993 | Sedding et al. | 324/772 |
| 5,260,642 | 11/1993 | Huss | 322/51 |
| 5,488,281 | 1/1996 | Unsworth et al. | 318/806 |
| 5,642,249 | 6/1997 | Kuznetsov | 361/58 |
| 5,680,025 | 10/1997 | Bowers, III et al. | 318/806 |
| 5,737,164 | 4/1998 | Ferreira et al. | 361/31 |

Primary Examiner—David Martin
Attorney, Agent, or Firm—Clifford A. Poff

[57] ABSTRACT

A winding fault detection system provides classification and identification of winding faults or winding malfunctions. The fault detection system provides signals to individual electronic switches for segmented primary windings each having an electrical phase and grouped into sub-phases which are individually switch into or out of an excitation supply or isolated through the electronic switching in response to signals from the winding fault detection system. Each primary winding forms an electrical member which includes a stator having a poly-phase winding, and there is a secondary electrical member magnetically coupled with the stator. Each primary has magnetic field sensors which detect phase angle and magnitudes of radial components of air gap flux by magnetic measurement probes between each secondary electrical member and each primary electrical member and derives an electrical signal for a component of air gap flux contributing to electromagnetic torque at each position of each stator's periphery. Additionally, the system instantaneously stores data continuously derived from the magnetic sensors and determines a hierarchy of fault detection schemes.

19 Claims, 53 Drawing Sheets

Block Diagram for Generalized Internal Fault Detection

General hardware layout showing DC/AC converter and a 6-phase Permanent magnet machine with IFD.

Equivalent circuit for PM machine in steady-state

Equivalent circuit for PM machine in asynchronous mode with damper windings and operating at slip σ.

Note: Parameters $X_1$ and $X_2'$ are lumped together in parameters termed $X_1$ or $X_\sigma$.

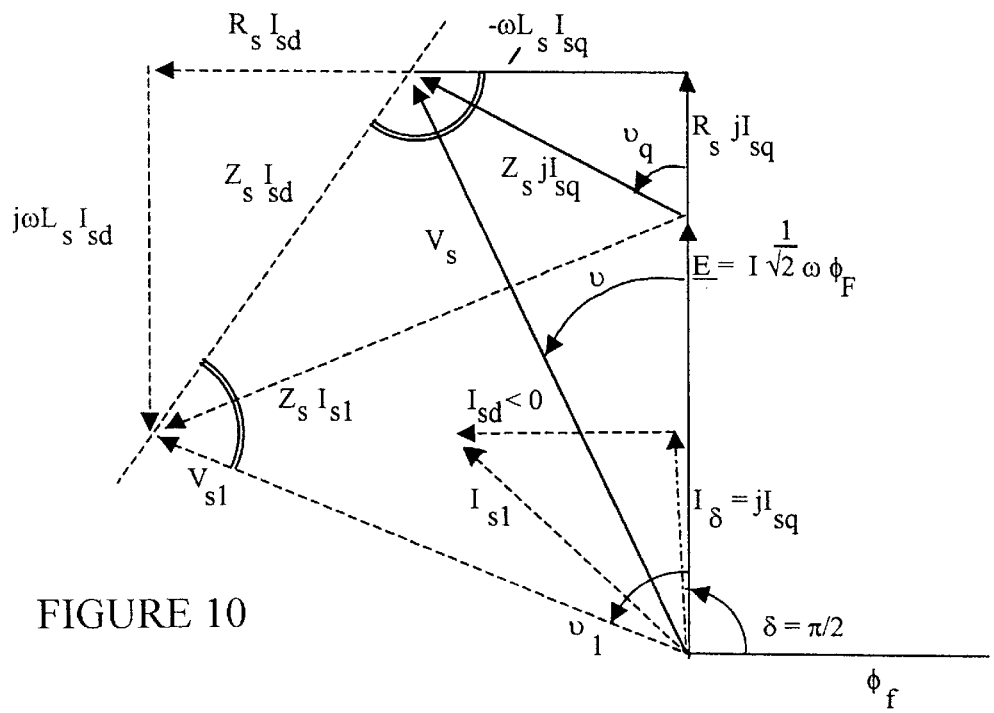
FIGURE 10
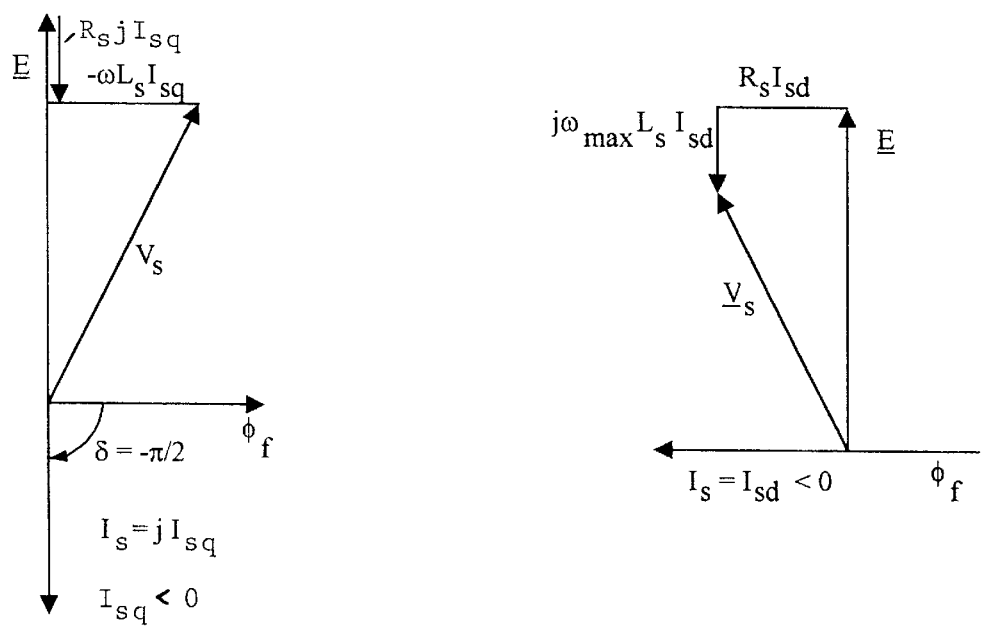
FIGURE 13
FIGURE 14

Synchronous motor with permanent magnet excitation and impressed stator currents

FIGURE 12  FAULT DETECTION SCHEME

FIGURE 15 — Internal Function Blocks for Fault Detection Coordinator FDC Block 56 Corresponding to Fault Detection Scheme FIGURE 15  Continued, page 2/3

FIGURE 15 Continued, page 3/3

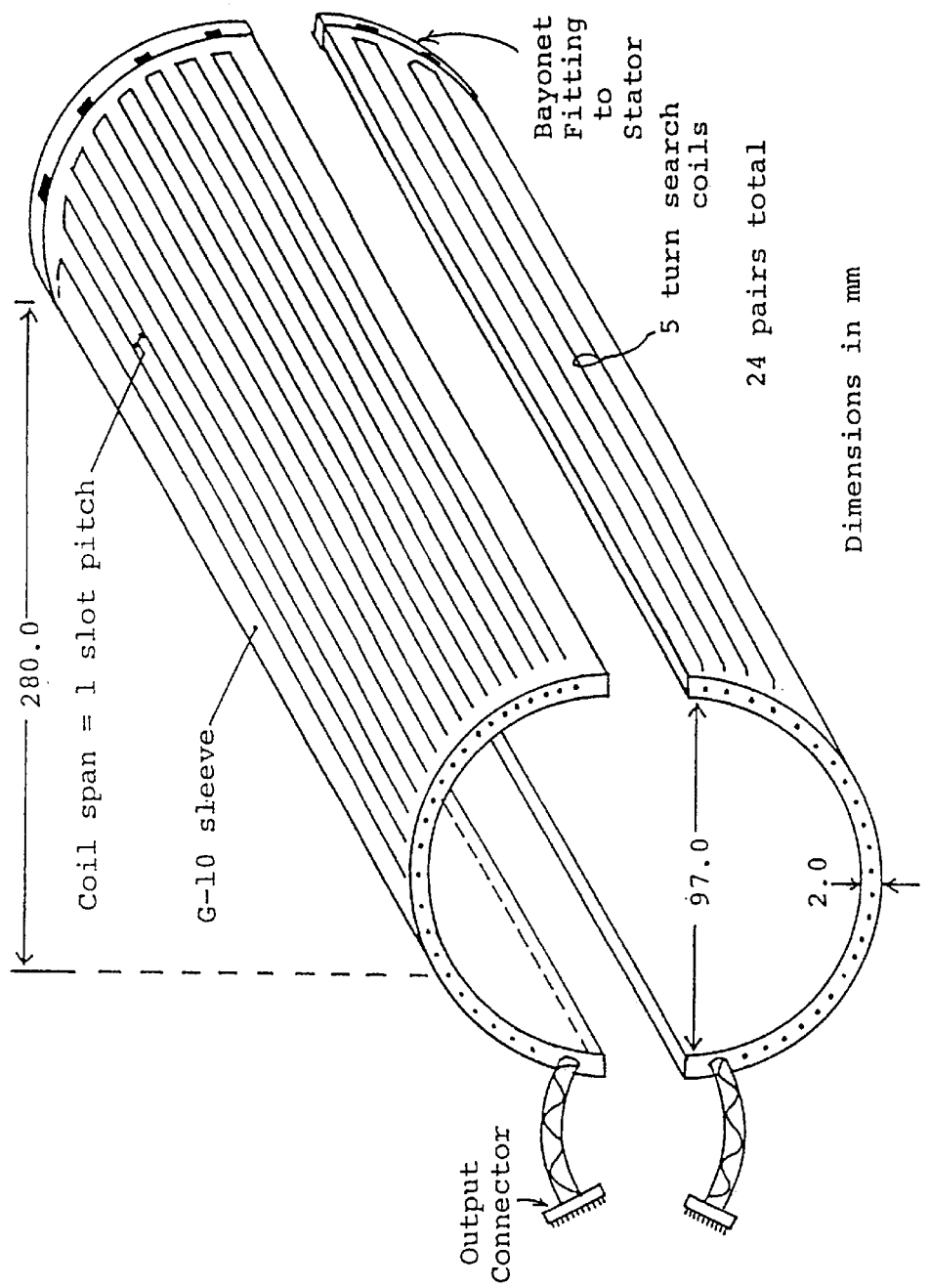
FIGURE 17  General layout of stator search coil ring (SCR) for use in experimental unit for measuring airgap flux with a minimum of leakage flux component and for calibrating FOV controller.

Stator winding layout for one phase with 240 coils total, quadrature symmetry and 4 parallels/phase.

Short-circuit waveforms in a highly inductive circuit showing the current wave at maximum offset with DC or transient and steady-state components shown.

Inductively coupled circuits of shorted and normal coils

Relative phase positions of $i_1$ and $i_2$ in the transient period in the $R_1$-$L_1$-$M$-$R_2$-$L_2$ combination.

General hardware layout showing DC/AC converter and a 6-phase Permanent magnet machine with IFD.

Block Diagram for Generalized Internal Fault Detection

Control System Topology

FIGURE 24 Open-Circuit Characteristic for MT08

Innermost Shear-Force Control Loop for Internal Fault Detection

Intermediate (Velocity) Control Loop

Notes:

1. Open-loop pole locations denoted by "X"
2. Arrows indicate motion of closed-loop poles with increasing $K_2$
3. Not to scale Velocity Loop Root-Locus Diagram Outer (Position) Control Loop Notes:
1. Open-loop pole locations denoted by "X"
2. Arrows indicate motion of closed-loop poles with increasing $K_3$
3. Not to scale Velocity Loop Root-Locus Diagram Class I stator winding with 1 parallel per thyristor, quadrature symmetry shown in 192 coils, 6 phase example.

Class IV stator winding with 4 parallels per thyristor switch, quadrature symmetry shown in 192 coil example.

Class VIII stator winding with 4 parallels per thyristor, Non-quadrature symmetry. Reference Designs MT08 and MT10.

METHOD AND APPARATUS FOR DETECTION, CLASSIFICATION AND REDUCTION OF INTERNAL ELECTRICAL FAULTS IN ALTERNATING CURRENT PROPULSION MACHINERY USING SYNCHRONOUS DETECTION SCHEME

STATEMENT REGARDING FEDERALLY SPONSORED RESEARCH OR DEVELOPMENT

U.S. Naval Sea Systems Command, U.S. Navy Contract No. N00024-96-C-4205.

CROSS-REFERENCE

This application is related to contemporaneously filed U.S. patent application Ser. No. 07/798,246, now abandoned and titled "Method and Apparatus for Detection, Classification and Reduction of Internal Electrical Faults in Alternating Current Propulsion Machinery Using Asynchronous Detection Scheme" by Stephen B. Kuznetsov, incorporated by reference herein.

FIELD OF THE INVENTION

The present invention pertains to an alternating current electric machine. More specifically, the present invention is related to the control and hierarchy of control of the electric machine.

BACKGROUND OF THE INVENTION

Internal fault detection of electrical machines as described in the following invention is a technique for rapid electronic detection of electric power faults or malfunctions in rotating and linear electric machinery particularly to the primary winding. These type of faults are generally due to aging effects of the primary winding, mechanical damage to the primary winding or an overvoltage/overcurrent electrical condition which accelerates the winding insulation degradation. The primary windings may be composed of conductor of the normal conducting type or the superconducting type employing advanced materials such as niobium-titanium, niobium-tin, yttrium or bismuth alloys. The machine faults which are most prevalent are categorized into eight distinct types:

a. Line to ground coil insulation faults within the primary slot resulting in a short-circuit or over-current condition or overheating of the coil and magnetic core. (Type III).

b. Line-to-line coil insulation faults within the primary slot resulting in an overcurrent/overheating condition. (Type II).

c. Line-to-line coil insulation failures or short-circuits in the machine end-region or terminal box area resulting in an overcurrent/overheating condition. (Type VI).

d. Primary magnetic core faults consisting of short-circuited laminations or degradation of the interlaminar insulation resulting in conduction between laminations. (Type VII).

e. Turn-to-turn insulation faults within a particular primary coil due to insulation failure or damage. (Type I).

f. Open-circuit fault whereby conductors separate within a particular primary coil interrupting the flow of current. (Type IV).

g. Open-circuit fault whereby conductors or coil groups separate in the machine end-region or terminal box area interrupting or altering a normal flow of phase current. (Type V).

h. Partial discharge or electric dielectric failure of the primary coil insulation system resulting in an increased progressive degradation of the primary insulation system and not necessarily resulting in a short-circuit current condition. (Type VIII).

The other aspect of the described invention is the method and apparatus for segregating or isolating selected sections of primary phase windings or regrouping the primary winding to minimize the affects of a primary electrical fault on the overall operation of the motor or generator. The invention uses high speed electronic switching devices which are connected to either individual primary coils or to primary phase groups which are responsive to signals from the master control system. This system performs both a diagnostic function to determine the location and type of fault and then proceeds to determine a schedule of switching of primary coil members to allow for isolation of the electrical fault section(s) and to enhance a specific output of the electrical machine such as torque, voltage output or reactive power.

A particularly novel aspect of the described invention is the ability to segregate primary coil groups in a fashion that results in the airgap magnetic flux being maintained in a symmetrical electromagnetic condition whereas otherwise the location and magnitude of the fault would cause a large asymmetry in airgap flux spatial distribution and magnetic core magnetic flux resulting in overheating or unacceptable magnetic overloads. The criteria for performing selective coil isolation is prescribed by the master control system and dependent on the machine's specific design, output/input power level, speed and fault classification. An important aspect of the described invention is the ability of the control system to rapidly categorize the fault according to severity and type within 10–20 cycles of line frequency period time and to initiate very rapid switching (within for example 0.5 second) of the sectionalizing switches to minimize the buildup of short circuit current or overheating effects. In this fashion, the fault current does not build up to full value for a significant amount of time and effects such as prolonged arcing or overheating are entirely mitigated.

A further novel aspect of the described invention is the ability of the control system to attenuate acousto-magnetic noise within the electrical machine by virtue of having an active control means to yield symmetric magnetic airgap flux and symmetric magnetic core flux over the entire speed/torque range when significant primary winding faults are present. In a normal machine without internal fault detection, primary faults results in large unbalanced magnetic pull and accompanying acoustic-magnetic noise. In the described invention, the control system specifically switches out selected primary coils or coil groups to ensure a balanced magnetic condition and thus minimize both unbalanced magnetic pull (rotor to stator radial pull) in the machine and attenuate any sources of magneto-acoustic noise.

By maximizing the machines magnetic symmetry through fault diagnostics and subsequent faulted-coil switching, the machine's torque pulsations are attenuated and the overall acoustic performance of the entire drive is enhanced when only a limited portion of the primary core is excited in the fault mode.

The system has application to four broad types of electrical machinery:

a. synchronous rotating machinery
b. asynchronous rotating machinery
c. synchronous linear machinery
d. asynchronous linear machinery Within synchronous machinery, there are three classes as follows:
1. permanent magnet (PM) field machines
2. wound-field machines
3. reluctance type machines Within each class, the machines are configured with the field structure rotating (category 1) or the field structure stationary (category 2).

With the asynchronous or induction machinery, there are three broad classes as follows:
1. solid-rotor, non-wound secondary member
2. cage rotor secondary member composed of discrete conductors which are short circuited at each end of rotor and interspaced with ferromagnetic core material
3. wound-rotor composed of insulated conductive secondary windings which are brought out to a set of polyphase current collectors or slip rings for connection of an external impedance or power source.

While the standard configuration for an induction machine is to have the secondary member rotating, it is understood that induction machinery can be configured with the secondary member stationary and the primary member rotating whereby the primary windings are attached to rotor slip-rings for transfer of electrical power into or out of the machine. The primary member in all 3 classes of induction machines are characterized by cylindrical ferromagnetic cores with uniform longitudinal slotting extending the length of the machine's "active core" and fitted with conductive windings which are insulated from the primary core. The described invention is applicable to what is referred to in the art as diamond shaped coils, either lap wound or concentric wound. Standard machines have double layer coils in that each primary core slot contains a coil side for upper and lower slot portions. Alternate arrangements have slots which contain 3 or 4 coil sides and also subject of this patent.

FIG. 1 shows a cross section of a 4 pole multi-megawatt wound field synchronous machine as may be used for either motor or generator application. The stator contains 54 uniform slots and the rotor contains 24 slots which are distributed uniformly so as to yield a sinusoidal spatial variation in magnetic flux along the machine bore periphery. The rotor corresponding to this type of machine is shown in FIG. 2. which has air-cooled rotor slots. The slots contain 12 conductors wound in series connection in Slot "A" and 16 conductors in series in Slot "B". The subject machine has a total of 8 Type "A" slots and a total of 16 type "B" slots.

FIG. 3 shows a cross-section of a radial flux permanent magnet machine as designed for the range of 100 kVA to 5000 kVA, either motor or generator. Permanent magnet machines are the one class of machinery which do not have the ability to instantly switch off the excitation source when a fault occurs and are consequently and inherently the most susceptible to primary winding damage when a fault occurs if there is no mechanism by which to reduce or cutoff field excitation in an expeditious fashion such as switching-off a solid state device or regulator. The permanent magnet machine must without the described invention simply wait until the rotor is physically stopped from spinning to yield zero effective excitation of the primary. Depending on the inertia of the rotor this may take several seconds minutes to several hours for the rotor to stop, during which time considerable heating of the primary windings or core is apt to exist.

The PM machine secondary or excitation structure contains axial slots which contain hard permanent magnet material such as neodymium-boron-iron or samarium-5-cobalt magnets. The energy product for these magnets are high in the range of 35–45 M-G-Oe. The stator or primary for this PM machine contains an array of axial slots in a laminated ferromagnetic core whereby the bore diameter is kept small to correspond to a small diameter rotor designed for very high rotor tip speeds such as 650–750 ft.sec. and high shaft speeds typically in excess of 20,000 rpm.

FIG. 4 shows an alternative arrangement of an axial flux permanent magnet synchronous machine whereby the orientation of the flux originating from the permanent magnets is directed axially or transverse in contrast to the machine of FIG. 3 which uses radial magnetic flux orientation. The advantage of this design is that it uses a hollow drum rotor in contrast to cylindrical rotor and in doing so has a reduced mass and inertia for the rotor with an accompanying faster speed of response. The construction of the stator core and the primary windings is materially different in this machine. The flux densities for the axial flux machine are approximately the same as with conventional radial flux machines, however the machine is generally characterized by the absence of ferromagnetic core material on the rotor which is typically restricted to an electrically conductive material. These machines are an improvement over the prior art because the length of the rotor magnetic circuit and consequent iron core losses/overall weight are significantly lower in the axial flux units.

FIG. 5 shows a winding diagram for a 6 phase, 32 pole permanent magnet naval propulsion generator which is wound specifically for use with direct rectification of each winding and phase of the machine output. The field is rotating and composed of 32 permanent magnet assemblies typically composed of neodyumium-boron-iron magnets. The flux from these magnets may be directed either radially or axially. This machine has by way of example 24 coils per armature winding arranged as 4 parallels per armature. Each stator coil is multipolar and spans 8 pole pitches. The winding and construction details are listed in Table 5.

This type of machine is non-conventional in that it is wound in peripheral sectors such as four quadrants where each quadrant contains a complete phase grouping and independent rectification means connected to each phase winding in each sector. FIG. 5a shows an arrangement whereby each sector phase winding feeds an H bridge rectifier, which may be either a diode rectifier or a controlled rectifier such as a thyristor or insulated gate bipolar transistor (IGBT). Thus the whole machine has a total of 24 H-bridge rectifiers designated blocks 231 through 254. The outputs of the rectifiers may be configured in parallel or in series or a combination thereof; the FIG. 5a shows a parallel grouping of outputs designated DC1, DC2, DC3, DC4.

FIG. 5b shows a variation on the basic machine winding as described in Table 5 with the modification of an interconnected rectifier bridge 345, 347, 349, 350 linking all phases of a * particular quadrant. This arrangement reduces the total number of active devices (diodes or thyristors) in the system and permits connecting quadrants in series or in parallel. Both FIG. 5a and 5b represent systems which are prior-art and do not have inherent quadrature or diametrical magnetic symmetry. These arrangements are sources of high magneto-acoustic noise and vibration when one coil group is opened or short-circuited or allowed to have an MMF or current loading substantially different from adjacent coil groups. However, these configurations can be specially controlled to yield magnetic symmetry and low acoustic noise by insuring that all H bridge rectifiers are controlled rectifiers along with a comprehensive control strategy for balancing of MMF along the machines periphery. For example, if coil number 2 is found to be defective, then the controlled rectifiers operating coils 2 and 14 must be made open circuit. If the acoustic-magnetic noise is not sufficiently low with diametrical symmetry, then the IFD control system so described throughout this invention must then proceed to produce quadrature magnetic symmetry by additionally having controlled rectifiers for coils 8 and 20 switch these circuits to open circuit conditions or otherwise isolate these coils from excitation derived from either airgap flux or line power.

The subject invention as applied to a permanent magnet generator modifies the arrangement of FIG. 5 by having diametrical symmetry as shown in FIG. 6. In FIG. 6a, windings 1 and 13 are permanently connected in series, winding 2 and 14 are in series, etc. continuing for each phase group and typically each phase group is floating above ground. There are two main output busses: DC1 and DC2 which may be connected in either series or parallel. Rectifiers 331 through 342 are diode or controlled rectifier H-bridges with the circuit shown in the enlarged view in FIG. 6a. This also shows the fault detection system instrumentation points for each winding as designated P1 through P12. Non-contacting current transformers are included in each phase winding and designated 351 through 362.

FIG. 6b shows a generator winding with diametrical magnetic symmetry subject of this invention with the provision of two interconnected polyphase bridge rectifier assemblies 345 and 347 as appropriate for high power applications. This has diametrical magnetic symmetry and two DC output busses: DC1 and DC2 and fusible devices F1 through F12. The fault diagnostic system uses instrumentation points P1 through P12 and current transformers on each phase winding designated 351–362.

These windings use the same windings as given in Table 1 with the exception that the coil number of turns is one-half or 8 turns per coil and the number of strands are increased from 20 to 40 strands per coil for the same terminal voltage and power rating as for FIG. 5. It is implicit in both FIG. 6a and FIG. 6b that the phase winding coils are interconnected such that they span a multiple slot pitches (e.g. 8 slots) and are electrical phased 30 degrees apart between adjacent numbers coils such as number 6 and 7. Coils numbered 1 and 13 and similar groups are thus phased 12×30 degrees or 360 electrical degrees apart and spaced 180 mechanical degrees apart.

The direct voltage measurements on the machine coils (P1–P12) may in the preferred embodiment for the generator be augmented by airgap radial flux sensing, stator bore mounted flux coils which span a stator slot pitch and are a full slot length. These bore mounted flux coils are made to be a slot pitch wide independent of the width (span) of the power coils in the stator winding. The flux coils then forms the major input signal to the digital signal processors comprising the internal fault detection system.

TABLE 1

High Frequency PM-Rotor Generator Design Characteristics

| | |
|---|---|
| Stator Output @ 85% P.F. | 10 Megawatts |
| Apparent Power Output | 11.76 MVA |
| Output Voltage/Current | 600 V rms/3266 A rms |
| No. of Phases | 6 |
| No. of Poles | 32 |
| Magnet Material | Neodymium-Boron-Iron |
| Shaft Speed | 3600 rpm |
| Output Frequency | 960 Hz |

TABLE 1-continued

High Frequency PM-Rotor Generator Design Characteristics

| | |
|---|---|
| Parallels per Phase | 4 |
| No. of stator slots | 192 |
| Slots per rotor pole | 6 |
| Slots per pole and phase | 1 |
| Stator slot depth | 2.134 cm |
| Stator slot width | 0.790 cm |
| Stator slot area | 1.686 sq. cm. |
| Stator slot pitch | 1.37 cm |
| No. of turns per coil | 8 |
| Coils per slot | 2 |
| Current per phase parallel | 816 A rms |
| Current per slot at full load | 1632 A rms/2307 A pk |
| Current Loading at stator bore | 119,124 A/m periphery |
| No. of Litz wires/coil | 8 |
| No. of strands per Litz wire | 20 strands, No. 22 gauge |
| Cross section area of a wire | 0.649 sq. mm. |
| Cross section of a coil | 103.8 sq. mm. |
| Current density | 7.85 A/sq. mm. |
| Stator core length | 52 cm |
| Stator Lamination thickness | 3 mils |
| Stator core outer diameter | 83.5 cm |
| Stator core inner diameter | 76.7 cm |
| Radial Airgap per side | 1.30 cm |
| Airgap Magnetic field at stator bore | 0.455 Tesla average |
| Airgap Field x Current Loading Product | 54,201 T-A/m |

SUMMARY OF THE INVENTION

The present invention pertains to an alternating current dynamo electric machine. The machine comprises an excitation supply. The machine comprises an electronic switch means. The machine also comprises a winding fault detection system including means for classification and identification of winding faults or winding malfunctions. The fault detection system is connected to the electronic switch means. The machine comprises segmented primary windings. Each of the primary windings has a phase. Each phase is grouped into sub-phases which are individually switched into or out of the excitation supply or isolated through the electronic switching means in response to signals from the winding fault detection system.

In a preferred embodiment, each primary winding includes a stator having a winding, and there is a rotor winding associated with the stator. Each of the stators has magnetic sensors which detect phase angle and magnitudes of an air gap flux by magnetic blocks between each rotor winding and each stator and drives a signal for a component of air gap flux contributing to electromagnetic torque at each position of each stator's periphery. Additionally their includes means for continuous storage of instantaneous data derived from the signal. The storage means is connected to the magnetic sensors.

BRIEF DESCRIPTION OF THE DRAWINGS

In the accompanying drawings, the preferred embodiment of the invention and preferred methods of practicing the invention are illustrated in which:

FIG. 10 shows the phasor diagram for $\delta=\pi/2$ which is the maximum torque position or static stability limit for a non-salient pole turbine type synchronous machine.

FIG. 17 shows a stator search coil ring for use in measuring airgap magnetic flux.

DESCRIPTION OF THE PREFERRED EMBODIMENT

Figure 1A:
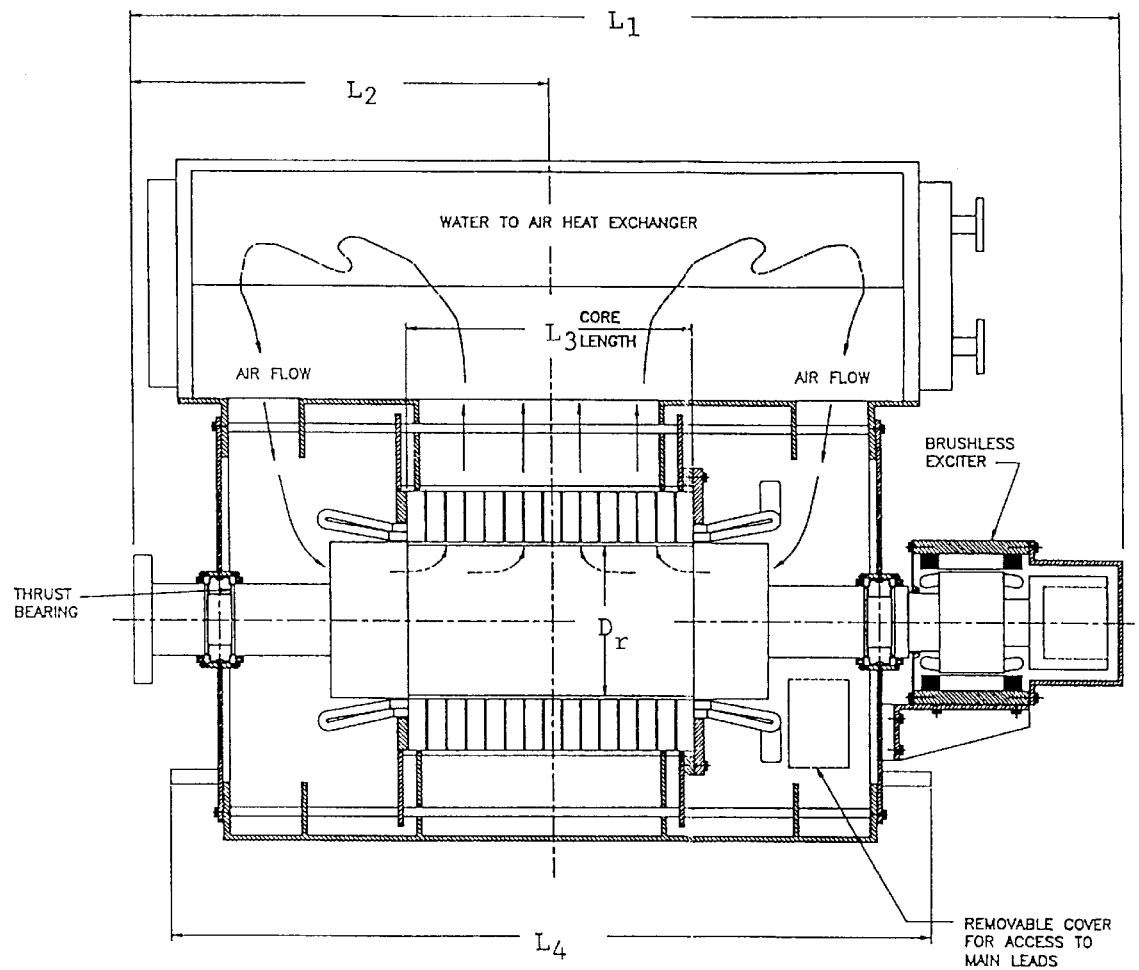
FIGS. 1A and 1B show a 4-pole multi-megawatt wound-field synchronous machine as may be used for either motor or generator application. The stator contains 54 uniform slots and the rotor contains 24 slots which are distributed non-uniformly so as to yield a sinusoidal spatial variation in magnetic flux along the machine bore periphery.
Figure 1B:
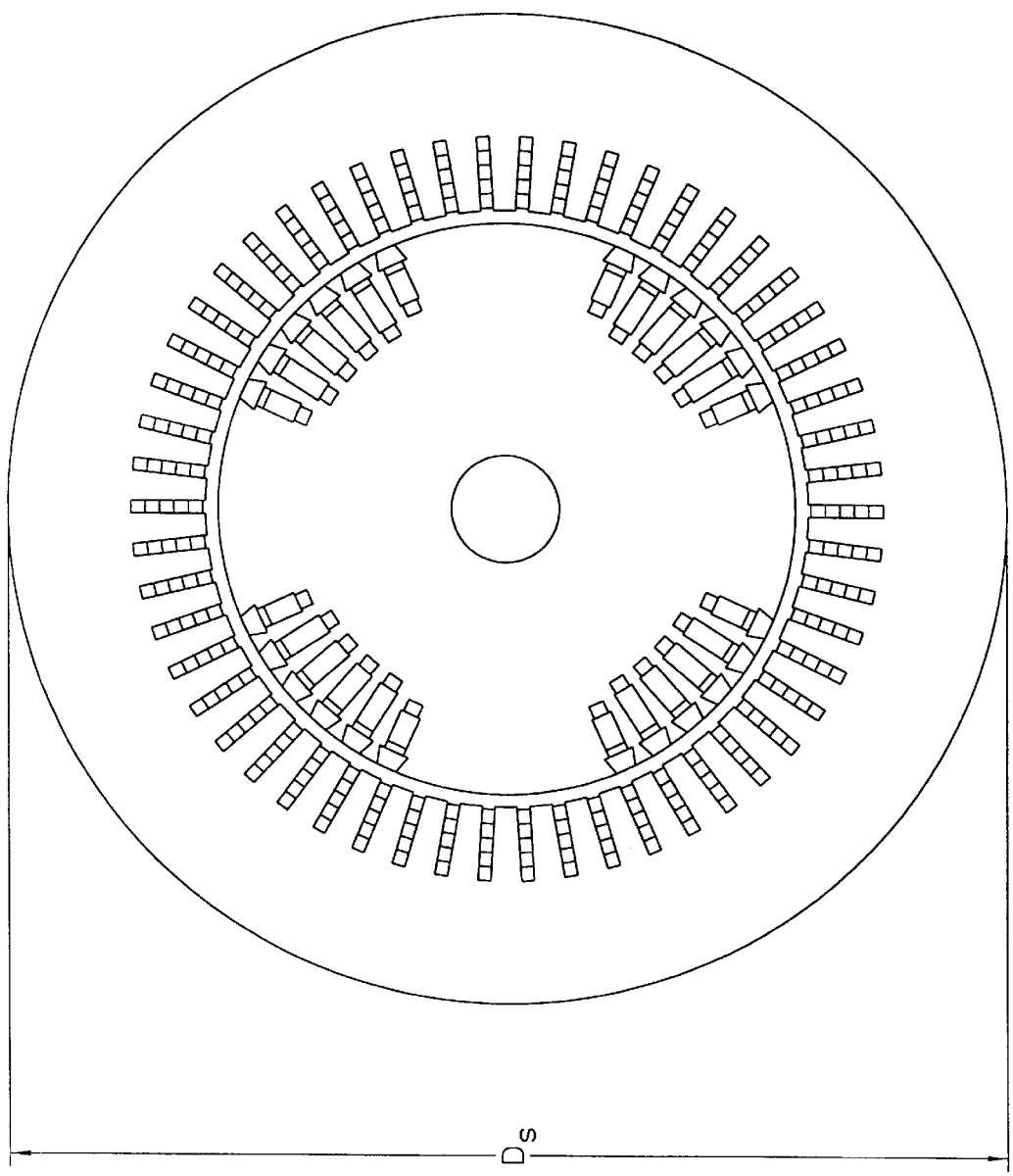
Figure 2A:
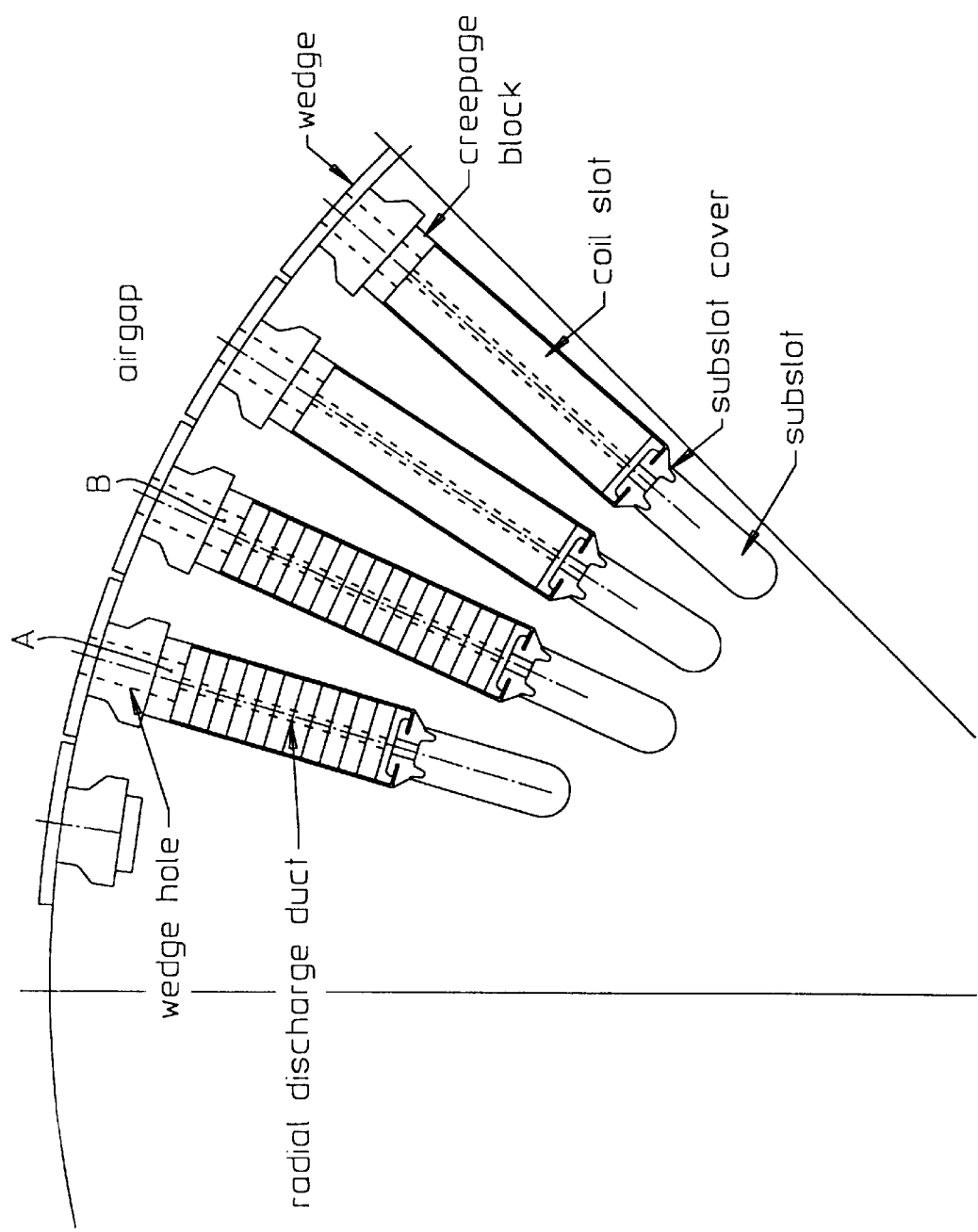
FIG. 2A Rotor cross section for one pole of machine of 4 pole machine corresponding to FIG. 1B.
Figure 2B:
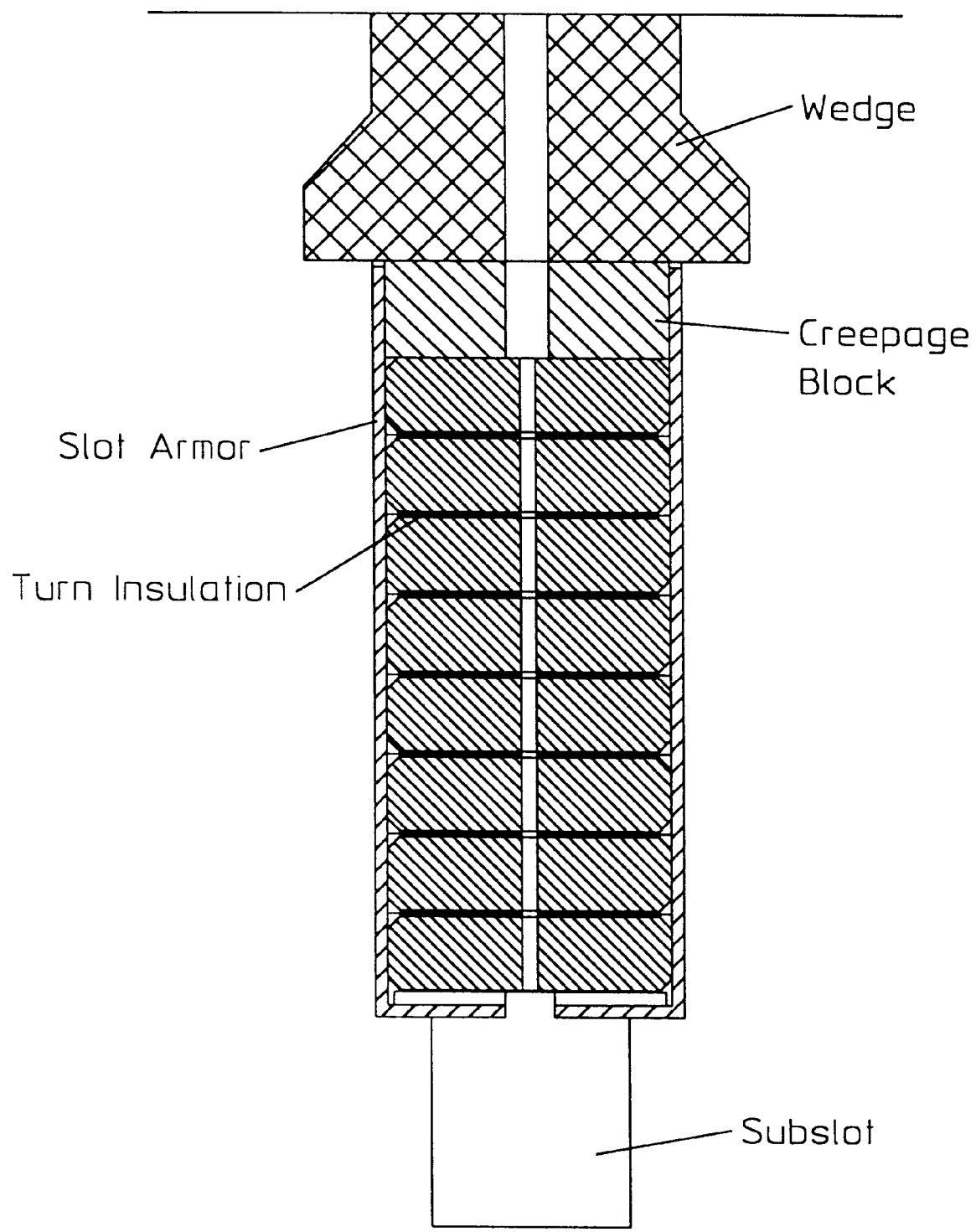
FIG. 2B Rotor slot cross-section using air-cooled slots, corresponding to rotor of FIG. 2A.
Figure 3:
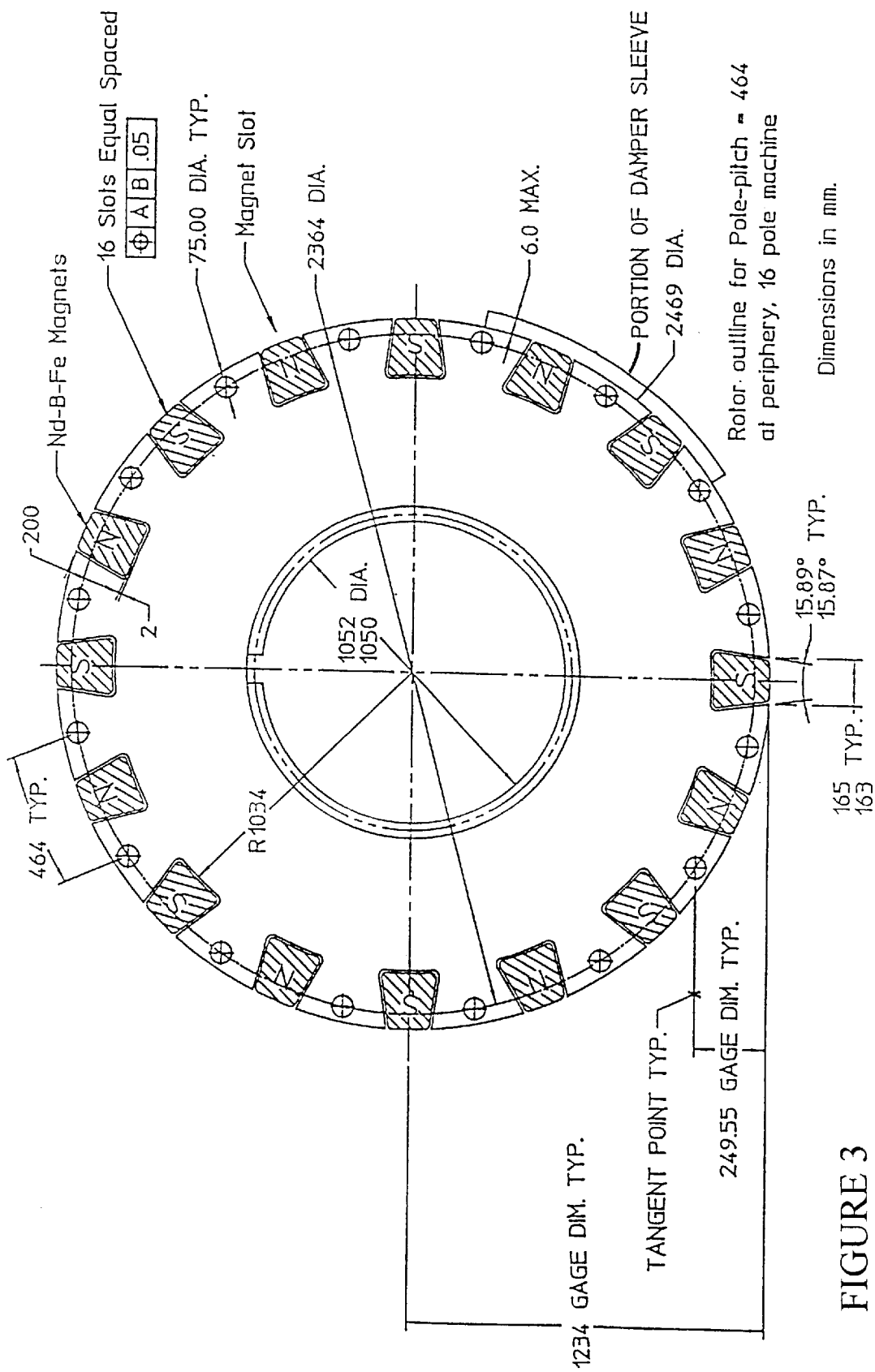
FIG. 3 shows a cross-section of radial flux permanent magnet machine as designed for the range of 100 kVA to 5000 kVA, either motor or generator.
Figure 4:
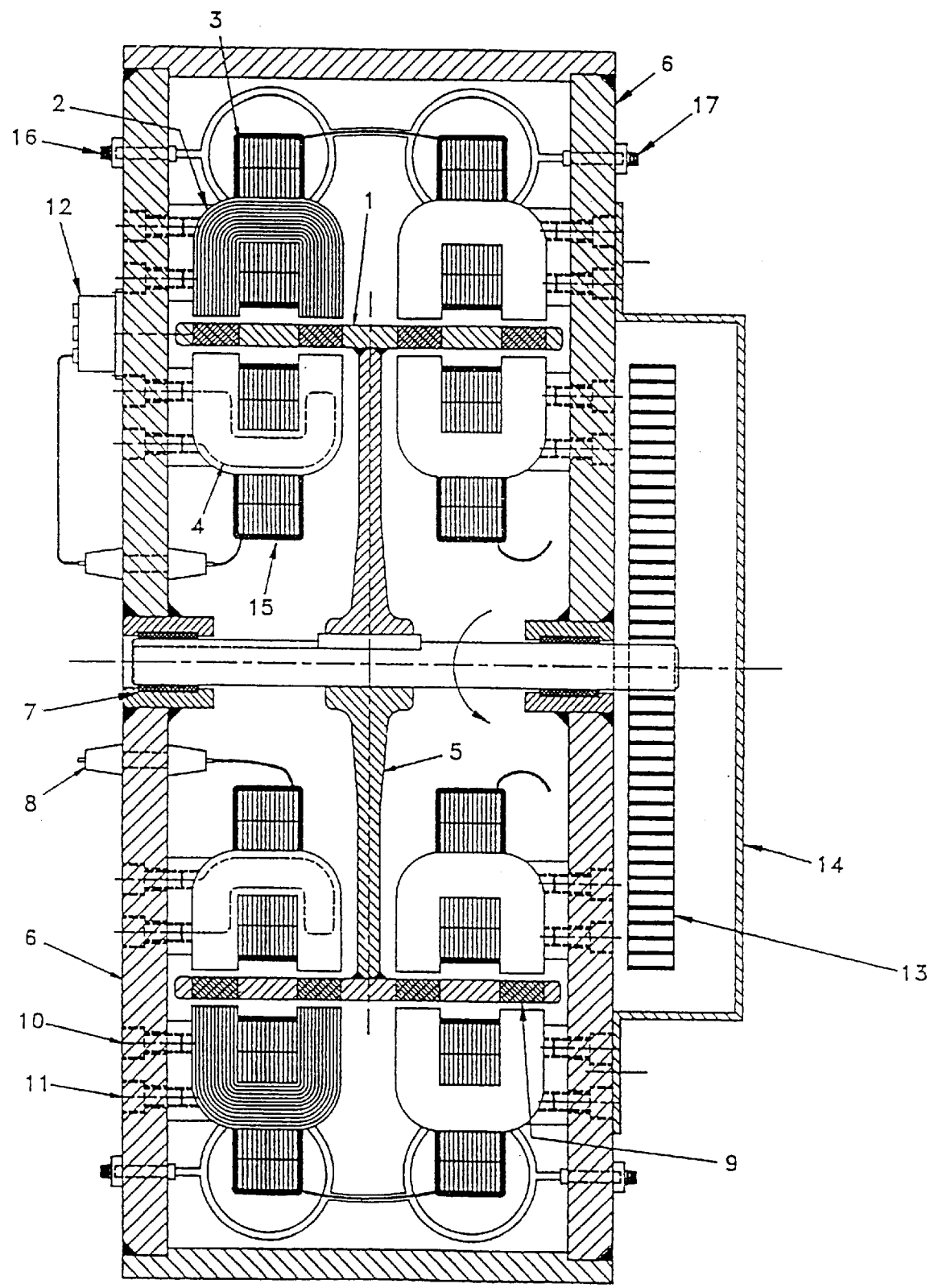
FIG. 4 shows an alternative arrangement of an axial flux permanent magnet synchronous machine whereby the orientation of the flux originating from the permanent magnets is directed axially or transverse.
Figure 5A:
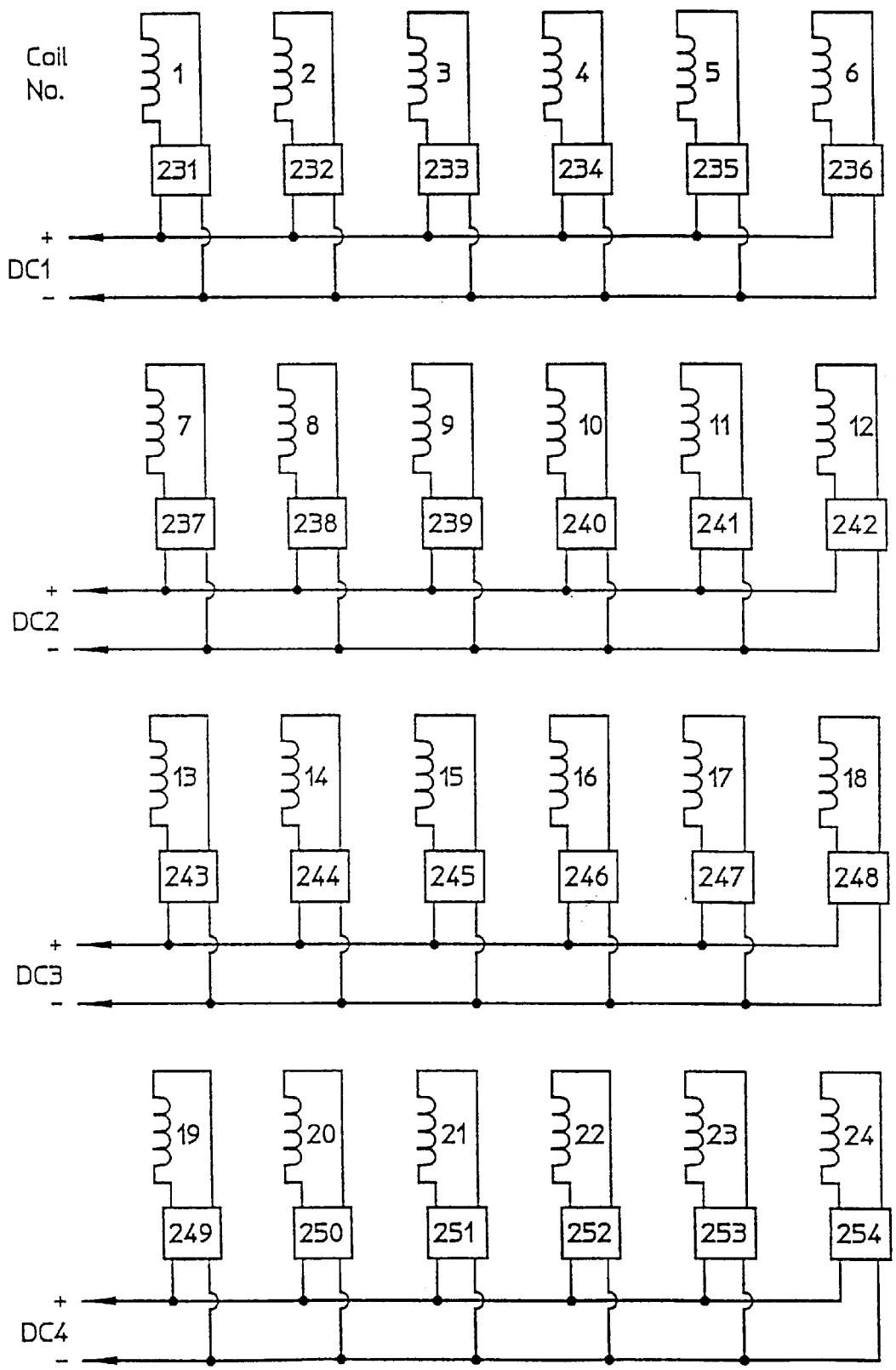
FIG. 5a shows a winding diagram for a 6-phase, 32-pole permanent magnet naval propulsion generator which is wound specifically for use with direct rectification of each winding and phase of the machine output. The field is rotating and composed of 32 permanent magnet assemblies typically composed of neodyumium-boron-iron rare-earth magnets.
Figure 5B:
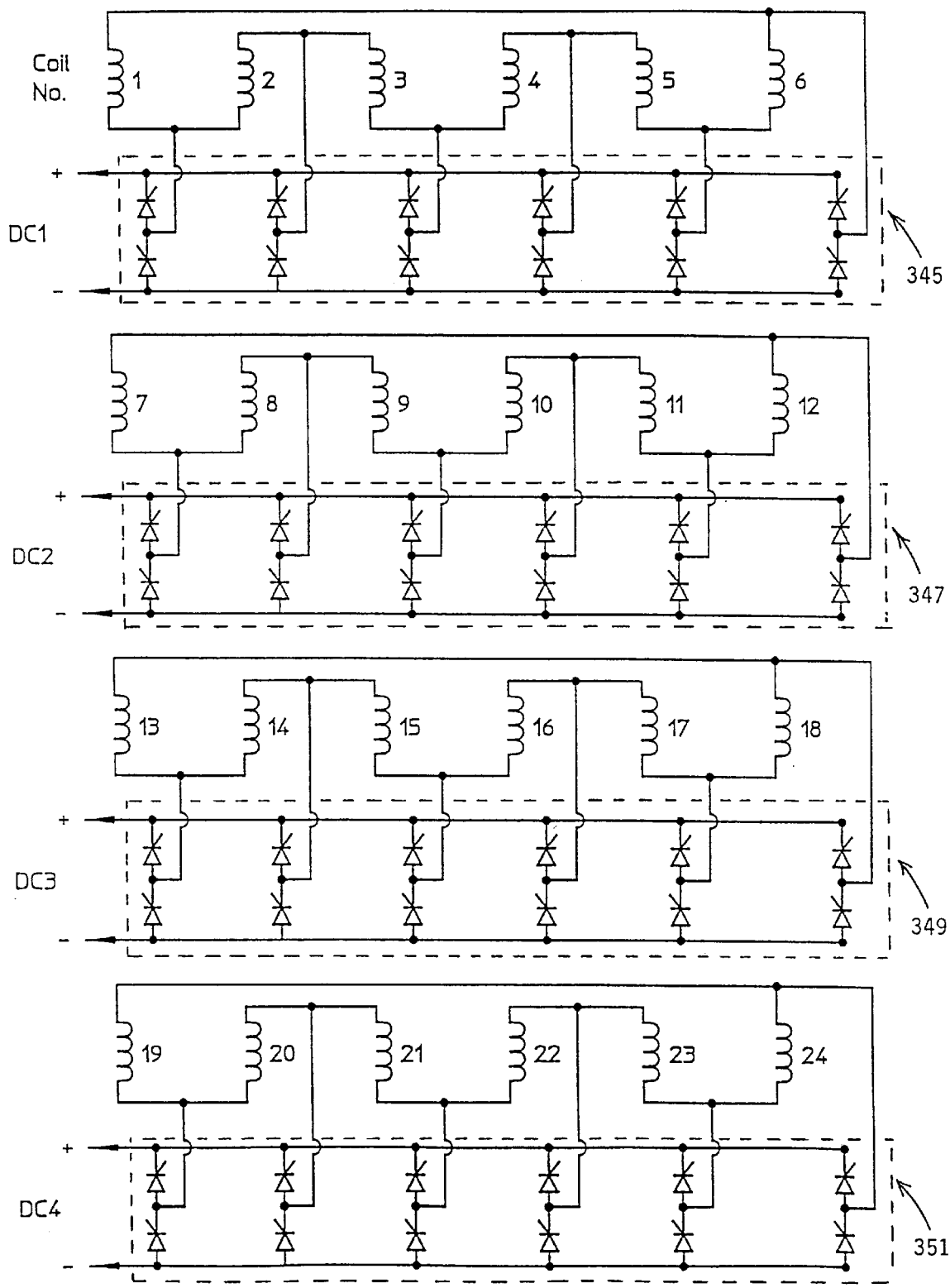
FIG. 5b shows a variation on the basic machine winding as described in Table 5 with the modification of an interconnected rectifier bridge 345, 347, 349, 350 linking all phases of a particular quadrant. This arrangement reduces the total number of active devices (diodes or thyristors) in the system and permits connecting quadrants in series or in parallel.
Figure 6A:
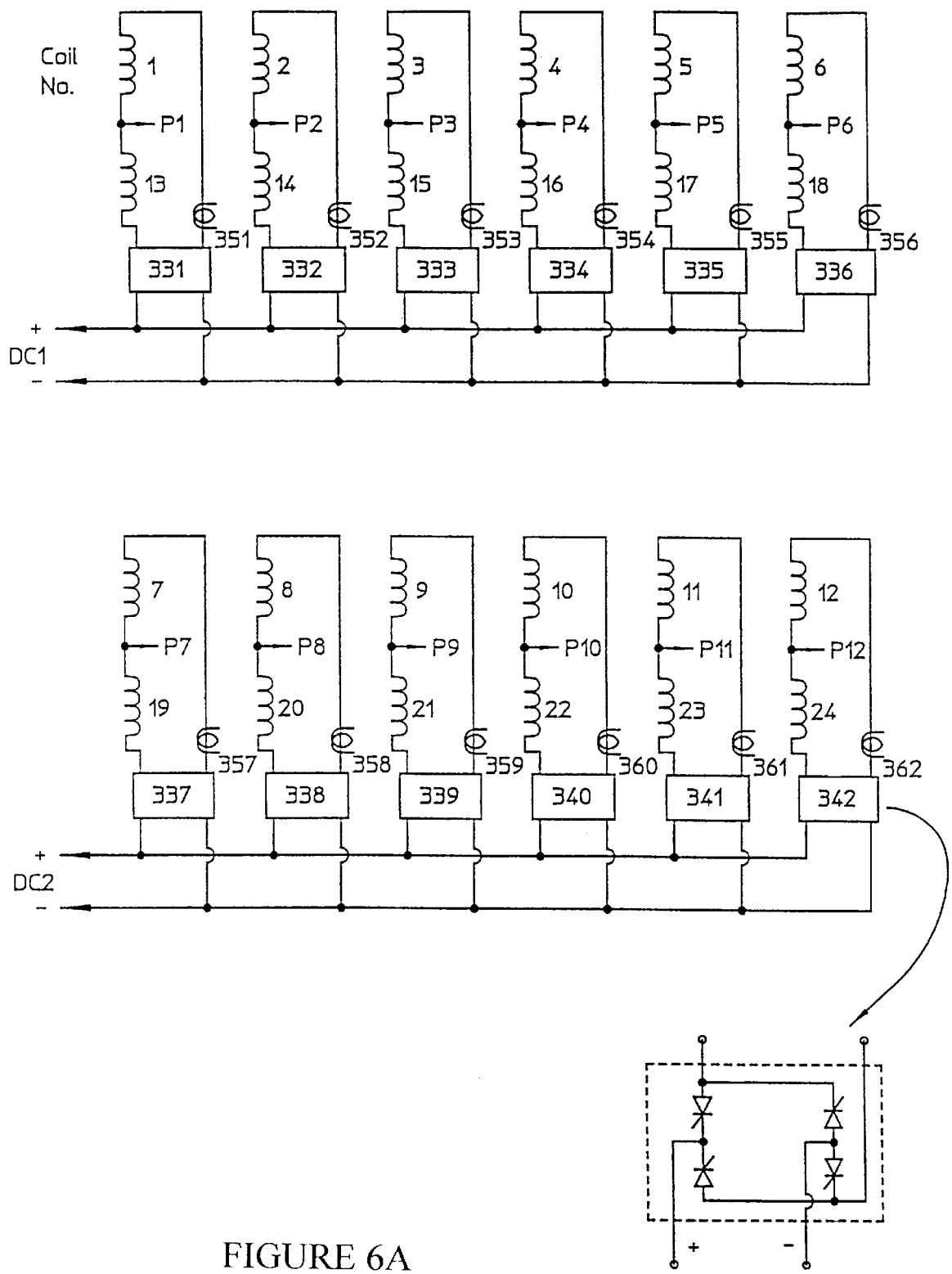
FIG. 6a shows the subject invention as applied to a permanent magnet generator by having diametrical symmetry with windings 1 and 13 permanently connected in series, windings 2 and 14 are in series, etc. continuing for each phase group and typically each phase group is floating above ground. There are two main output busses: DC1 and DC2 which may be connected in either series or parallel.
Figure 6B:
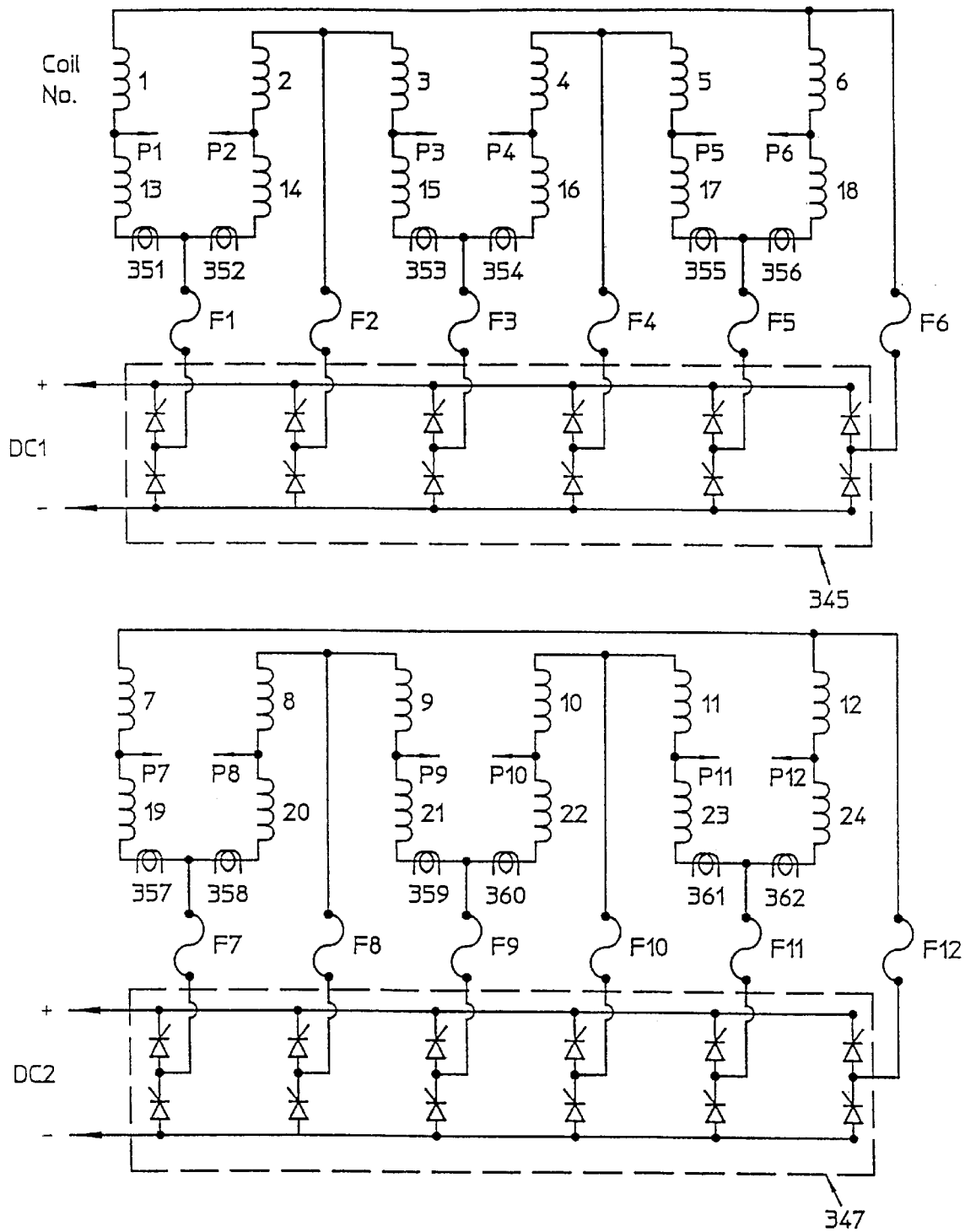
FIG. 6b shows a generator winding with diametrical magnetic symmetry subject of this invention with the provision of two interconnected polyphase bridge rectifier assemblies 345 and 347 as appropriate for high power applications. This has diametrical magnetic symmetry and two DC output busses: DC1 and DC2 and fusible devices F1 through F12.

Referring now to the drawings wherein like reference numerals refer to similar or identical parts throughout the several views, and more specifically to figure thereof, there is shown a system of on-line analysis and decomposition of magnetic flux signals taken in the machine's airgap and corresponding system for prediction of torque or power input.

This is a synchronous fault detection scheme based on field-oriented vector analysis and without need for a transient, asynchronous operation of the machine as discussed in concurrently filed U.S. patent application Ser. No. 08/798,246, now abandoned and incorporated by reference herein.

Figure 7:
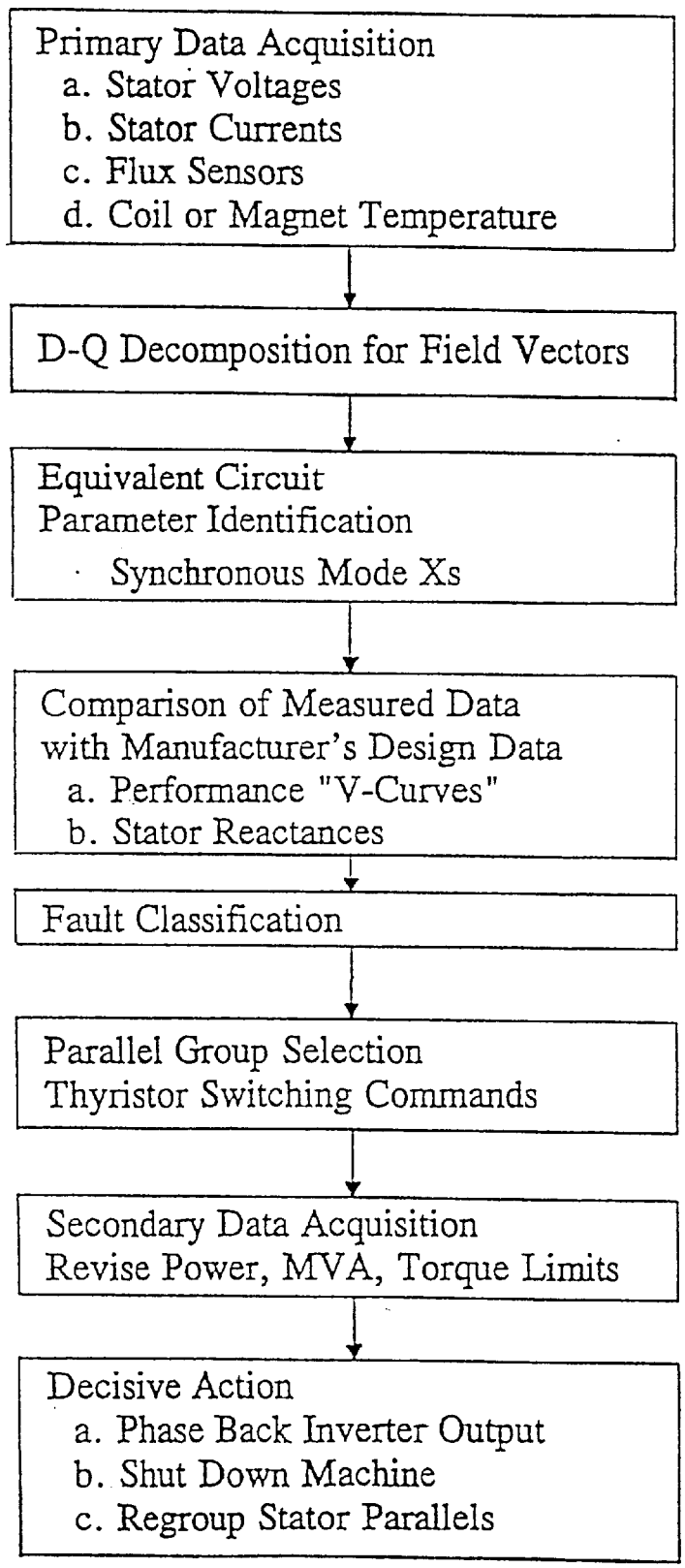
FIG. 7 shows a block diagram of a fault detection apparatus. The fault detection apparatus is specific to a permanent magnet machine operating exclusively in a synchronous mode with fixed rotor excitation.
Figure 8:
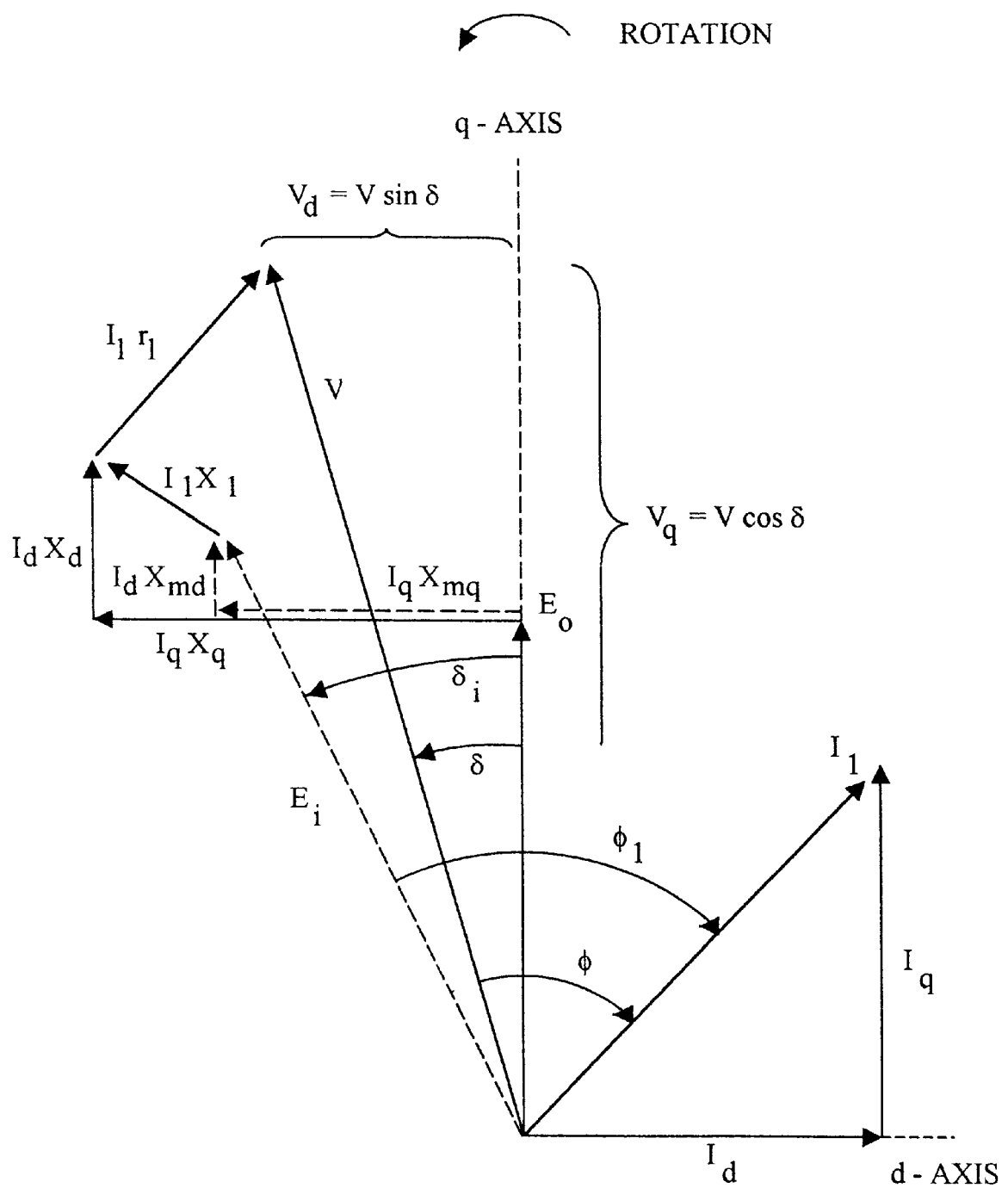
FIG. 8 shows a D-Q axis phasor diagram for a permanent magnet or constant field excitation synchronous propulsion motor with internal EMF Ei, internal phasor angles and direct/quadrature reactance-based voltage drops.

In FIG. 7, there is shown a block diagram of a fault detection apparatus. The fault detection apparatus is specific to a permanent magnet machine operating exclusively in a synchronous mode with fixed rotor excitation. The analysis is performed on the basis of a 2-pole machine is a basic module for all multi-polar motors. The rotor is assumed to be fed from 2 current sources producing a rotor current vector.

$$i_r(t) = I_f - \frac{I_f}{2}e^{j\gamma} - \frac{I_f}{2}e^{-j\gamma} = \frac{3}{2}I_f$$

The stator is fed by a controlled current source which has control loops with time delays described by $$T\frac{d\,i_{sm}}{d\,t} + i_{sm} = i^*_{sm} \quad m = 1, 2, 3$$

*=reference value
where $$\sum_{m=1}^{3} i_{sm} = 0$$

and $T \leq 1$ ms. The rotational speed is $$\omega = \frac{d\,e}{d\,t}$$

and the field flux $\phi_f = L_o I_f$, the stator voltage is $$V_s(t) = R_s i_s + L_s\frac{d\,i_s}{d_t} + j\omega\frac{3}{2}\Phi_f e^{je}$$

The electromagnetic airgap torque is $$T_{ag}(t) = \frac{3}{2}L_0 I_m[i_s(i_r e^{je})*] = \Phi_o I_m[i_s e^{-je}]$$

$$T_{ag} = \Phi_o i_{sq}$$

The stator current vector is $i_s e^{-je}$. The rotor position is the reference angle. In steady-state, the stator current and voltage are:

$$i_s(t) = \frac{3\sqrt{2}}{2}I_s e^{j\omega t}$$

$$V_s(t) = \frac{3\sqrt{2}}{2}V_s e^{j\omega t}$$

Figure 9A:
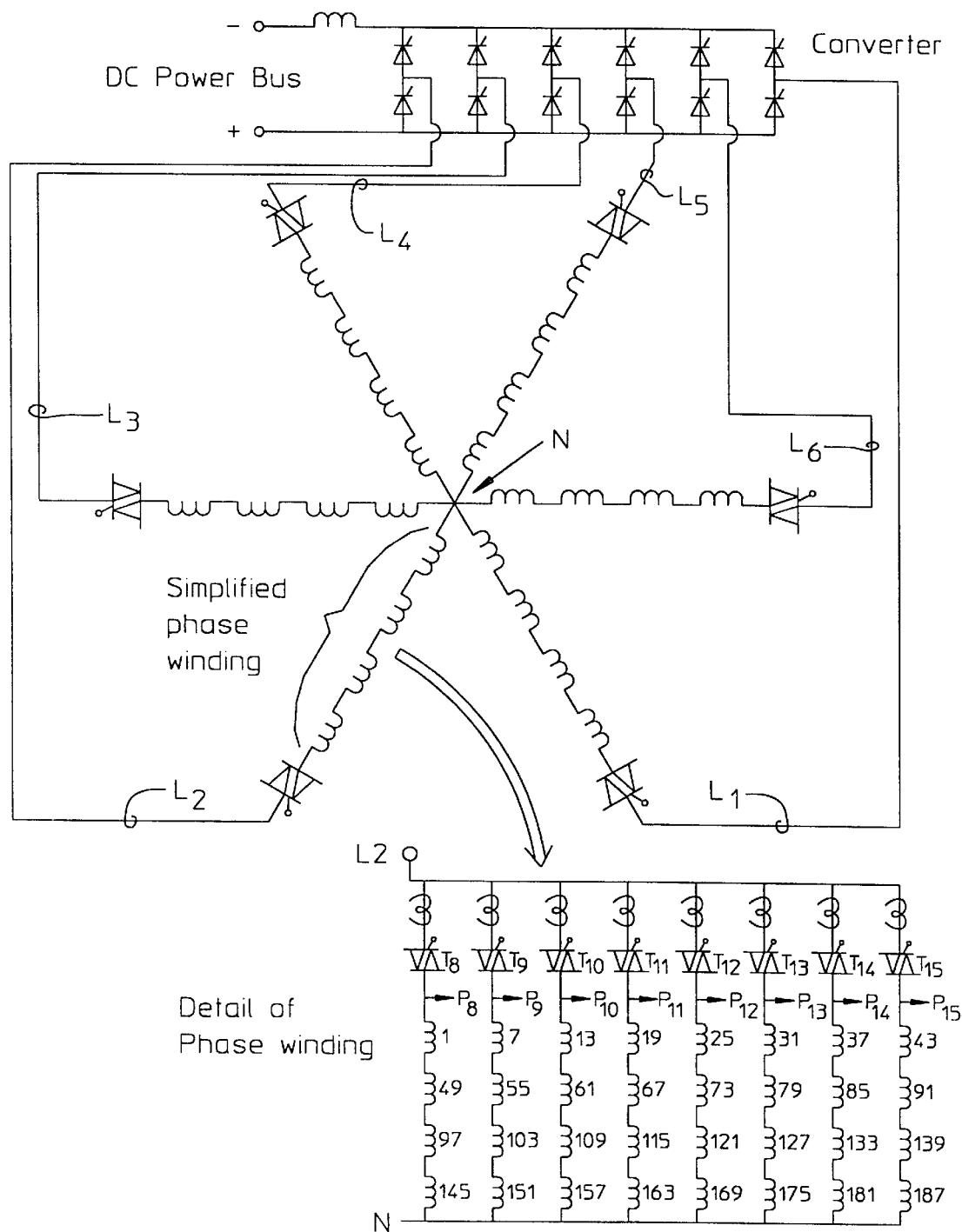
FIGS. 9A, 9B and 9C show a general hardware layout for the combined inverter machine scheme with DC bus input and a 6-phase output to the machine winding with 8 parallels per phase each being electronically isolated using bilateral thyristor pairs.
Figure 9B:
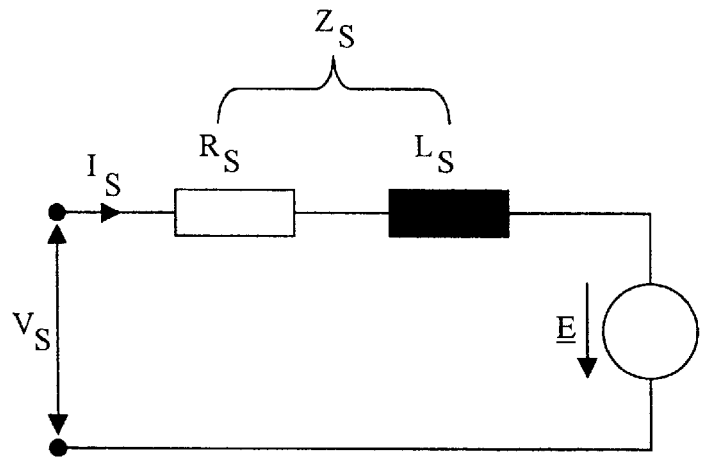
Figure 9C:
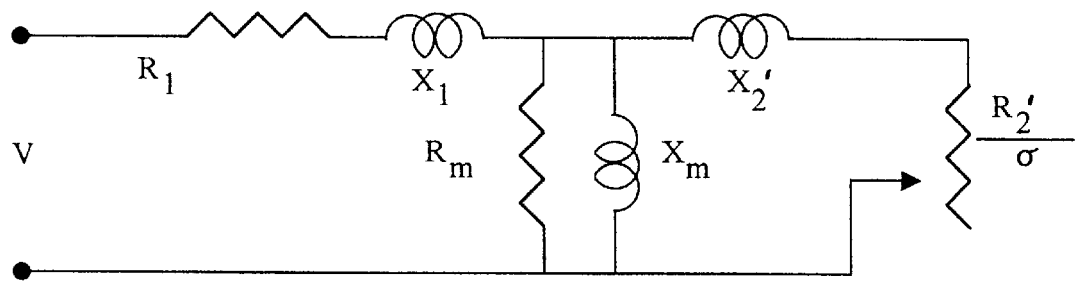

The stator voltage is $$V_s = (R_s + j\omega L_s)I_s + jE_f$$

when the field excitation is represented as a referred quantity:

$$E_f = \frac{1}{\sqrt{2}}\omega\Phi_f$$

and is an AC rms quantity. Note that there is no longer any term for magnetizing reactance. The equivalent circuit simplifies to that shown in FIG. 9B; contrast this to the transient mode (asynchronous) equivalent circuit shown in FIG. 9C. The stator current may be described in phaser notation as:

$$i_s(t)e^{-j\omega t} = 3\frac{\sqrt{2}}{2}I_s + j3\frac{\sqrt{2}}{2}I_s e^{j\delta} = 3\frac{\sqrt{2}}{2}(I_{sd} + jI_{sq})$$

to use rotor coordinates with $\delta$ is the current load angle.

FIG. 10 shows the phaser diagram for $\delta = \pi/2$ which is the maximum torque position or static stability limit for a round-rotor machine. Note in the diagram that $V_s$ leads the current by angle $\Theta$ and is larger (in a motor) than the field vector $E_f$, the voltage drop between these two is described by the singular vector $jI_{sq}Z_s$ where $Z_s = R_s + jX_s$ whereby $X_s$ is to be found electronically for detection of faults and $R_s$ is known in advance, from the manufacturer with a temperature update.

Figure 11:
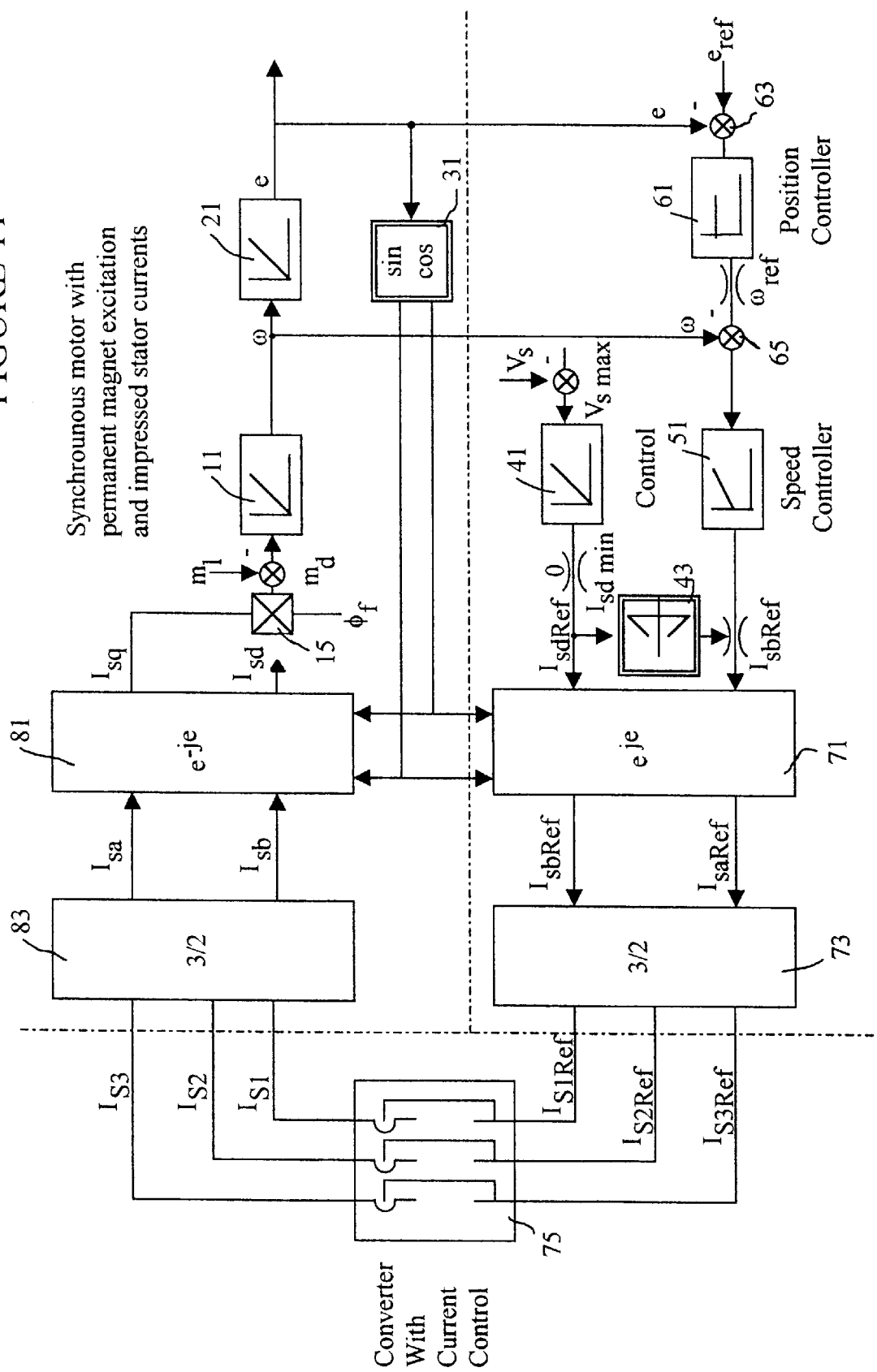
FIG. 11 is an FOV control system for a PM machine showing two sets of 3-phase/2-phase transformations. The top set takes machine data and converts to Cartesian coordinates to produce the control signals $i_{sa}$ and $i_{sb}$. The lower set takes reference control signals used in the speed controller loop back to the inverter/converter control loop.

FIG. 11 is an FOV control system for a PM machine showing two sets of 3-phase/2-phase transformations. The top set takes machine data and converts to Cartesian coordinates to produce the control signals $i_{sa}$ and $i_{sb}$. The lower set takes reference control signals used in the speed controller loop back to the inverter/converter control loop, through a 2-phase to 3-phase transformation to set the current controller at the inverter. This system has the following features specific to a propulsion drive motor, applicable to either an IGBT, thyristor or MCT controller:

a. There is no external tachometer or position sensor on the PM rotor.
b. The rotor position is electronically determined by Integrator 21.
c. The angular speed is determined by integration (block 11) of a torque command signal generated by a current signal and the level of field flux, at multiplier block 15.
d. The rotor position e is transformed by block 31 into sin(e) and cos(e) components for directing the phaser rotators, 71 and 81 for actual current and current-reference signals.
e. The stator voltage $V_s$ is integrated by block 41 to produce a flux equivalent signal which is correlated to produce a $i_{sd}$ reference signal.
f. The reference rotor position is summed with the actual rotor position at junction 63 to produce an error signal for the position controller 61 which outputs to summing junction 65 with the angular speed for input to the speed controller 51.
g. Speed controller 51 outputs a signal which produces $i_{sq}$-ref and limited by the operator's demand for speed.
h. 2-phase and 3-phase transformation is performed by block 73 for command signal back to the inverter 75 current controller which sets the thyristor gating delay angle.

Figure 12:
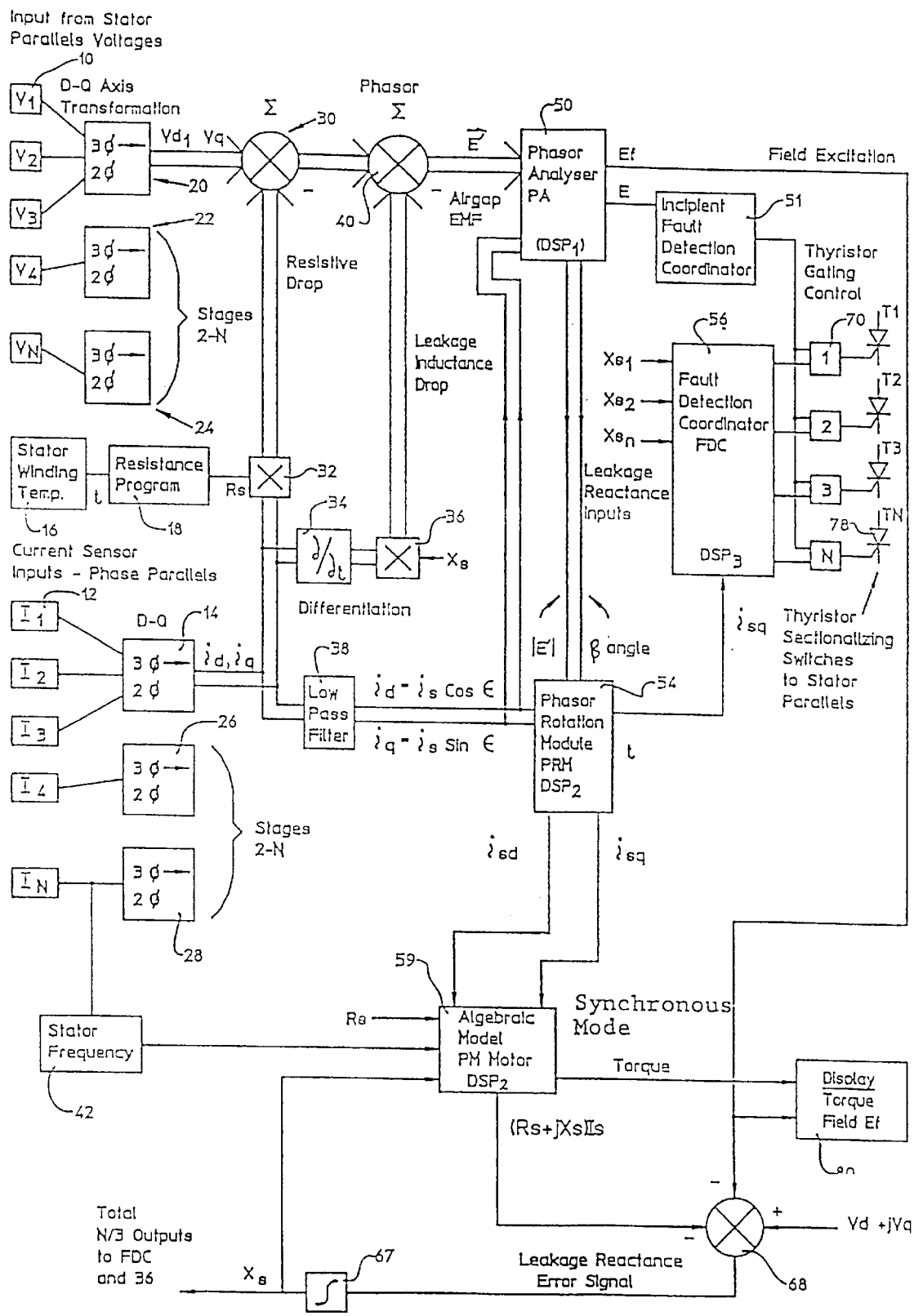
FIG. 12 shows the master block diagram for the synchronous fault detection scheme.

FIG. 12 shows the block diagram for the synchronous fault detection scheme. This is principally identical to the asynchronous detection scheme except for the following:
a. There is no airgap flux sensor required.
b. The Algebraic Model 59 determines an airgap flux $\Phi_m$ based on $i_s \cdot \cos(\epsilon-\phi)$ but no magnetization current is calculated.
c. The control error E'–E" emerging from summation junction 68 is only used for the exclusive input of Integrator 67 to produce $X_s$.
d. The $X_s$ parameters are inputted to the Fault Detection Coordinator and block 36 multiplier for the inductive drop calculation.

Figure 13:
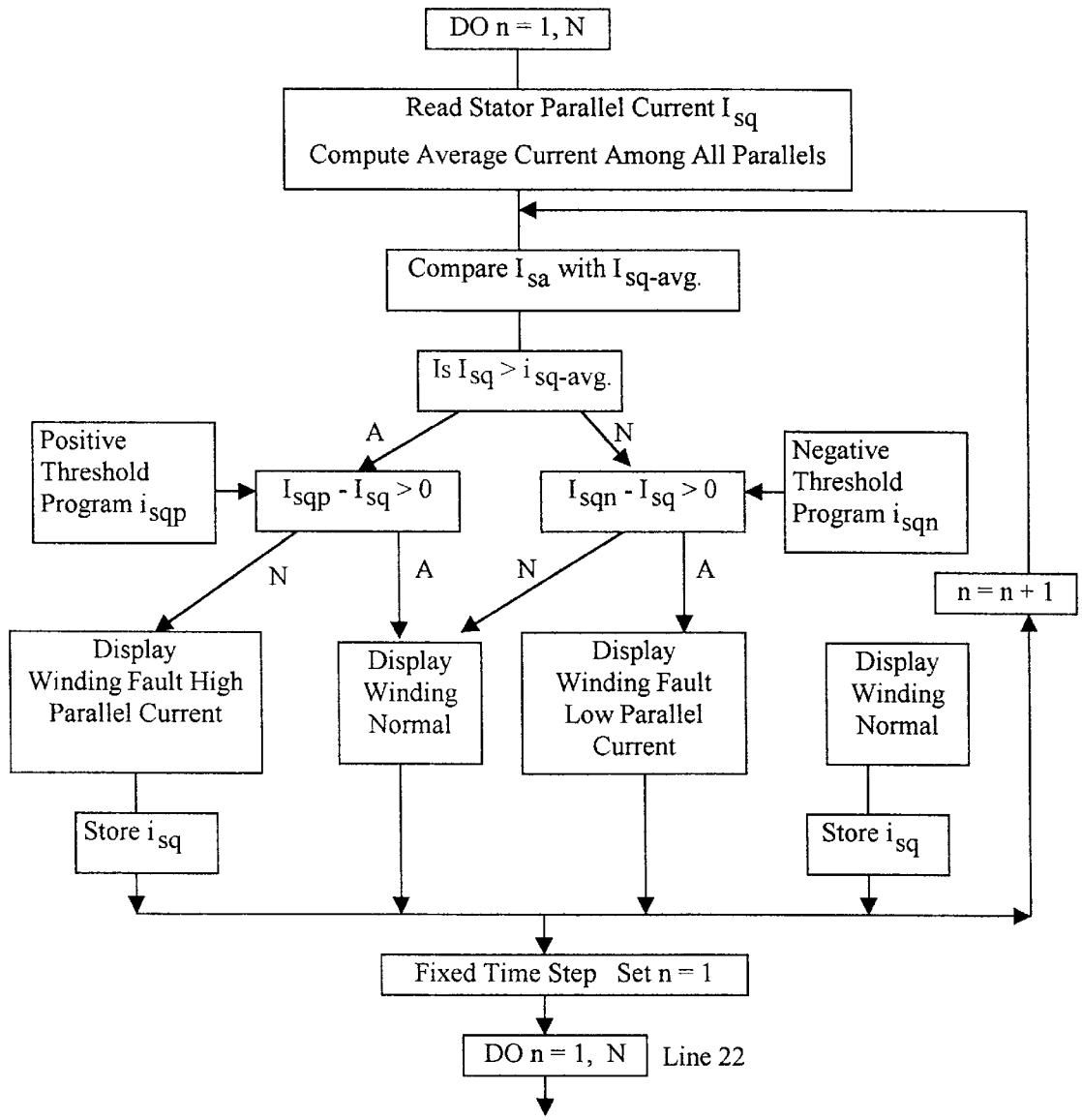
FIG. 13 shows the phasor diagram for the PM machine when in the steady-state mode with $\delta=\pi/2$ and a terminal voltage smaller than the internal EMF producing $I_{sq}<0$.
Figure 14:
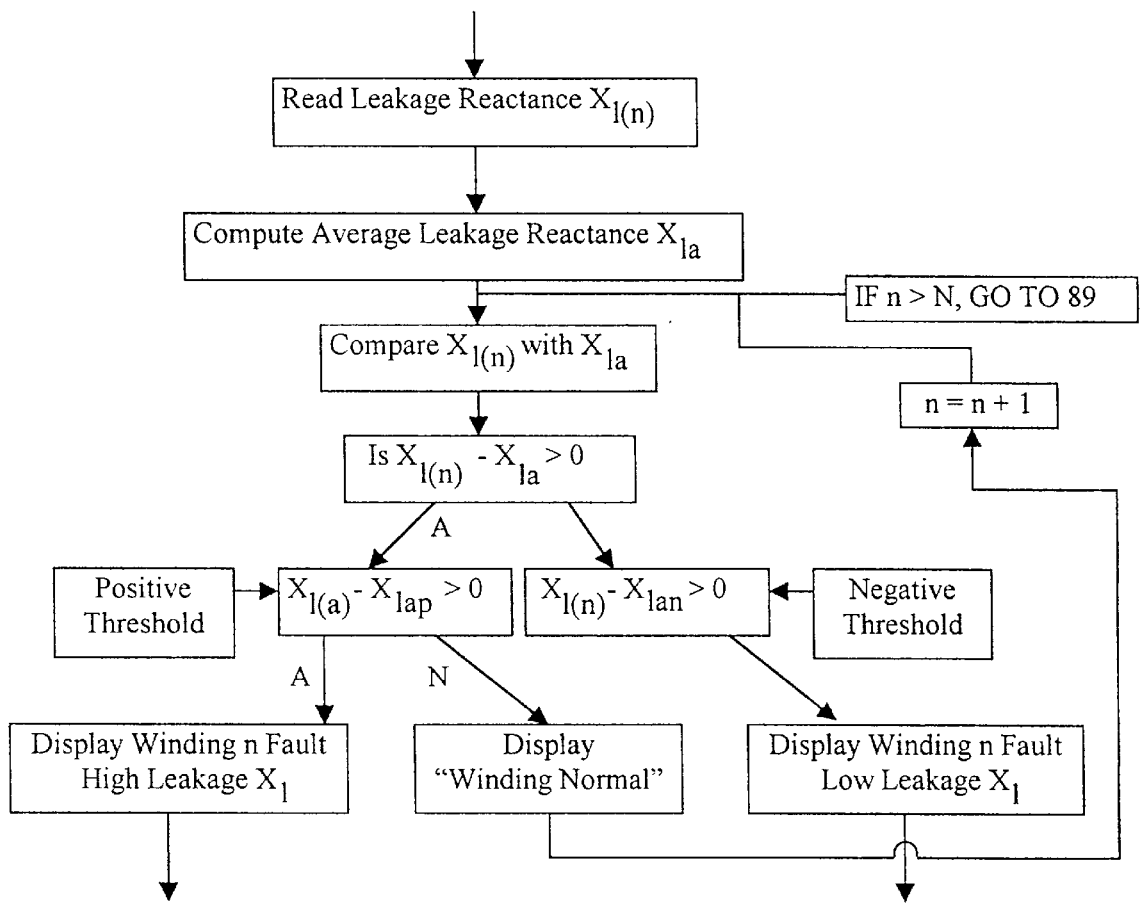
FIG. 14 shows a synchronous machine where rotor MMF is exactly canceled by stator MMF producing zero net torque and $I_{sq}=0$.

FIG. 13 shows the phaser diagram for the PM machine when in a starting mode with $\delta=\pi/2$ and a terminal voltage smaller than the internal EMF producing $I_{sq}<0$. FIG. 14 shows the same machine where rotor MMF is exactly cancelled by stator MMF producing zero net torque and $I_{sq}=0$.

Figure 15:
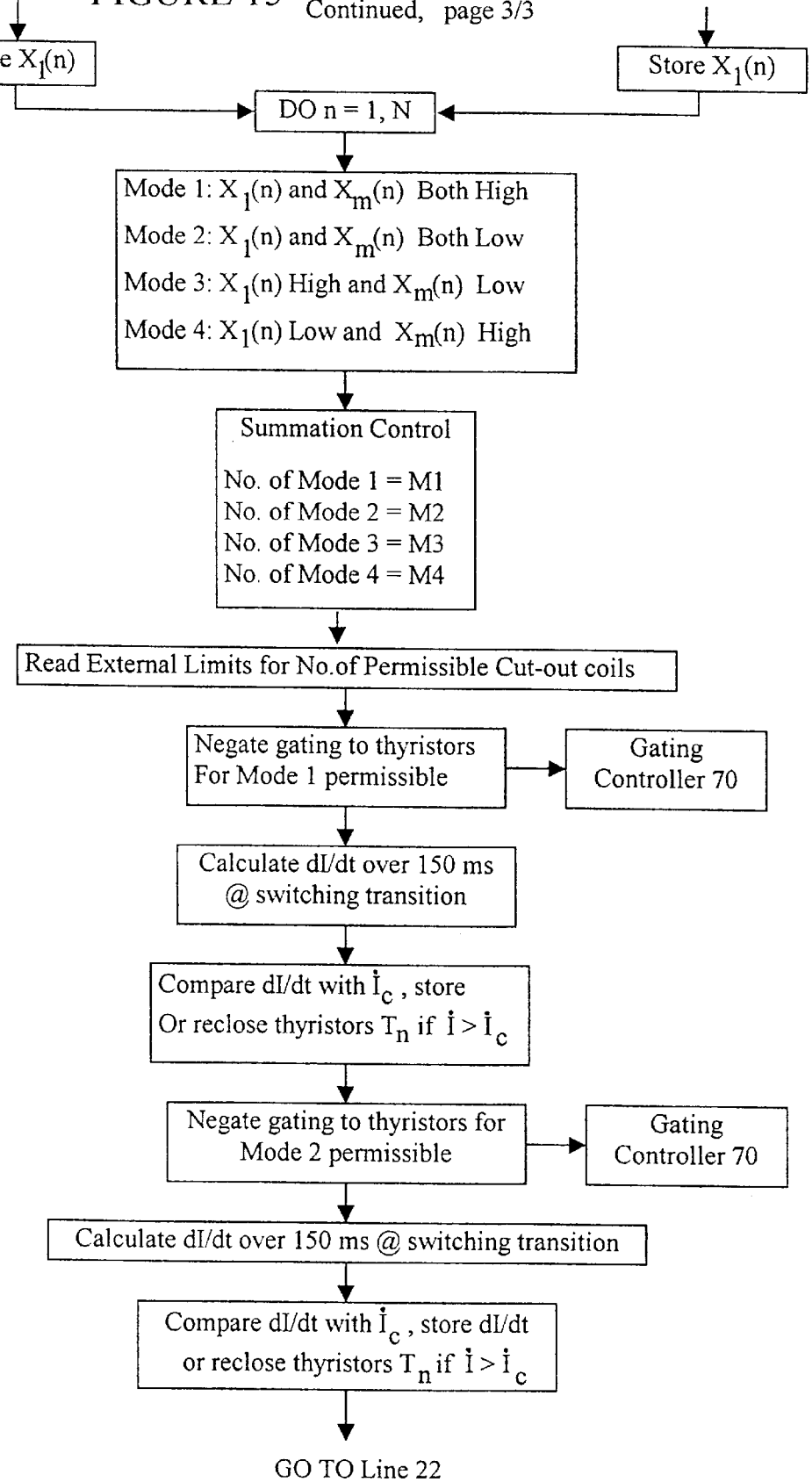
FIG. 15 is the logic-path flow diagram for Synchronous Fault Detection Scheme Fault Detection Coordinator, FDC, Block 56 which utilizes one digital signal processor (DSP) for this function.

FIG. 15 is the logic-path flow diagram for Fault Detection Scheme No. 4 Fault Detection Coordinator, FDC, Block 56 which utilizes one DSP microprocessor for this function. Reference FIG. 12 for the system block diagram.

Figure 16:
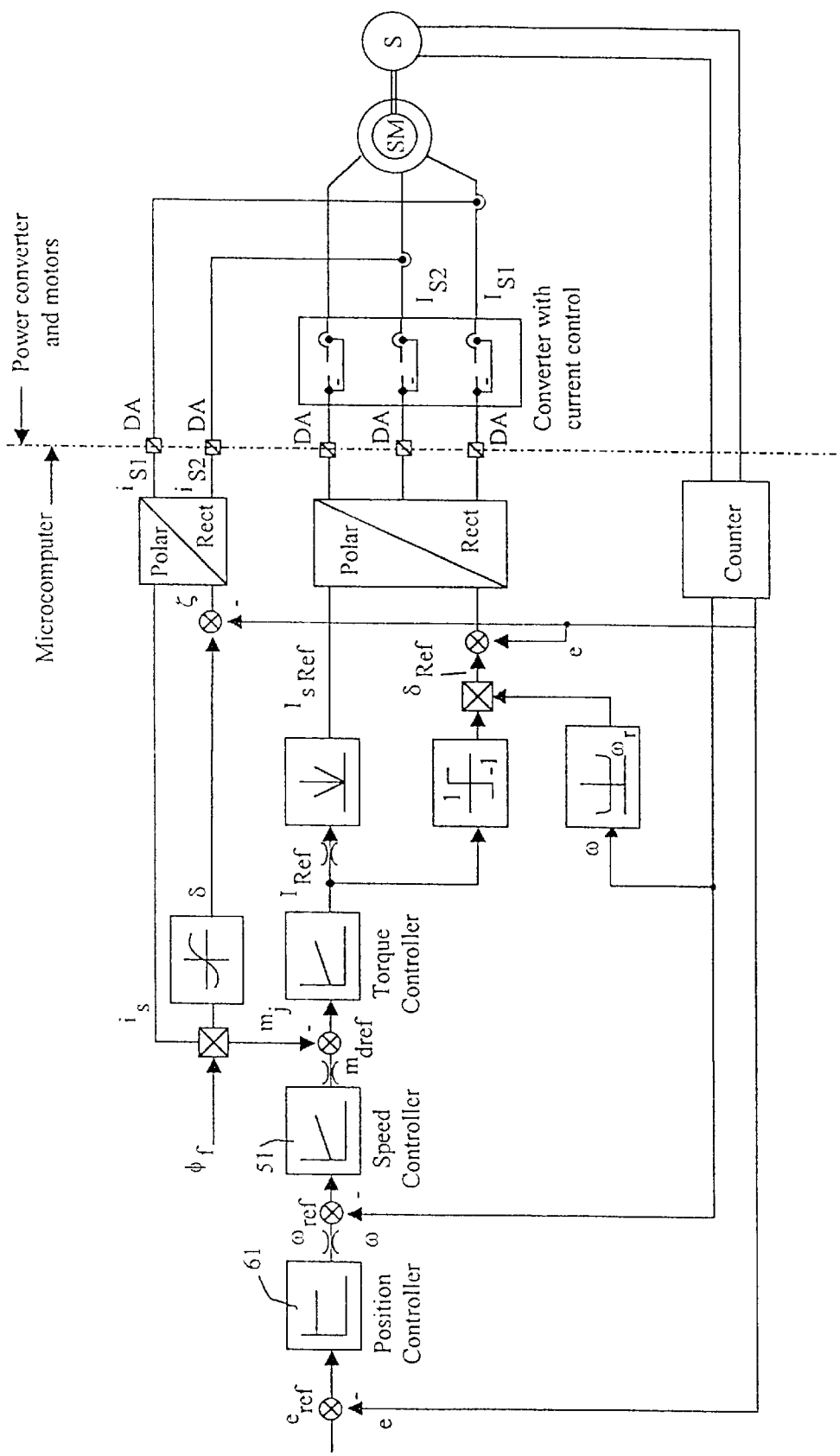
FIG. 16 shows FOV control of a PM machine using a position and shaft speed sensor for fine position control when high-speed response is desired.

FIG. 16 shows FOV control of a PM machine using a position and shaft speed sensor for fine position control when high-speed response is desired. The performance of this system exceeds that of a Type II DC-shunt motor controlled servo drive. The scheme has relevance for Naval propulsion motors when high rates of speed or torque reversal are required; three main control loops are shown.

TABLE 2

List of components for Synchronous Fault Detection Scheme (Ref. FIG. 12)

| | |
|---|---|
| 10 | Voltage Transducers from each stator parallel (AC output signal proportional from 200:1 ratio step-down transformers). |
| 11 | Current Transducers - optical current transformers with phase and magnitude linear over range of 1 to 10,000 Amps. |
| 14 | 3-phase to 2-phase D–Q Axis transformations for stator parallels for currents $I_1$, $I_2$, $I_3$. Repeat for subsequent sets of 120° displaced stator parallel currents as blocks 26, 28, etc. |
| 16 | Stator winding resistance temperature detectors (RTD) placed in a minimum of 12 stator coils spaced evenly around periphery. |
| 18 | Stored resistance values for stator winding, from manufacturer with temperature correction. |
| 20 | 3-phase to 2-phase D–Q axis transformation for stator parallel voltage taps for selective sets of 120° displaced voltage vectors $V_1$, $V_2$, $V_3$. Repeat for stages $V_3$–$V_N$ as blocks 22, 24, etc. Sampling rate to be 150 kHz minimum to retain accurate phase and peak measurements. |
| 30, 40 | Vector summation point for $V_d$–$V_q$ signal. Repeat for N/3-1 other channels. May be digital summation if sampling frequency exceeds 150 kHz for 250 Hz input frequency. |
| 32, 36 | Vector multipliers to produce resistive drop and leakage inductance drop components. |
| 38 | Low-Pass Filter with 200 Hz–400 Hz break frequency. |
| 42 | Stator frequency detector from current transformer. |
| 44 | Synchronous or asynchronous mode detector based on frequency of stator current and one airgap magnetic flux sensor (Hall probe or search coil) to determine if rotor has lost synchronism. |
| 50 | Phaser Analyzer (see FIG. 10A of corresponding patent application) Microprocessor $DSP_1$ such as Texas Instruments TMS320C40 |
| 51 | Incipient Fault Detection Coordinator (see FIG. 15) uses same microprocessor as 50. |
| 54 | Phaser Rotation Module Microprocessor $DSP_2$ such as Texas Instruments TMS320C40 |
| 56 | Fault Detection Coordinator (FDC) which receives signals from derived values of stator leakage reactance obtained as an output from block No. 67 (integrator) and the quadrature axis component of stator current (i-sq) from the output of block No. 54 whereby the block 56 compares derived values of stator leakage reactance, saturated or non-saturated for a given level of stator current (measured against a "look-up table of reactance values obtained when the machine was calibrated and all coils were in perfect electrical condition. Block 56 then determines the exact number and distribution of switches to operate in a fault mode based upon a predicted response pattern of the airgap magnetic flux. Block 56 contains a separate digital signal processor DSP-3. |
| 59 | This is an algebric phasor model for the permanent magnet motor/generator or other synchronous machine which uses classical two-reaction theory of electrical machines for deriving torque (an output of block 59) based upon inputs of the stator direct and quadrature axis currents actually measured (inputs i-sq and i-sd), the stator frequency, the actual stator winding resistance (Rs) and the calculated stator leakage reactance Xs. |
| 67 | This is a numerical integrator which has a scalar input control error signal representing stator leakage reactance and integrates this signal over time e.g. 0.25 second to derive the stator leakage reactance for each individual coil or coil group so instrumented with either coil terminal measurements or airgap flux sensors. |
| 68 | Summation Junction, Scalar. |
| 70 | Thyristor NAND gating controllers for gate drives. |

TABLE 2-continued

List of components for Synchronous Fault Detection Scheme (Ref. FIG. 12)

| | |
|---|---|
| 74 | Thyristor gating control accepting two inputs from blocks 51 and 56 as logical or function to initiate trigger signal to individual switches (thyristors) in each phase group or coil group. |
| 78 | High-Power thyristor device in stator parallel. |
| 80 | Display for stator current components for torque and flux. |

FIG. 17 shows a radial-axial view of the stator search coil ring for use in measuring the radial component of airgap magnetic flux produced by either a synchronous or induction machine. This unit is composed of a non-metallic for example G-10 fiberglass epoxy split sleeve with fine conductive wires typically of aluminum or copper embedded in the sleeve in an axial direction and forming an electrical loop that corresponds in an area to the area over a stator slot+ tooth combination calculated as the slot pitch-axial active length product. The sleeve is intended to be very thin such as 2 mm in radial thickness so as not to substantially interfere with the mechanical clearance to the rotor. The figure shows 24 pairs total of electrical outputs with typically each loop being identical in area covered, wire size and number of turns. In the preferred embodiment, the loop has multiple turns per coil such as 5 turns per search coil. It is not necessary to have one loop for every stator tooth but in the interests of minimizing the investment in data input channels to the IFD system, the number of search coils may be a fraction of the total stator teeth such as one-half or one-third and yield suitable resolution of flux for the d-q axis decomposition circuitry. For example, a system of 24 search coils would be sufficient in most cases for a machine with 72 total stator teeth. The stator search coil ring is manufactured as a modular assembly which permits it to be inserted into a machine without having to extract the rotor and as such the sleeve has a bayonet fitting on the one end to accommodate the fastening to one end of the stator without removing the machine end-bell on the opposite side of the rotor.

The circumferential positioning the search coil ring is important and critical and should be aligned such that the neutral axis or centerline of each search coil's open area is aligned directly over the centerline of a particular designated stator tooth. Further the centerline of the search coil wire axial path should be aligned with the centerline of a stator slot. At the output connector, the termination then becomes coaxial or shielded cable for the path to the micro-controller analog input ports.

Figure 18A:
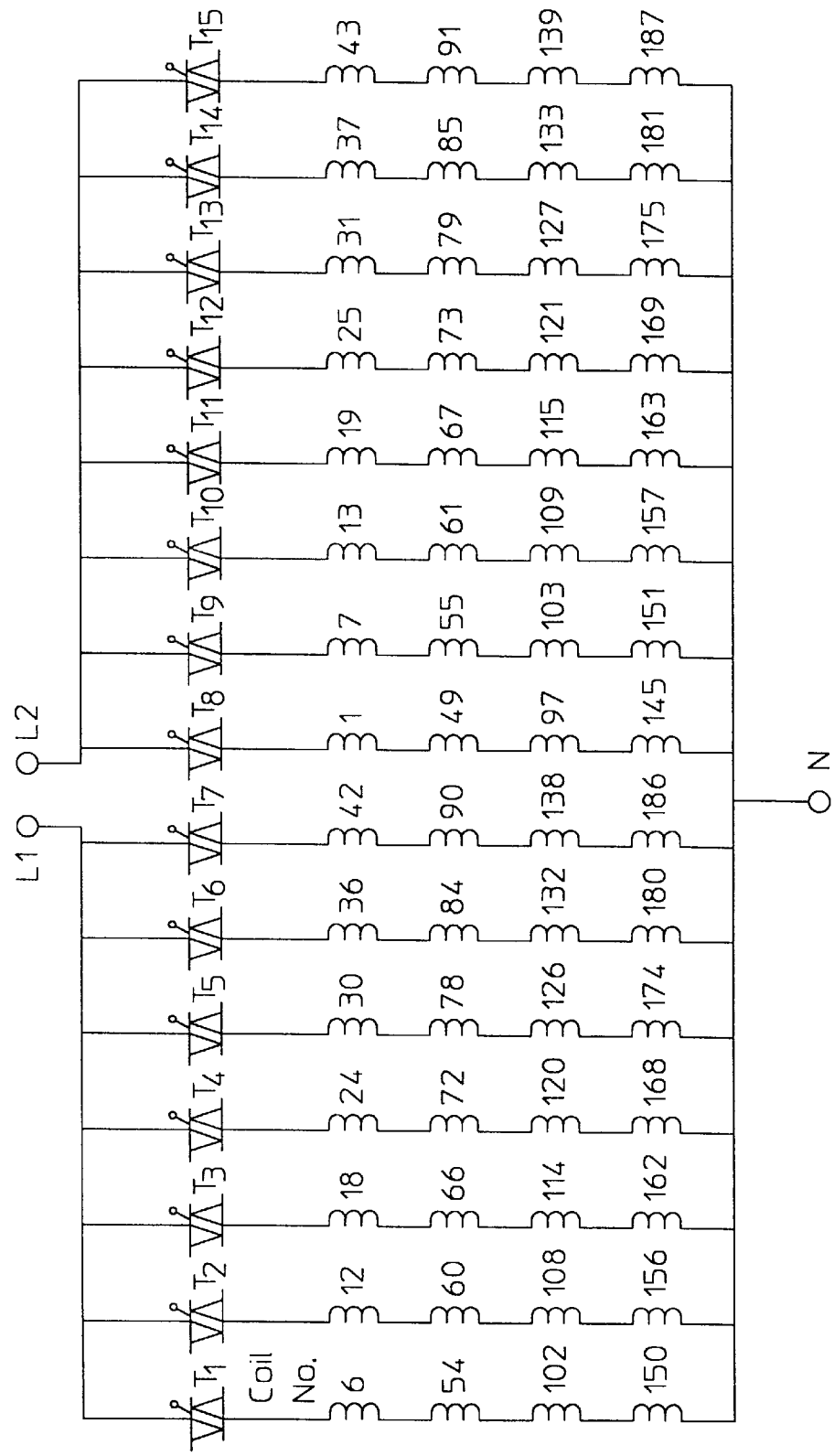
FIG. 18A shows a stator winding layout for 192 slots with 8 parallels per phase.
Figure 18B:
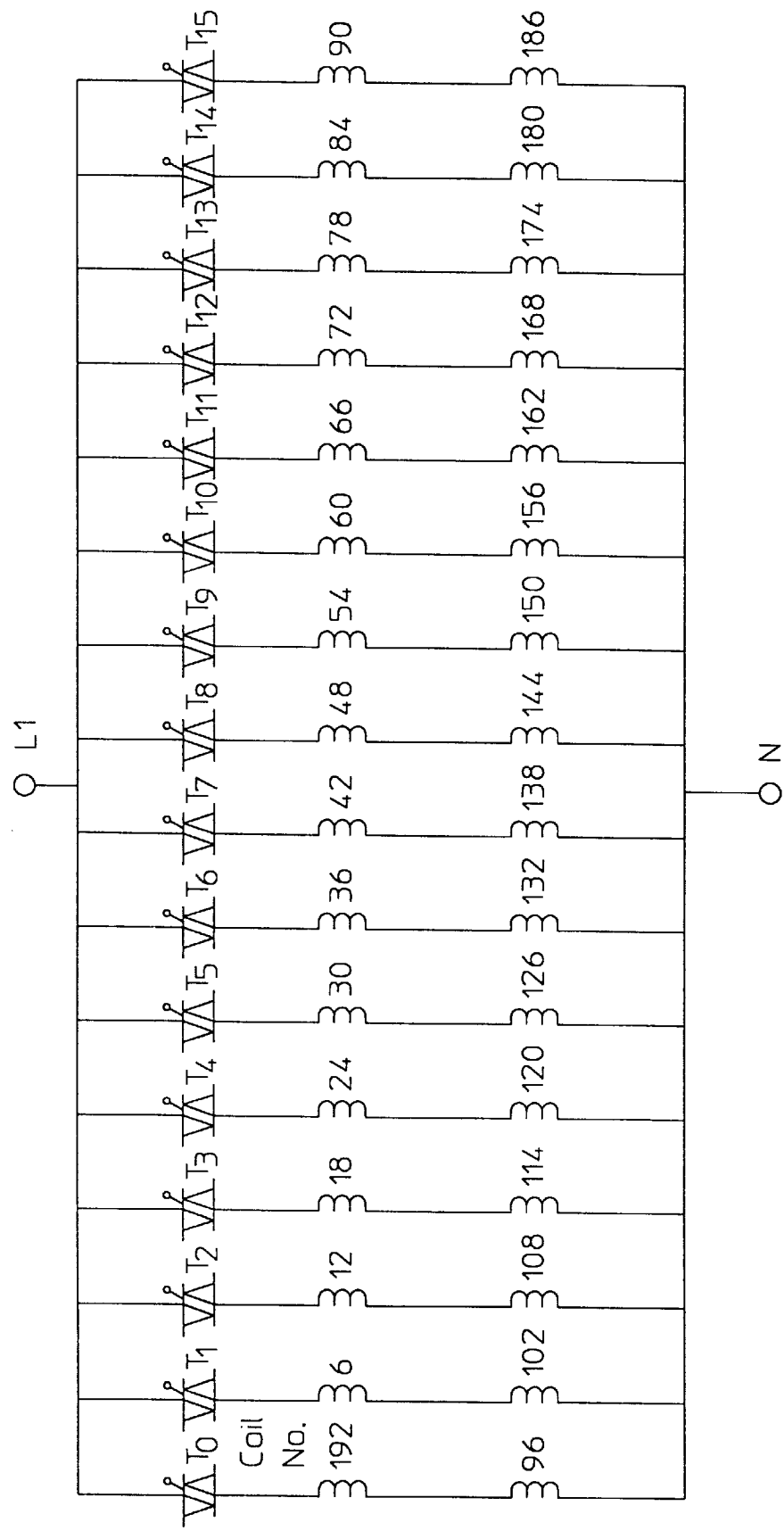
FIG. 18B shows a stator winding layout for 192 slots with 16 parallels per phase.
Figure 18C:
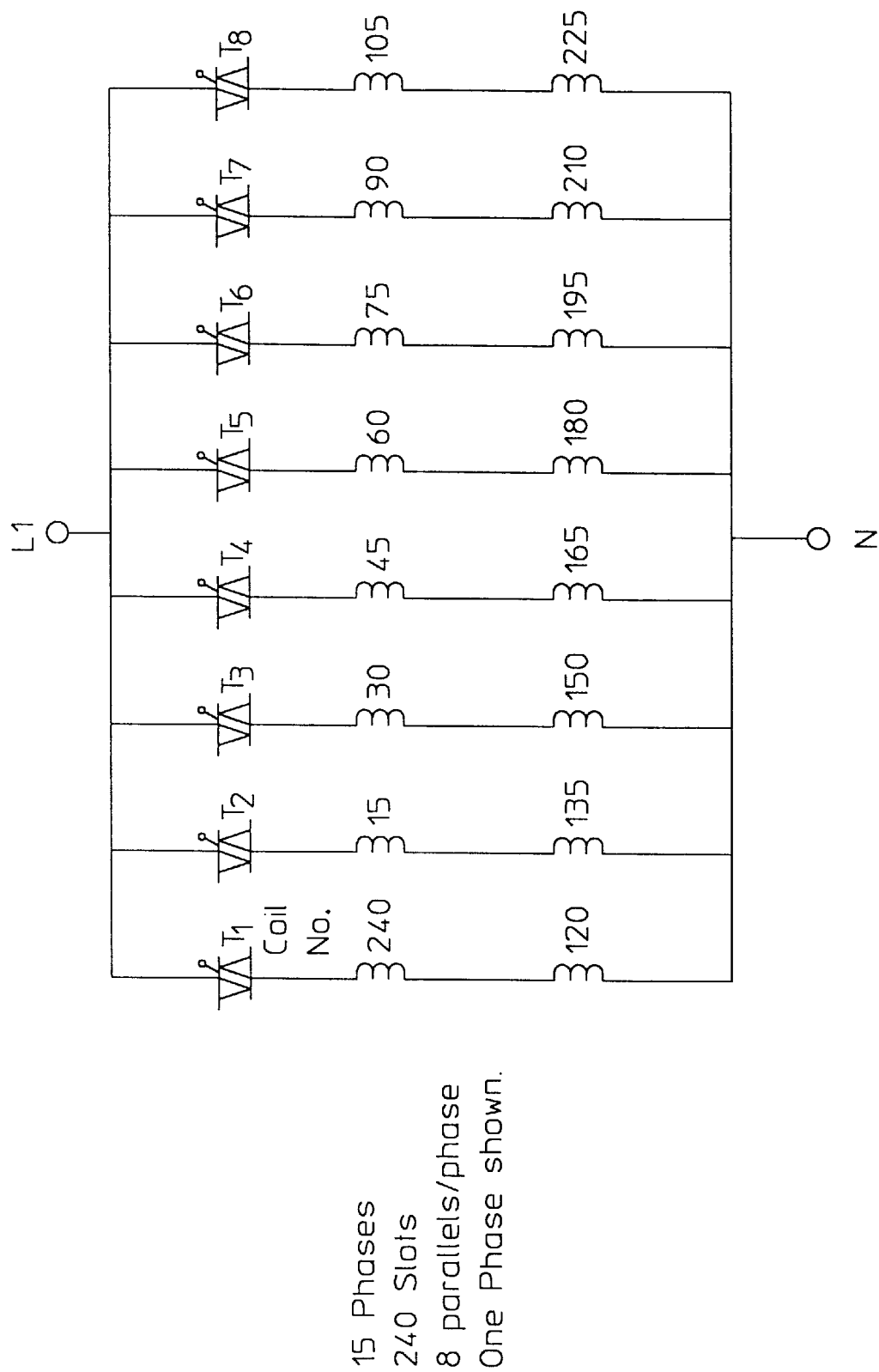
FIG. 18C shows a stator winding layout for 240 slots with 15 phases and 8 parallels per phase.
Figure 18D:
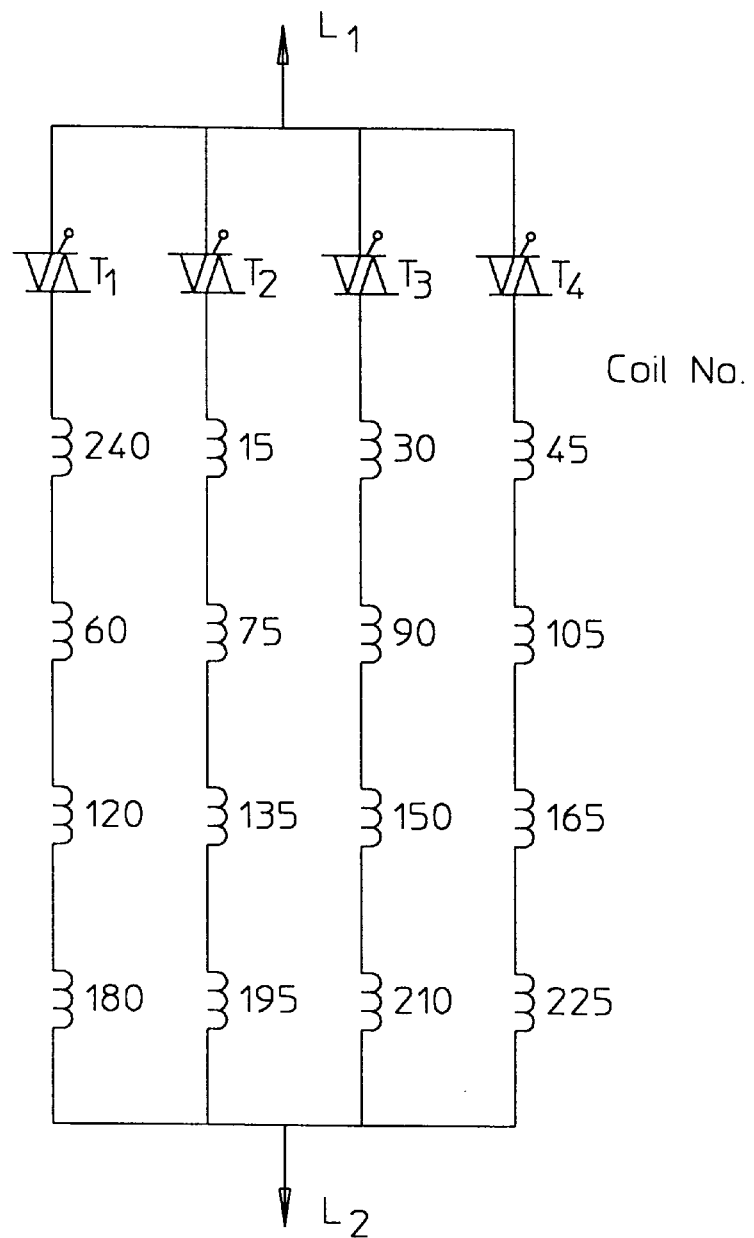
FIG. 18D shows a stator winding design with 4 parallels per phase in 240 slots, 15 phase.

FIG. 18A shows a winding layout for 192 stator slots with 8 parallels per phase as exemplified by Designation MT15; the recommended design has a throw of 5 slots in a pole-pitch of 6 slots. The slots are directly water-cooled and the conductors operate at 17.9 A/sq. mm. at 100% load condition for 85% power factor. FIG. 18B shows a winding layout for 192 stator slots with 16 parallels per phase such as Designations MT11 and MT13. FIG. 18C shows a winding layout with 240 stator slots, 15 phases with 8 parallels per phase in a 16 pole design as exemplified by Designations MT08 and MT10. FIG. 18D shows a design with 4 parallels/phase in 240 slots, 15 phases exhibiting quadrature symmetry for cut-out coils, representing Design MT12.

The field oriented vector control scheme as used for fault diagnostics has four (4) different options for detection of stator winding faults. The faults are classified as follows:
Type I. Intra-coil, turn to turn short circuit
Type II. Inter-coil, turn to turn short circuit
Type III. Coil turn-to-ground dielectric failure
Type IV. Coil-turn open-circuit within coil
Type V. Coil open-circuit at terminals or end-ring connection
Type VI. Line to line coil insulation failures in end-region or terminal box
Type VII. Primary magnetic core faults in lamination stack.
Type VIII. Partial discharge or intermittent dielectric degradation of coil to ground insulation Each fault type is appropriate for specialized detection methods as follows in a thyristor or IGBT inverter-fed drive motor.

1.2. Type I Faults

Type I faults are easily identified by a change in the coil self inductance. For the reference design, we have in normal conditions Inductance of top stator coil with 19 conductors=$L_{sst}$=0.00029H Inductance of bottom stator coil with 19 conductors=$L_{ssb}$=0.00063H For a complete parallel branch with 4 coils in series, the self inductances are $L_{sst}'$=4×$L_{sst}$=0.00116H $L_{ssb}'$=4×$L_{ssb}$=0.00252H Terminal measurements by the digital signal processor (DSP) can distinguish this from mutual inductance by injecting a signal with the adjacent parallel branches open or de-energized. This is practical due to the segmentation afforded by the thyristor switching, which permits selective control of each phase parallel.

The intra-coil faults are the most common, resulting from either general dielectric failure, a puncture or excessive vibration. These are usually the lowest impedance faults in the machine, resulting in high local circulating currents. The code calculated the case of a terminal short-circuit as follows for Ref. MT15:

Voltage induced in one stator coil @ full-flux=599 V rms
Resistance per coil=5.57 milli-ohms
Self-inductance per coil=0.361 milli-Henry
Coil impedance=90.9 milli-ohms
Short-circuit current=6,597 A rms at full-flux
L/R time constant=0.0648 sec Thus, a DSP with a 14-MHZ sampling rate (T=0.071 msec) is fast enough to sample a coil short-circuit in progress with sufficient resolution.

1.3. Type II Faults

These faults specific to inter-coil shorts occur in two places:
 a. Between adjacent or consecutive coils in the same slot
 b. Between adjacent coils in the end-winding region These are usually higher impedance faults than the Type I faults and dependent on the inter-coil connection for viability to handle high currents. The worst case condition is when two adjacent coils short together where the induced EMFs from the rotor excitation are series-aiding, in the reference motor will produce 2×599 or 1198 volts rms driving a fault with a series impedance of approximately 182 milli-ohms on a 40-Hz base, a circulating current of 6,597 Amps rms maximum.

These shorts represent a 33.6 per unit current above nominal and, consequently, the current density rises from 17.9 A/sq mm to 601 A/sq mm. In the PM machine technology, rotor excitation remains essentially constant during the fault period; the concern is the ability to switch off the relevant stator segment prior to thermal or dielectric damage to the stator core or adjacent windings. In the described short circuits, the winding temperature rise in copper conductors will be $$\Delta T(°K) = \frac{J \cdot t}{2} \quad (1)$$

Where J=current density in kA/sq. cm.=60 kA/sq. cm. in reference t=time of fault period=0.20 sec (example)

Therefore, a typical rise prior to thyristor switch-off would be 6° K. rise, which is acceptable. However, clearly without thyristor switching, the fault could persist until such time as the rotor is mechanically stopped, e.g., 45 seconds, allowing a 1350° K. rise which would cause extensive damage.

The other pertinent factor is the sizing of the switching element (thyristor, IGBT or MCT) for each phase parallel based on both I²T and absolute short-circuit ratings. Typical coil faults with upper short-circuit currents of 6,600 Amps rms (on a 40-Hz base) are well within the short-circuit rating of most 53 mm dia. and higher thyristors but not within the rating margin of commercial IGBTs or MCTs as of 1995.

The inventor has reviewed commercial thyristors and concluded that one device manufactured by Silicon Power Corp. (SPCO), is matched to the representative 25,000 HP PM motor in a 32-pole and 2401/4160 volt stator rating. This is the Model C717 phase-control line-commutated thyristor with the following ratings as shown in Table 5:

TABLE 5

CHARACTERISTICS OF SPCO MODEL C717
PHASE-CONTROL THYRISTOR

| Silicon diameter (mm) | 53.0 |
| --- | --- |
| Max. repetitive off-state voltage (V) | 4500 |
| On-state current (A) | 1000 |
| Average current rating (A avg.) | 800 |
| Non-repetitive surge current for 8.3 ms wide pulse (A) | 9000 |
| Critical rate of rise of off-state voltage (V/us) | 1000 |
| Critical rate of rise of on-state current (A/us) | 75 |
| Max. peak recovery current @ 2 A/us | 60 |
| Turn-off time (us) | 400 |

The 6,600-Amp 40-Hz peak winding current is accommodated by the 9,000-Amp surge rating of the device based on a 60-Hz wave ½-cycle period. It is not advisable to use inverter-grade thyristors for the stator segmentation since these devices while having a higher dv/dt and critical di/dt rating for a given substrate size have a significant lower off-state blocking voltage, e.g., 2.1 kV versus 4.5 kV for the phase control device.

Next, it is essential to ascertain whether the switching devices are capable of the transient di/dt and dv/dt levels exhibited in a Type I or Type II winding fault. The dv/dt for the reference design (MT15) is given by $$dv/dt = \omega V = 2\pi(40) \cdot 2401 \cdot \sqrt{2} = 0.85 \, V/us \quad (2)$$

The zero-crossing di/dt is calculated based on a peak of $I_p$=9332 Amps (6,600 A rms) or $$di/dt = \omega_p I = 251 \times 9332 = 2.3 \, A/us \quad (3)$$

which is 3% of the device rating. In a second condition, if an instantaneous short-circuit occurred at 90° after current zero, changing the current per conductor from 196 A rms to 6,586 A rms, the minimum transition time is influenced by the coil L/R time constant, approximately 65 milliseconds and the rate of change of flux in the stator teeth producing the driving voltage. This change of flux is controlled by the short-circuit transient time constant which is calculated as $$T'_d = \frac{X'_d}{X_d} T'_{do} \quad (4)$$

and to a lesser extent, the subtransient short-circuit time constant $T_d''$ which may be calculated by a finite-element analysis of the damper cage surrounding the rotor magnets and the pole iron-losses of the rotor. Our estimation of $T_d''$ for the subject PM machine is in the range of 0.030 to 0.040 sec. In a worst case condition, if the armature changed in one $T_d''$ time constant from steady-state to short-circuit condition at constant speed and constant rotor MMF, the worse case di/dt would be $$di/dt = \frac{9332 \cdot 196}{0.030_s} = 0.30 \, A/\mu s \quad (5)$$

This level is sufficiently below the SPCO Type C717 thyristor ratings so as not to pose any problems for line commutation or di/dt surge rating. The following section details the principal time-constants of the PM machine for both steady-state and transient conditions. A field-oriented vector DSP controller specified herein contains a built-in function controller that can distinguish between AC-transient components, DC-transient components and steady-state in each coil or phase terminal monitored.

1.4. Time Constants for Synchronous Motors 1.4.1. General Representation

Any R-L series circuit subjected to an a.c. voltage responds as $$Ri + L\frac{di}{dt} = E_m \sin(wt + \lambda) \quad (6)$$

The RL circuit to which a sinusoidal voltage is applied at t=0

From a.c. circuit theory, the steady-state values are $$i_s = \frac{E_m}{Z} \sin(wt + \lambda - \theta) \quad (7)$$

$$Z = \sqrt{R^2 + \omega L^2}, \text{ the steady-state impedance} \quad (8)$$

$$\text{where } \theta = \tan^{-1} \omega \frac{L}{R} \quad (9)$$

is angle of lag of the steady-state component of the current with respect to the applied voltage.

λ=Time angle of closure of fault path or thyristor switch

The complete solution for $i_s$ contains both transient and steady-state values:

$$i = \frac{E_m}{Z} \sin(wt + \lambda - \theta) - \frac{E_m}{Z} \sin(\lambda - \theta) \epsilon^{-\frac{Rt}{L}} \quad (10)$$

Note the decaying transient is $$\epsilon^{-\frac{Rr}{L}} \quad (11)$$

where L/R is the time constant, T.

Figure 19A:
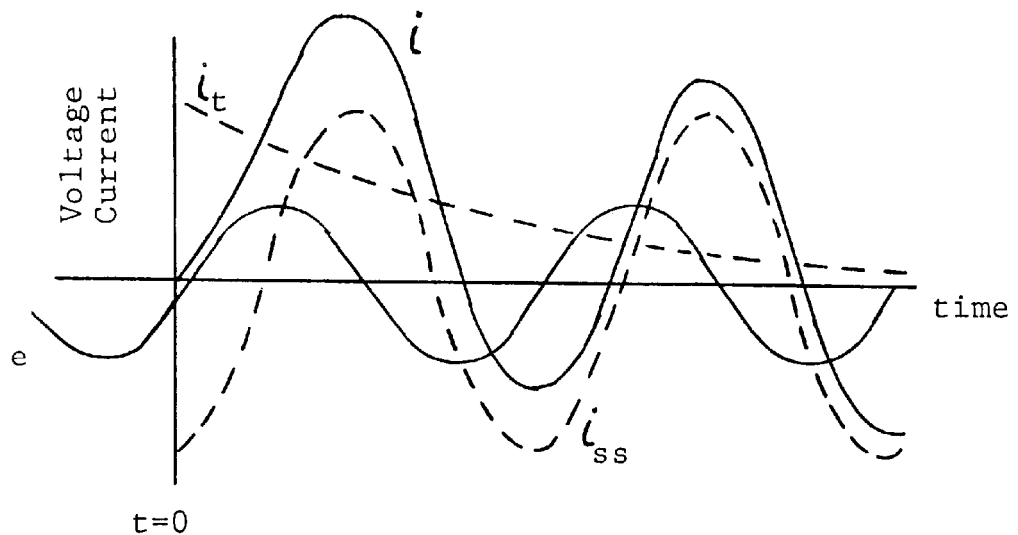
FIG. 19A shows the waveforms in a highly inductive circuit with maximum offset of current.

A most important case happens when voltage e passes through 0 when the switch is closed. This gives maximum offset or maximum total current at ωt=180°. FIG. 19A shows the waveforms in a highly inductive circuit with the current wave at the maximum offset with transient and steady state components shown.

There is a graph of equation (10) for the case of sin (λ-Θ)=-1. Under these conditions the transient component of the current in the RL circuit is of maximum value.

The total value of $i_s$ depends on a. A steady-state $i_{ss}$; R, L, $E_m/Z$
b. Transient $i_t$; $E_m/Z$, $\epsilon^{-t/T}$
c. Instant of closing switch or condition of flux linkages at t=0. The transient from a fault makes the transition between pre-fault condition and new steady-state as $\epsilon^{-t/T}$.

1.4 Coupled R-L Circuits for Winding Fault

There are as many transient components as there are energy storages elements $L_1$, $L_2$. Therefore, there are two decay functions in the primary current.

Figure 19B:
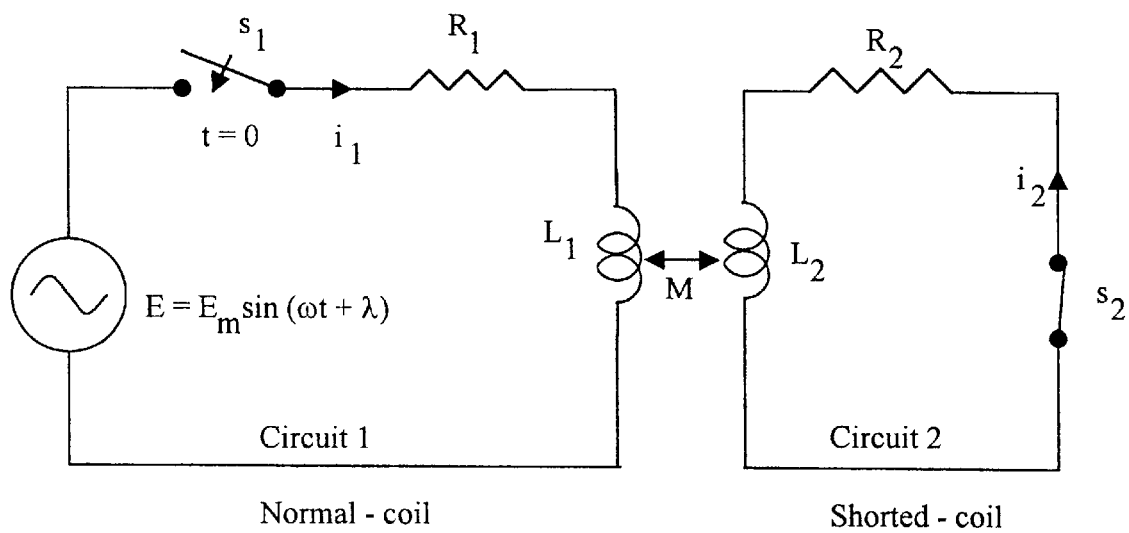
FIG. 19B shows the equivalent circuit for a normal primary coil coupled to a faulted coil.

With the circuit arrangement shown in FIG. 19B, the conditions for dynamic equilibrium are $$R_1 i_1 + L_1 \frac{di_1}{dt} + M \frac{di_2}{dt} = E_m \sin(\omega t + \lambda) \quad (12)$$

and $$R_2 i_2 + L_2 \frac{di_2}{dt} + M \frac{di_1}{dt} = 0 \quad (13)$$

Let $L_1$ represent the self-inductance of a stator top coil ($L_{sst}$), $L_2$ the self-inductance of a stator bottom coil ($L_{ssb}$) that has a Type I intra-coil short-circuit across the terminals normally connected to a thyristor or IGBT voltage-source inverter. For the baseline design MT15

$L_1$=0.00029H
$L_2$=0.00063H
M=0.000348H

The form of $i_t$ is $$i_t = I_{ssm} \sin(\omega t + \lambda - \Theta) + I_{t1} e^{-t/T1} + I_{t2} e^{-T2} \quad (14)$$

Figure 19C:
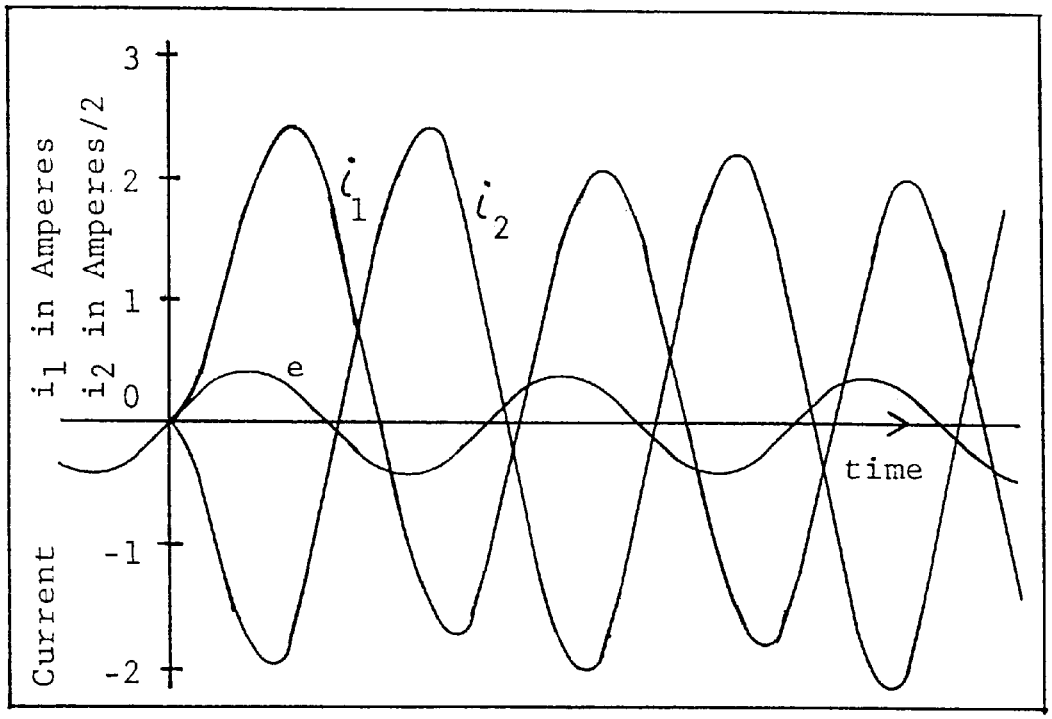
FIG. 19C shows the relative phase positions in the transient period for two currents.

FIG. 19C shows the relative phase positions of currents i-1 and i-2 in the transient period in the circuit corresponding to FIG. 19B.

1.5 Fault Currents in Synchronous Machines for All-Phase Short at Terminals

Whether the reference designs are 6-phase or 15-phase, this analysis assumes that all stator slots are carrying conductors with short-circuit current; the analysis is valid for machines with large number of phase parallels. The total phase current $i_d$ and $i_q$ by transforming back becomes in per unit $$i_a = \left[\frac{V_q}{X_d} + \left(\frac{V_q}{X_d'} - \frac{V_q}{X_d}\right)\epsilon^{-t/T_d'} + \left(\frac{V_q}{X_d''} - \frac{V_q}{X_d'}\right)\epsilon^{-t/T_d''}\right]\cos(\omega t + \lambda) - \quad (15)$$

$$\frac{V_q}{X_m}\epsilon^{-t/T_a}\cos\lambda - \frac{V_q}{X_n}\epsilon^{-t/T_a}\cos(2\omega t + \lambda)$$

-continued $$X_m = \frac{2x_d'' x_q''}{x_d'' + x_q''} \quad (16)$$

$$x_n = \frac{2x_{d''} x_{q''}}{x_{q''} - x_{d''}} \quad (17)$$

where components are classified as:

$$\underbrace{\left[\frac{V_q}{X_d} + \left(\frac{V_q}{X_d'} - \frac{V_q}{X_d}\right)\epsilon^{-t/Td'}}_{\text{Transient}} + \underbrace{\left(\frac{V_q}{X_d''} - \frac{V_q}{X_d'}\right)\epsilon^{-t/Td''}}_{\text{Subtransient}}\right]\cos(\omega t + \lambda) \quad (18)$$

A.C. Component of Stator $$\underbrace{-\frac{V_q}{X_m}\epsilon^{-t/Ta}\cos\lambda}_{\text{D.C. Component}} \quad (19)$$

$$\underbrace{\frac{V_q}{X_n}\epsilon^{-t/Ta}\cos(2\omega t + \lambda)}_{\text{Second Harmonic A.C. Component}} \quad (20)$$

Note the decaying A.C. term in machine expressions when circuits are in motion compared to stationary ones.

1.6 The Time Constants

The field oriented vector controller or general analysis assigns to the PM motor a parameter $T_{do}'$ which is the equivalent of the open circuit time constant in a wound-field synchronous motor, originally calculated as field inductance/field resistance ($L_f/R_f$) neglecting the damping currents in the solid-iron rotor pole pieces. The exact definition is $$T_{do'} = \frac{1}{\omega r_f}(X_f + X_{md}) \quad (21)$$

where $X_f=\omega L_f$=field leakage reactance $X_{md}$=direct-axis magnetizing reactance and the field inductance is calculated by one of two equivalent methods $$L_f = \left(C_f \frac{\pi}{2}\lambda_a + \lambda_f\right)\frac{N_p^2 P.L.}{10^8} \text{ or where} \quad (22)$$

$$L_f = (C_f 3.19 T_{pp}/g_e + \lambda_f)\frac{N_p^2 P.L.}{10^8} \quad (23)$$

Figure 20A:
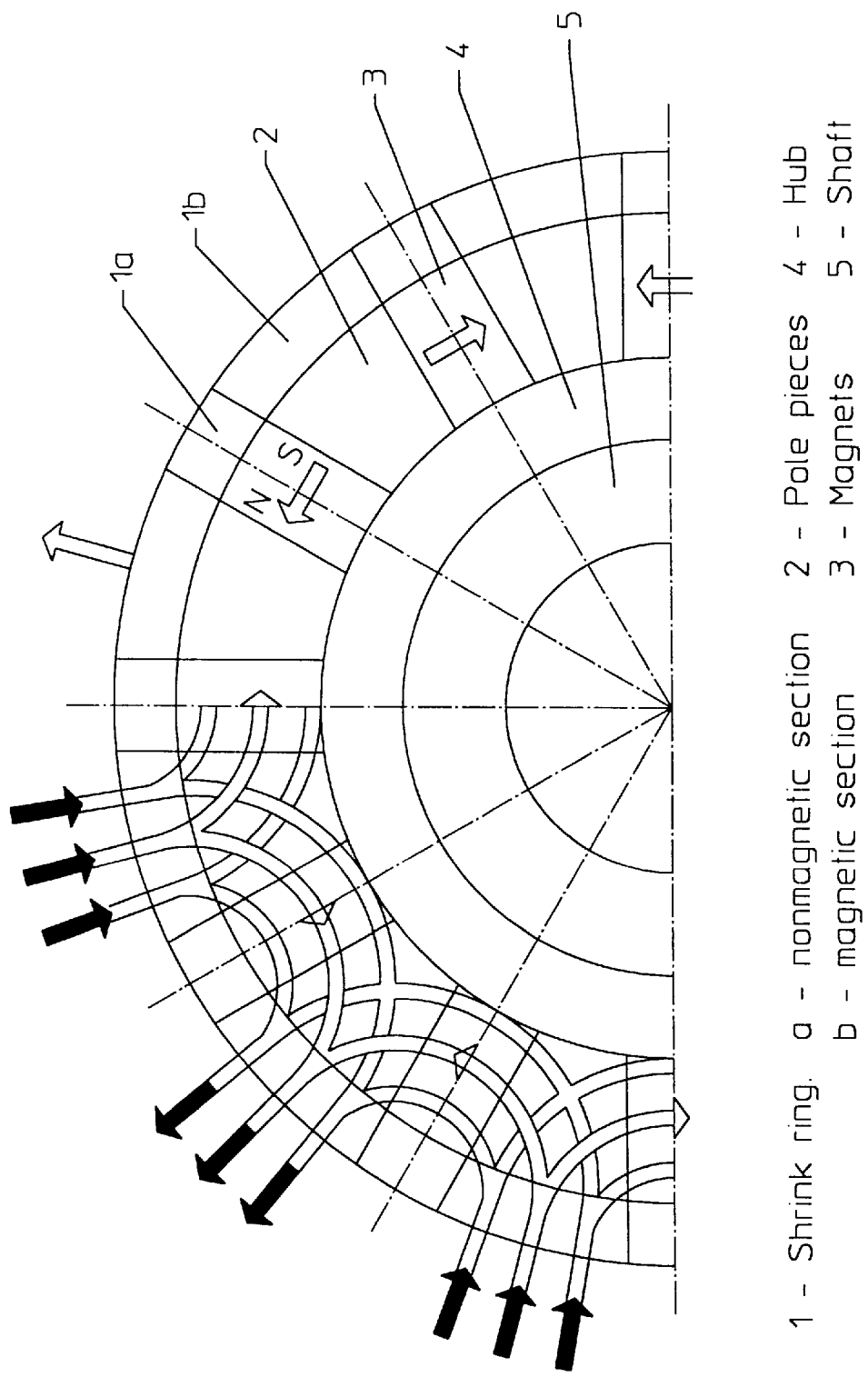
FIG. 20A shows a multi-polar permanent magnet rotor with non-magnetic hub.
Figure 20B:
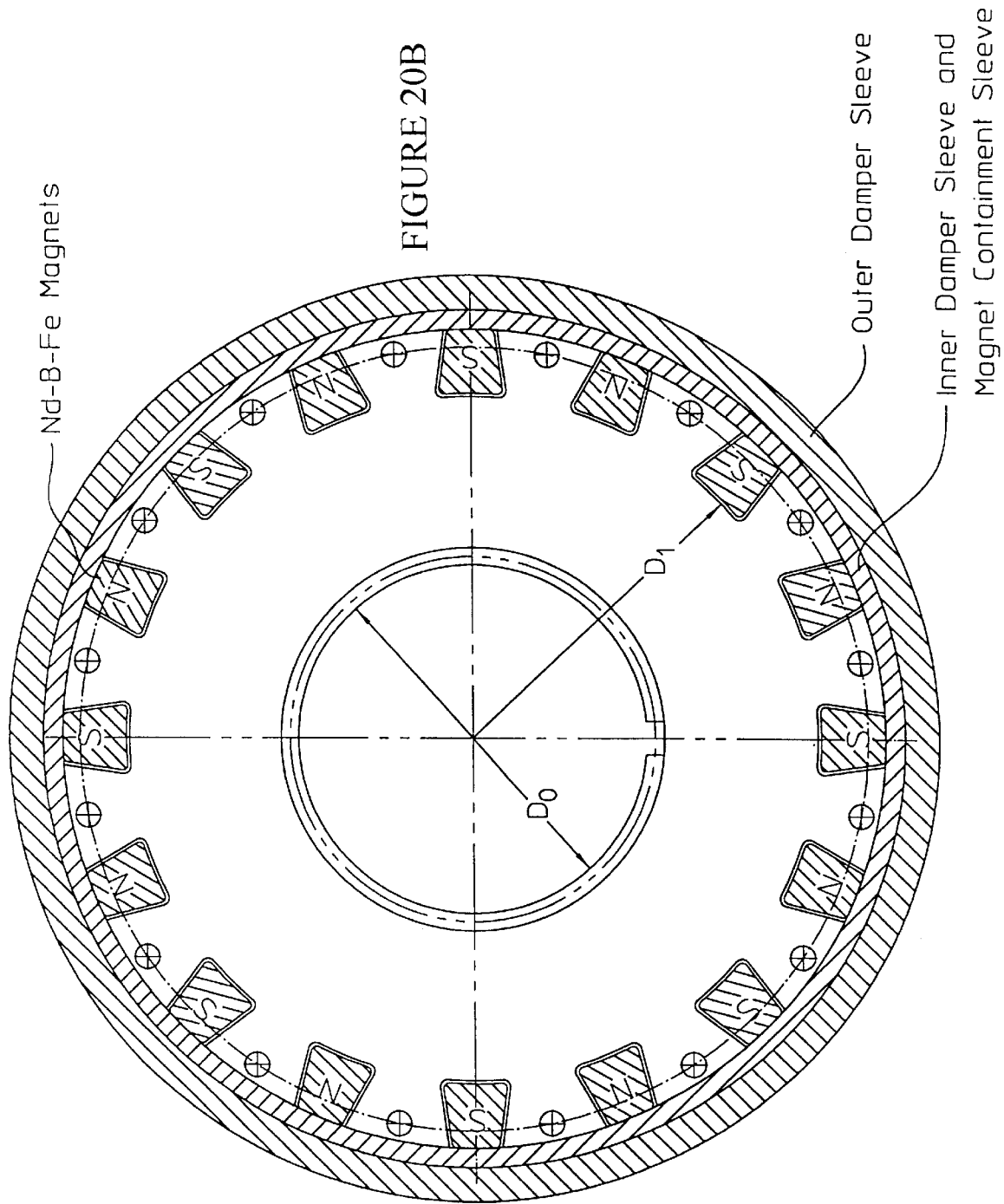
FIG. 20B shows a 16 pole PM motor or generator rotor using radial flux magnets.

$\lambda_a$=magnetizing permeance=2.03 t/ge $K_s$ $\lambda_f$=field leakage permeance=$\lambda_{fs}$+$\lambda_{fe}$ $\lambda_{fe}$=field end-winding leakage permeance ~0 in PM machines $\lambda_{fs}$=field slot leakage permeance FIG. 20A shows a cross section of a multi-polar PM motor, drum type rotor with use of a non-magnetic hub and flux concentration. FIG. 20B shows a cross section of a 16 pole PM motor/generator using radial flux Nd—B—Fe magnets as appropriate for a multi-megawatt machine.

The parameter $\lambda_{fs}$ has an equivalent in PM machines since the permanent magnets are typically enclosed in slots or surrounded by ferromagnetic pole-pieces on two or three sides of the magnet. The direct axis transient short-circuit time constant is represented as $$T'_d = \frac{1}{\omega r_f}\left(X_f + \frac{X_{md}X_a}{X_{md}+X_a}\right) \quad (24)$$

where $X_a$=armature leakage reactance=$X_1$

For Reference design MT15

$X_a$=0.226×$Z_b$=0.345 ohm $X_{md}$=0.836×$Z_b$=1.279 ohms $X_f$=0.293×$Z_b$=0.448 ohm $r_f$=8.89 ohms $\omega$=251 r/s $Z_b$=base impedance=1.53 ohms Therefore $$T'_d = 4.47 \times 10^{-4} \; (0.448 + 0.272)$$
$$= 0.322 \text{ ms} \quad \text{by Method I}$$

This time constant is directly dependent on the value of $r_f$ and should be the equivalent field resistance be decreased to $r_f$=0.889 ohm, the transient short-circuit time constant would be $T_d'$=3.22 ms. The equivalent field resistance $r_f$ is calculated from the Westinghouse-method general expression for salient-pale, slow-speed synchronous machines:

$$\text{Field Loss} = I_f^2 r_f = 12{,}000\sqrt{\text{KVA input/rpm}} \quad (25)$$

For the subject 22,612 KVA, 150 rpm machines, this field loss is 147.3 KW. At an equivalent field current of 128.7 A at full-load, the resistance is determined to be 8.89 ohms, based upon a machine with $N_p$=22 field turns per pole, or equivalent.

The d-axis short circuit transient time constant $T_d'$ is also determined from the $T_{do}'$ parameter as $$T'_d = \frac{X'_d}{X_d} \cdot T'_{do} \quad (26)$$

$$T'_d = (0.342/0.836) \times T'_{do}$$
$$= 0.409 \; T'_{do}$$
$$= 0.316 \text{ ms} \quad \text{by Method II}$$

for a $T_{do}'$=0.77 ms (based upon $X_f$=0.448 ohm, and $X_{md}$=1.279 ohm) as suggested for Reference Design MT15.

The subtransient time constants $T_{do}''$, $T_d''$, $T_{qo}''$, $T_q''$ are of lesser importance except for thyristor surge-rating coordination and peak current determination. They require a non-linear finite-element rotor and stator magnetic analysis to be accurate; but for internal fault detection purposes, these four constants may be determined by the microprocessor in realtime (as approximate) by the following industry-standard expressions:

$$T''_{do} = \frac{1}{\omega r_{kd}}\left(X_{kd} + \frac{X_{md}X_f}{X_{md}+X_f}\right) \quad (27)$$

$T_{do}''$=direct-axis subtransient open-circuit time constant $$T''_d = \frac{1}{\omega r_{kd}}\left(X_{kd} + \frac{X_{md}X_a x_f}{X_{md}X_a + X_{md}X_f + X_a X_f}\right) \quad (28)$$

$T_d''$=direct-axis subtransient short-circuit time constant $$T''_{qo} = \frac{1}{\omega r_{kq}}(X_{kq} + X_{mq}) \quad (29)$$

$T_{qo}''$=quadrature-axis subtransient open-circuit time constant $$T''_q = \frac{1}{\omega r_{kd}}\left(X_{kq} + \frac{X_{mq}X_a}{X_{mq}+X_a}\right) \quad (30)$$

$T_q''$=quadrature-axis subtransient short-circuit time constant

All of these expressions depend upon the determination of four design parameters for the rotor damper cage (or amortisseur shell) on the PM machine; these are a. Direct axis damper leakage reactance $X_{kd}$
b. Direct axis damper resistance $r_{kd}$
c. Quadrature-axis damper leakage reactance $X_{kq}$
d. Quadrature-axis damper resistance $r_{kq}$ which comprise the following associated-time-constants $$T_{kd} = \frac{X_{kd}}{\omega \cdot r_{kd}} = d\text{-axis damper leakage time-constant} \quad (31)$$

$$T_{kq} = \frac{X_{kq}}{\omega \cdot r_{kq}} = q\text{-axis damper leakage time-constant} \quad (32)$$

The damper cage on the reference 25,000 HP motor is in a preferred embodiment a monolithic beryllium-copper ring of length 1.20 m and inner diameter 2.468 m (97.2 in.) shrunk-fit onto the permanent-magnet rotor periphery with a minimum radial thickness of 12.0 mm (0.50 in.) yielding an overall rotor diameter of 2.49 m inside a stator bore of 2.50 m.

The armature time constant $T_a$ is determined as $$T_a = \frac{X_2}{2\pi f \; r_a} = 0.048 \text{ sec. for Design MT15} \quad (33)$$

The FOV controller has input from the designer for the four values $X_{kd}'$, $X_{kq}'$, $r_{kd}'$, $r_{kq}$ which are stored in memory and used to compute the four principal subtransient time constants based upon the actual operating frequency $\omega$, obtained by measurement.

An assumption of the FOV fault control scheme is that when a stator fault occurs, whether a short-circuit or open-circuit, the transient is reflected by induced currents in the rotor damper cage, without exception. Three scenarios are evident and part of the master control scheme:

i. The stator fault creates a damper cage current that is detectable from the stator but does not produce harmonic or pulsating torques or unbalanced magnetic pull forces of significance.

ii. The stator fault creates a damper cage current that is detectable from the stator and creates unbalanced magnetic pull (UMP) radial forces but does not produce positive or negative sequence pulsating torques of significance.

iii. The stator fault creates a damper cage current that is detectable from the stator and creates UMP radial forces and positive/negative-sequence harmonic torques of consequence and significant magnitude.

The following Section 2 describes the mathematics and control theory of the FOV fault detector as applied to a 25,000 HP PM propulsion motor with the described damper cage.

2.1 Field Oriented Vector Fault Detection

Field oriented vector torque control of electrical machines is established in the prior art. The use of field oriented vector control for diagnostics and mitigation of primary or secondary winding faults is novel and subject of this invention.

Figure 20C:
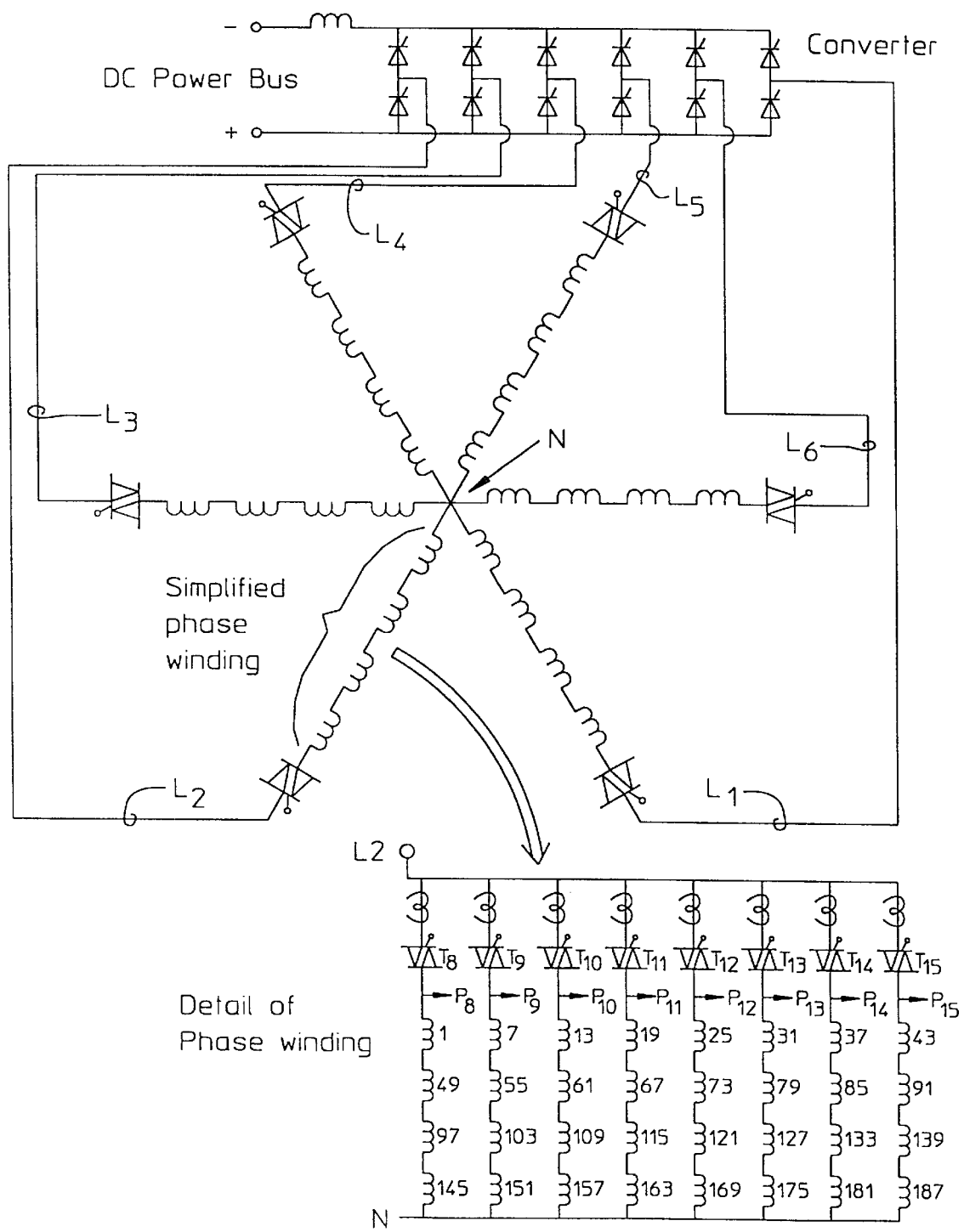
FIG. 20C shows the general hardware layout for the control system.
Figure 21:
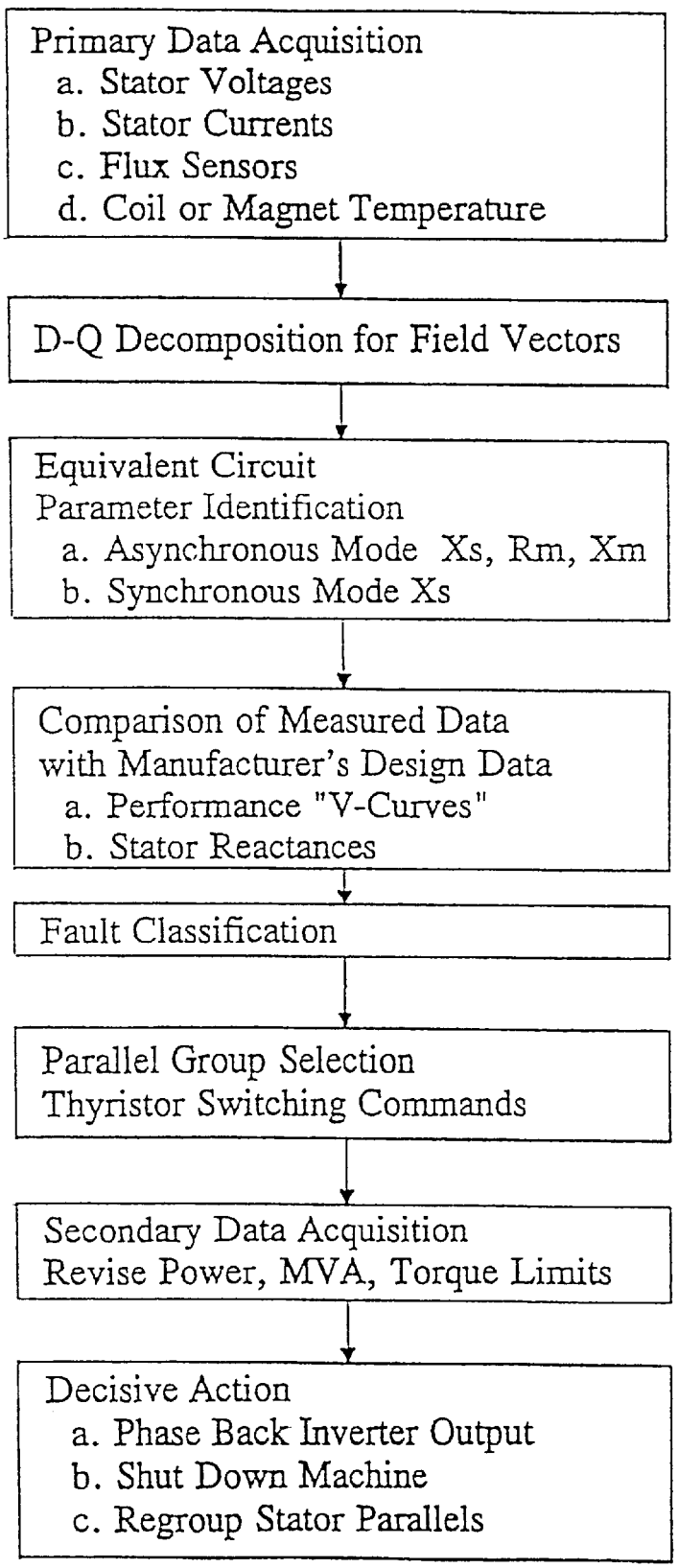
FIG. 21 shows the top-level functional block diagram for the IFD system.

In addition to the relatively small number of feedback signals required for the actual fault diagnostic control loop, the IFD control system will incorporate many sensors for subsystem monitoring and diagnosis. FIG. 20C shows the general hardware layout. FIG. 21 shows the top-level, functional block diagram for the IFD system. Diagnostic signals are listed in Table 6 according to their pertinent functional blocks.

Under normal propulsion conditions, control of the permanent-magnet propulsion motor (PPM) will be performed using a Field-Oriented Vector (FOV) control algorithm. FOV control is based on a six-state, dynamic model of the PPM, and uses a coordinate transformation on the state space to linearize the input/output characteristics of the motor. The derivation of the coordinate transformation accounts for the orientation of the magnetic field relative to the rotor or reaction rail in the case of a linear motor, motivating the name Field Oriented Vector control. FOV control has several inherent advantages over the classical control methods for synchronous motors. In particular:

1) The Field Oriented state space decomposition provides decoupling of the airgap field intensity and the propulsion torque output. This means essentially independent control of the field excitation level and the developed force, much as is the case with classical control of D.C. machines.

2) The linearized relation between the input and output variables of the transformed system enables the use of well established linear control methods for the outer (i.e., shaft speed control) loop. In the described invention, this technique is used to predict and control the airgap magnetic flux to a high degree of precision.

3) Because the control algorithm addresses a dynamic (rather than steady state) model of the machine, the control bandwidth is substantially improved over that of classical (voltage, rotor angle) control methods. In the IFD system, this bandwidth allows rapid response in measuring and predicting electromagnetic torque developed.

This section will give an overview of the fundamentals of FOV control, as well as a description of its application to the IPD for the 25,000 HP, 150 rpm propulsion motor. Specific examples use data appropriate to either 16-pole or 32-pole designs operating at 2401 volts line to neutral in 15-phase and 6-phase systems, respectively.

TABLE 6

IFD DIAGNOSTIC SIGNALS

1. PRIME POWER SYSTEM

Inverter temperatures
   Inverter status signals
   Generator field currents
   Generator terminal voltages
   Generator terminal currents TABLE 6-continued

IFD DIAGNOSTIC SIGNALS

Prime power temperatures
   Prime power vibration

2. POWER CONDITIONING SYSTEM

Inverter input voltages
   Inverter input currents
   Inverter output voltages
   Inverter output currents
   IGBT stage switch status
   Inverter device temperatures
   DC link reactor temperature (if used)

3. PROPULSION MOTOR (GENERAL)

Stator terminal voltages
   Stator terminal currents
   Rotor radiated temperature
   Stator temperatures
   Stator terminal phase angle of current w.r.s.t. voltage
   Stator terminal electrical frequency

4. STATOR WINDING SEGMENTATION SWITCHES (THYRISTOR)

a. Phase parallel #1, Phase A*-status of switch
   b. Phase parallel #2, Phase A*-status of switch
   c. Phase parallel #3, Phase A*-status of switch
   d. Phase parallel #4, Phase A*-status of switch
   e. Phase parallel #5, Phase A*-status of switch
   f. Phase parallel #6, Phase A*-status of switch
   g. Phase parallel #7, Phase A*-status of switch
   h. Phase parallel #8, Phase A*-status of switch

5. MOTOR SHAFT SPEED DETECTOR

Motor shaft encoder signal for electrical pole angle

6. FIBER OPTIC FLUX PROBES IN STATOR SLOTS a. 192–240 magnetic flux sensors for magnitude and phase-angle at stator cross slot flux, tangential component
   b. 16–32 sensors for magnitude and phase-angle of airgap flux, radial component on pole-by-pole basis

7. HALL-PROBLE MAGNETIC FIELD SENSORS a. Augment 6a./6b. fiber optic sensors
   b. Redundant to 6a./6b. fiber optic sensors

8. HIGH FREQUENCY BUS TRANSFER

Switch status
   Phase-angle status

9. AUXILIARY PUMPS, COMPRESSORS, COOLING SYSTEMS

Water/Dielectric coolant levels
   Coolant pump pressures
   Lubrication oil levels

*Repeat sequence for each phase in 6- or 15-phase system.

2.3.1.1 Operating Principle

A key element of FOV control is the incorporation within the controller of a state estimator for the magnitude and position of the stator flux MMF wave due to fault currents linking the PM rotor. Having an accurate estimate of the flux wave magnitude and position allows the controller to use the stator phase currents so as to predict the short circuit forces on the rotor damper cage (with a bandwidth limited only by the ability to manipulate the stator phase currents), as well as to diminish the magnitude of the fault-flux wave itself. In essence, consideration of the physics of the machine and the use of a sophisticated control algorithm permits operation of the PM motor with an internal fault detector. The next subsection discusses a potential type of control loop structure: the kinematic controller.

2.3.1.2 Control Loop Structure

2.3.1.2.1 Introduction

Field Oriented Vector control is a system of control variable coordinate transformations which permits rapid (tens of milliseconds) control or detection of the shear-force developed on the rotor damper shield or cage by short circuits or transient stator phenomena. In order to meet the general control objectives, i.e., a 1.5 rpm maximum speed error at 150 rpm (maximum speed) and less than a five percent difference between peak and mean motor torque, it is necessary to embed the FOV force controller in a larger control system. For this discussion, we assume the rotor magnetization or MMF is held constant at a setpoint value, and consider the control of shaft torque, shaft speed, and rotor angle position.

2.3.1.2.2 Kinematic Control System Topology

Figure 22:
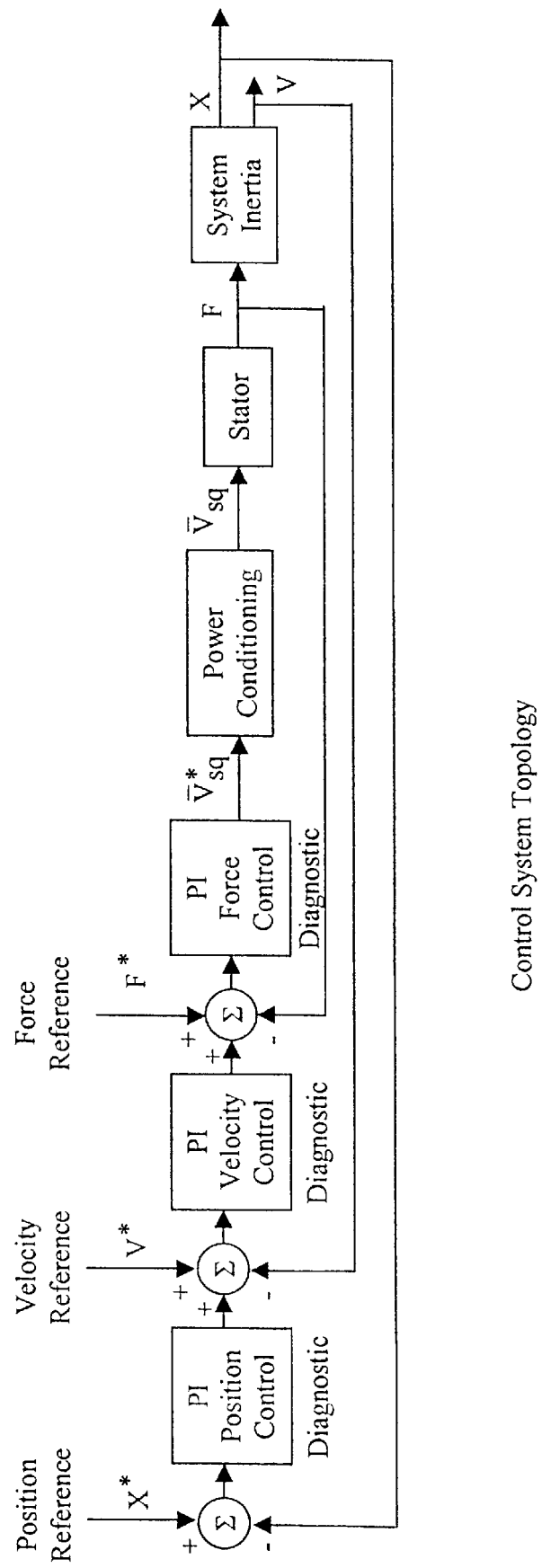
FIG. 22. Control system topology with 3 nested control loops.

A diagram of the proposed control system topology is shown in FIG. 22. The control system is composed of three nested control loops as follows:

a. The innermost loop is a FOV-torque control (label F).
b. The intermediate loop is a proportional/integral (PI)-type velocity control (label V).
c. The outermost loop is a PI-type rotor angle control (label X).

This control topology offers the following advantages: a transparent controller state decomposition, systematic design procedures, and low sensitivity to system parameters such as PM equivalent circuit parameter variations and data. The controller design takes place in the continuous time domain; a digital emulation of the resulting controller will be employed in the IFD. Numerous texts are available which discuss the emulation of continuous-time functions using discrete-time systems.

For the preferred embodiment, the propeller is modeled as a lumped mass on a frictionless platform. The dynamics of the power supply busbars and switchgear reactances, as well as the discrete-state operation of the inverter switching devices are not considered. The time constants associated with these elements are substantially shorter than that of the PPM stator effective reactance; therefore, the dynamics of the PPM torque response are dominated by the effect of the motor stator and not the busbars, generator reactance, or switching time. For the purpose of sensitivity analysis, these effects may be modeled as perturbations (additive or multiplicative disturbances) occurring in place of the corresponding blocks in the diagram of FIG. 22.

2.3.1.2.3 Model for Control

Figure 23:
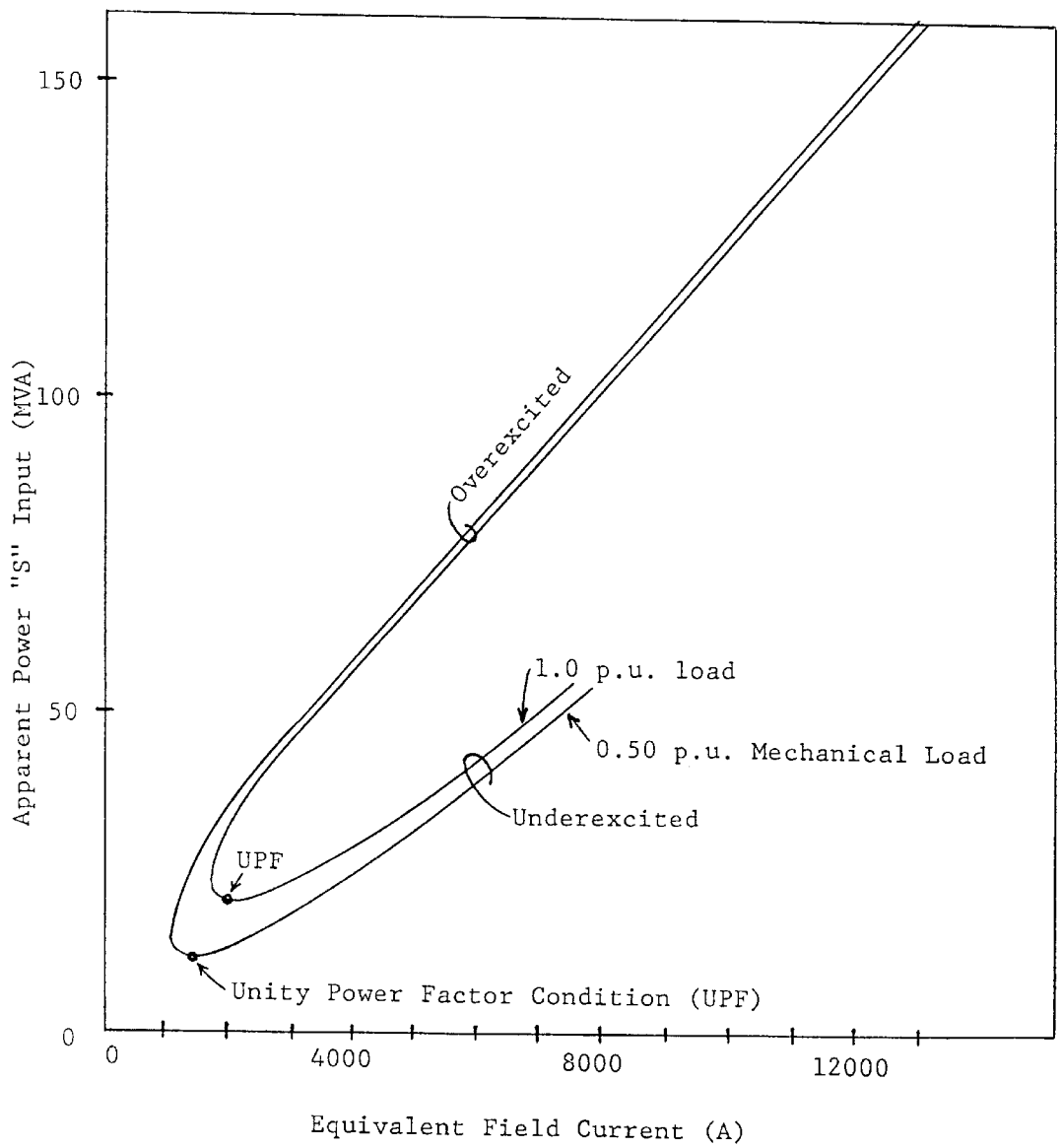
FIG. 23. "V-curves" for apparent power versus field magnetization for 16-pole, 150 rpm, 15 phase 25,000 HP motor with Potier Reactance (Xp) of 20.7%.
Figure 24:
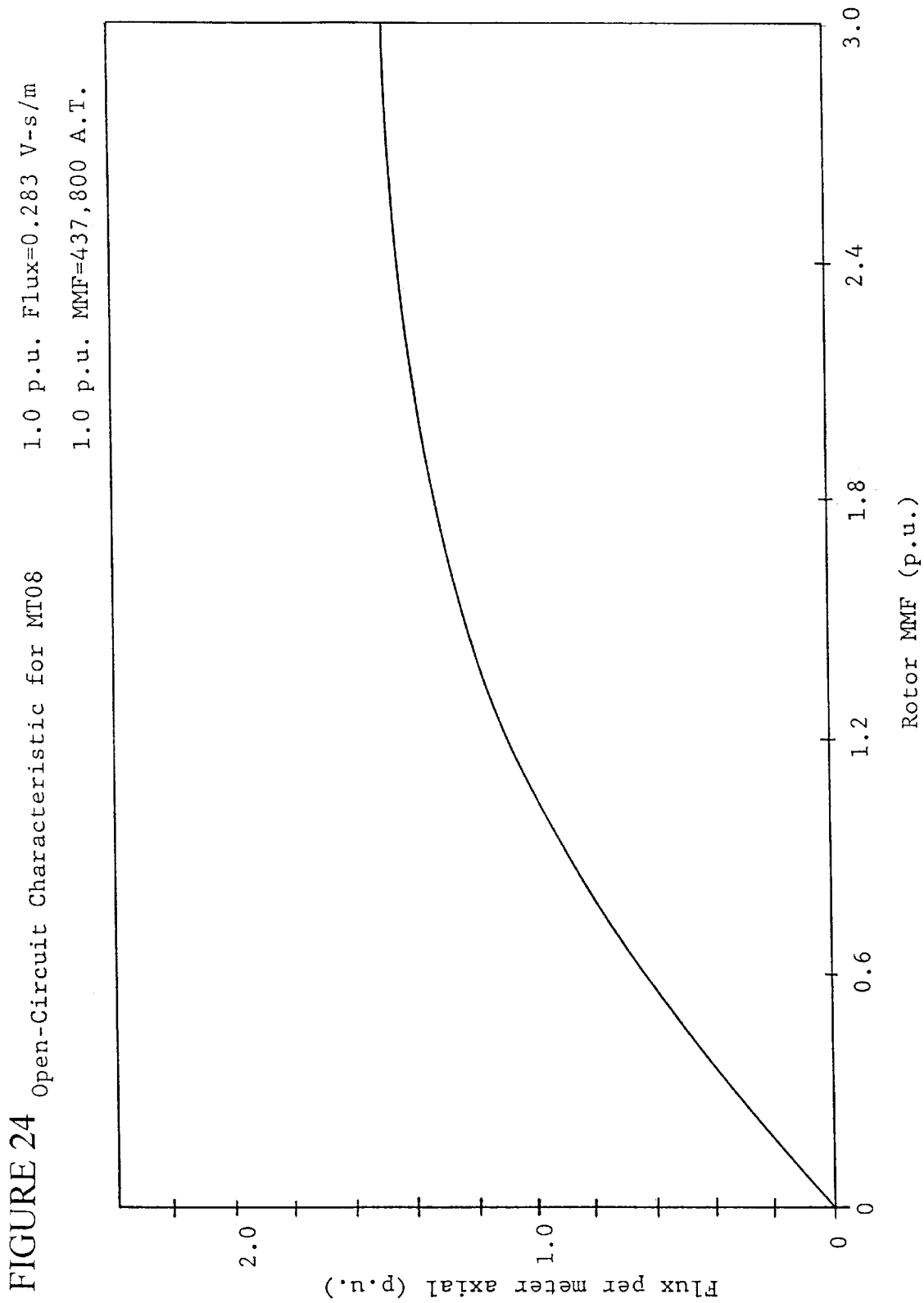
FIG. 24. Synchronous machine open-circuit characteristic of flux/meter-axial versus rotor MMF allowing for magnetic saturation.

In this report a six-state model of the PPM is derived in the stator coordinate system. The state equations governing the magnetization MMF magnitude and position, and the stator current direct-(d-axis) and quadrature- (q-axis) components are transformed to a moving coordinate system (d-q coordinates) which follows the motion of the magnetization current. It is shown that the direct component $i_{Sd}$ of the stator current vector can be used to control the magnitude of the magnetization MMF (permanent magnet excitation), while the quadrature component $i_{Sq}$ of the stator current vector affects the rotor angle of the flux, as well as the torque developed. For IFD, a PI-type controller will be used to regulate the magnitude of the magnetization MMF predetermined setpoint. FIG. 23 shows the "V-curves" for Apparent Power (MVA) versus field magnetization expressed in terms of an equivalent field current, for the case of a 16-pole machine operating at 150 rpm and at two real power levels: 50%, and 100% of full load of 19.22 MW (25,000 HP). Each set of V-curves is specific for a particular value of Potier Reactance ($X_p$) and no-load values for field excitation, and the open-circuit characteristic (OCC). FIG. 24 shows motor open circuit characteristic allowing for saturation in both rotor and stator magnetic circuits, corresponding to Designation MT08. TABLE 13 has data points for all power factors leading and lagging, for 25%, 50%, 75% and 100% load, as may in the preferred embodiment be predicted by block 80 in FIG. 12.

For the purposes of kinematic control, the main output variable of interest is the torque (or force if controlling linear motors), while the input variables to the PPM are the three stator phase voltages, or equivalently the quadrature-component $v_{Sq}$ of the stator voltage vector.

The positive-sequence shear force on the rotor produced by the motor stator fault currents is given in the field coordinates by $$F = K_L i_{mR} i_{Sq} \triangleq \frac{2\pi L_0}{3(1+\sigma_R)\tau_p} i_{mR} i_{Sq}. \tag{E1}$$

here $L_0$ is the stator-rotor damper winding equivalent mutual inductance, $\sigma_R$ is a magnetic leakage parameter, $\tau_p$ is the stator pole pitch, $i_{mR}$ is the magnitude of the magnetization current, and $i_{Sq}$ is the quadrature-component of the stator current vector produced by fault currents. Since the motor parameters in equation (E1) remain essentially constant for a given output torque setting, and it is assumed that $i_{mR}$ is controlled to a constant value, the shear-force F on the rotor damper cage is controlled solely by $i_{Sq}$, the quadrature component of the stator current vector.

Since the stator excitation is supplied by a voltage-source inverter, the stator q-axis current $i_{Sq}$ and hence the fault-indication torque (which is the damper cage shear-force F divided by shaft radian speed) must be controlled by specifying the stator voltage vector $\underline{v}_s$. The relation between these variables is given by $$i'_{Sq} = \frac{R_S}{\sigma L_S}\left[\frac{v_{Sq}}{R_S} - i_{Sq}\right] - \rho' i_{Sd} - \frac{1-\sigma}{\sigma}\rho' i_{mR}. \tag{E2}$$

where $R_s$, $\sigma$, $L_s$ and $\rho$ are defined in Table 7. To compensate for the coupling terms on the righthand side of equation (E2), we define the modified stator voltage quadrature-component $\bar{v}_{Sq}$ by $$\bar{v}_{Sq} = v_{Sq} - \sigma L_S \left[\rho' i_{Sd} + \left(\frac{1-\sigma}{\sigma}\right)\rho' i_{mR}\right]. \tag{E3}$$

Inserting (E3) into (E2), we have a new equation for the dynamics of the quadrature-component of the stator current vector:

$$i'_{Sq} = \frac{R_S}{\sigma L_S}\left[\frac{\bar{v}_{Sq}}{R_S} - i_{Sq}\right]. \tag{E4}$$

The form of (E4) facilitates the frequency-domain analysis given below. For control calculations and analysis, the compensated equation (E4) will be used. In the actual IFD control, the applied stator voltage quadrature component $v_{Sq}$ will by derived from the calculated modified version $\bar{v}_{Sq}$ by inversion of equation (E3).

TABLE 7

Symbols Used in FOV Derivation

| Symbol | Description | Units |
|---|---|---|
| $\pi$ | Pi (approx. 3.1415927) | (#) |
| $\rho$ | Normalized position of magnetization current vector | rad |
| $\sigma$ | Magnetic field form factor for motor stator | (#) |
| $\sigma_R$ | Magnetic field form factor for P.M. Rotor | (#) |
| $\tau_P$ | Motor stator pole pitch | m |
| $\omega_F$ | Bandwidth of closed force control loop | rad/sec |
| $F$ | Shear-force developed by motor stator | Nt |
| $i_{mR}$ | Magnitude of magnetization current vector | A |
| $i_{Sd}$ | Direct component of stator current vector | A |
| $i_{Sq}$ | Quadrature component of stator current vector | A |
| $K_1$ | Proportional gain of force PI controller | V/Nt |
| $K_2$ | Proportional gain of speed PI controller | Nt-s/m |
| $K_3$ | Proportional gain of position PI controller | 1/s |
| $K_F$ | Gain coefficient of closed force loop | (#) |
| $K_L$ | Gain coefficient of motor stator | Nt/V |
| $L_O$ | Stator-rotor mutual inductance | H |
| $L_S$ | Motor stator leakage inductance | H |
| $R_S$ | Motor stator phase resistance | Ohm |
| $s$ | Complex frequency variable | rad/s |
| $v$ | Tip velocity of rotor | m/s |
| $\underline{v}_s$ | Motor stator voltage vector | V |
| $v_{Sq}$ | Quadrature component of stator voltage vector | V |
| $\bar{v}_{Sq}$ | Compensated quadrature component of stator voltage vector | V |
| $x$ | Position of rotor reference point | m |
| $(\cdot)^*$ | Indicates reference (optimal) value | |

The compensated equation (E4) for stator q-axis current and the rotor shear-force equation (E1) are readily combined to give that part of the motor dynamic model relevant to the kinematic control loops:

$$F' = \frac{2\pi L_0}{3(1+\sigma_R)\tau_p \sigma L_S} i_{mR} \bar{v}_{Sq} - \frac{R_S}{\sigma L_S} F. \tag{E5}$$

Taking the Laplace transform of (E5), we have $$\frac{F(s)}{\bar{v}_{Sq}(s)} = \frac{K_F}{s + \omega_F} \triangleq \frac{\frac{2\pi L_0 i_{mR}}{3(1+\sigma_R)\tau_p \sigma L_S}}{s + \frac{R_S}{\sigma L_S}}. \tag{E6}$$

Equation (E6) is the frequency-domain (Laplace) model of the motor shear-force output to be used for the kinematic controller design and internal fault detector. This equation demonstrates the advantage of the FOV control approach, since the appropriate coordinate transformation has linearized the fault detection system and further has allowed the rotor damper currents and associated shear-force for positive sequence torque to predict stator winding faults.

2.3.1.2.4 Selection of Controller Gains

One advantage of the nested PI loop controller structure presented here is the possibility of a systematic design procedure for the controller gains. We illustrate this process for a nominal design case using the parameters reported in Section 1. In consideration of these values, the model parameters $K_F$ and $\omega_F$ as defined in equation (E6) are equal to 456,000 and 111.22, respectively rad/sec.

Figure 25:
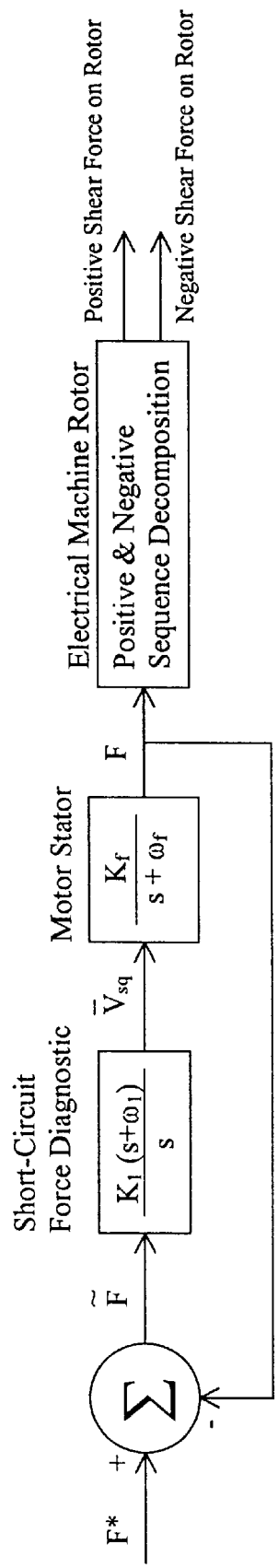
FIG. 25. Control loop for innermost force/torque-calculating function.

Consider first the innermost (force) loop of the diagram of FIG. 22. This loop is redrawn in FIG. 25 with expressions for the controller and motor transfer functions inserted. The delay of the IGBT inverter at 0.10 ms is small compared to the stator effective time constant $\sigma L_S/R_S$; which is approximately 1.5 ms; hence the effect of the inverter is omitted here.

Note that the transfer functions of the PI controllers are not expressed as a gain plus a scaled integration, e.g. FKP+FKI/s.

In a microcontroller, the root locus criteria would be calculated and the above transfer function is written in pole /zero form, e.g.

$$\frac{\bar{v}^*_{Sq}(s)}{F(s)} = \frac{K_1(s + \omega_1)}{s}. \tag{E7}$$

For implementation, the proportional gain FKP is equal to the forward gain $K_1$, while the integral gain FKI is equal to the product of $K_1$ and the controller natural frequency, $\omega_1$.

The forward path in the force loop has two poles in the complex frequency plane: one at the origin due to the integrator in the PI controller, and one due to the motor stator inductance. Let the PI controller's zero be chosen so as to cancel the second of these poles, that is, at −111.22 rads/sec. Then the open loop system effectively has a single pole at the origin, and by suitable choice of the proportional gain $K_1$ this pole may be placed arbitrarily along the negative real axis in the complex plane.

From the standpoint of speed of response, it is desirable to place the pole as far to the left as practical. Generally, however, placement further to the left in the complex plane results in increased controller effort and possible saturation. With a proportional gain value of 3.0E-4 in the force PI controller, the closed loop pole is moved to −136.81 rads/sec, providing a conservative increase in the speed of response above that of the open loop system, without making excessive sacrifice of control effort headroom. The faster the response speed of the control loop, the faster the fault detection for stator winding faults. Then the inner (force) loop transfer function is given by $$\frac{F(s)}{F^*(s)} = \frac{K_1 K_F}{s + K_1 K_F} = \frac{136.8}{s + 136.8}. \tag{E8}$$

This is a first order lag-type response with a time constant of 7.3 milliseconds. This time interval is less than one-third of a cycle period of the inverter 40 Hz; hence the inverter firing lag of 40–80 usec does not contribute significantly to the behavior of the force control loop.

Figure 26:
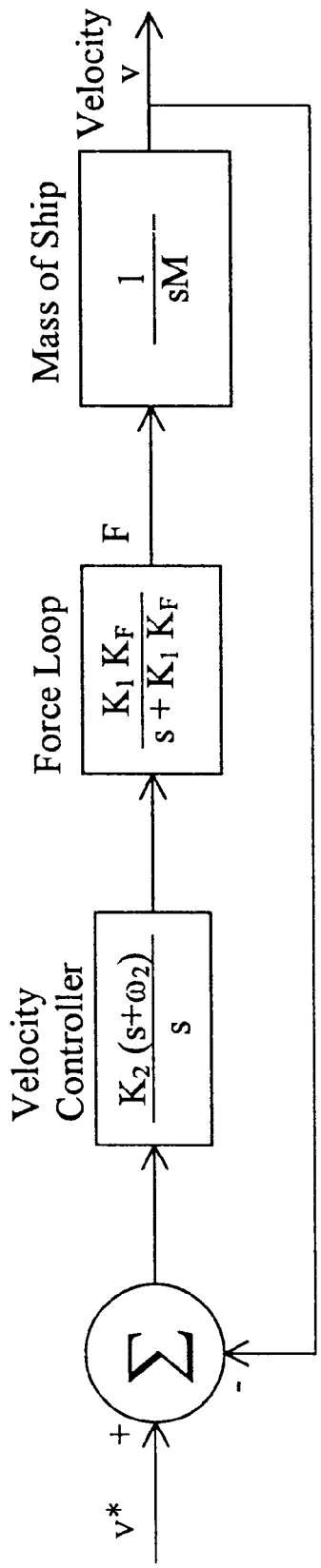
FIG. 26. Control diagram of innermost speed or output velocity loop.
Figure 27:
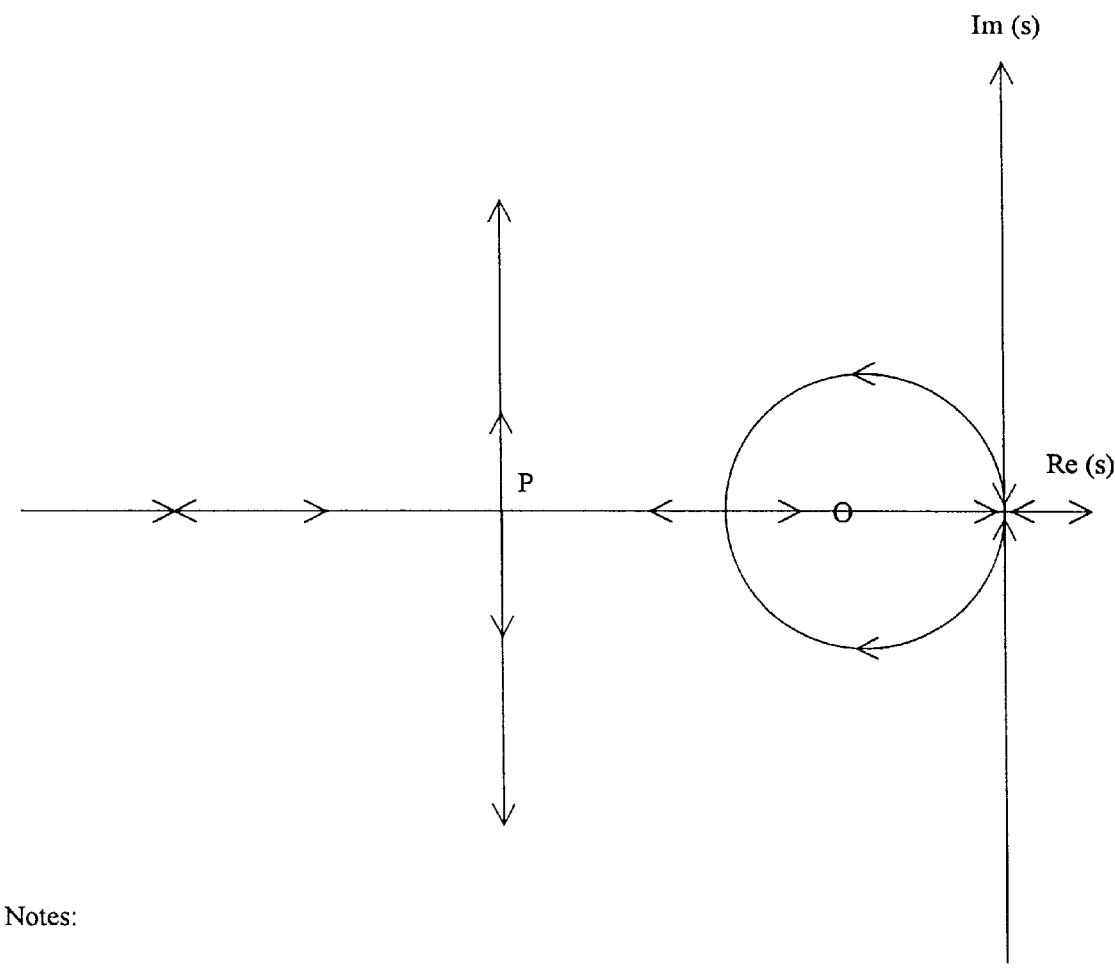
FIG. 27. Pole and zero location of speed loop with root-locus.

FIG. 26 shows a diagram of the intermediate (speed) loop, with the transfer function of the inner loop inserted as a block. The open loop pole and zero locations of the speed loop are shown in FIG. 27, along with a root locus diagram for the closed loop system. For a critically damped system, it is desirable to place the two left most closed-loop poles at the breakpoint P in the diagram. Further, the velocity PI controller zero location should be chosen to provide minimum deviation of the actual system response from that of the approximated second order system. This is accomplished by insuring a near cancellation of this zero by the third closed-loop pole. If the zero location is chosen at s=−0.628 (a natural frequency of 0.1 Hz), then the proportional gain coefficient required to place the two left most closed-loop poles at the breakpoint P is $K_2$=5.79 (E5). The resulting closed-loop system has two poles at s=−68.0, and a single pole at s=−0.640.

This latter pole very nearly cancels the controller zero placed at s=−0.628, resulting in a step response which remains within 1.7 percent of the approximated, critically damped, second-order response. The natural frequency of the dominant pole pair is 10.82 Hz; this is the bandwidth of the speed control loop. In the Laplace domain the transfer function of the closed speed loop is given by $$\frac{v(s)}{v^*(s)} = \frac{4724.8(s+.628)}{(s+.6398)[(s+68.08)^2 + 1.680^2]}. \quad (E9)$$

A similar development is used for the case of the outermost (position control) loop. This position information is important to the IFD control scheme because it defines a relationship that is measurable between the angular position of the rotor and the stator; given a specific frequency from the inverter and a section of the stator that has cut-out windings, i.e., de-energized by thyristor switching, the acceleration and position of faults on the rotor can be derived by the FOV controller. The most likely source of rotor faults are a) fractured magnets and b) de-magnetized magnets resulting from motor fault currents, especially low-frequency 10–20 Hz faults.

Figure 28:
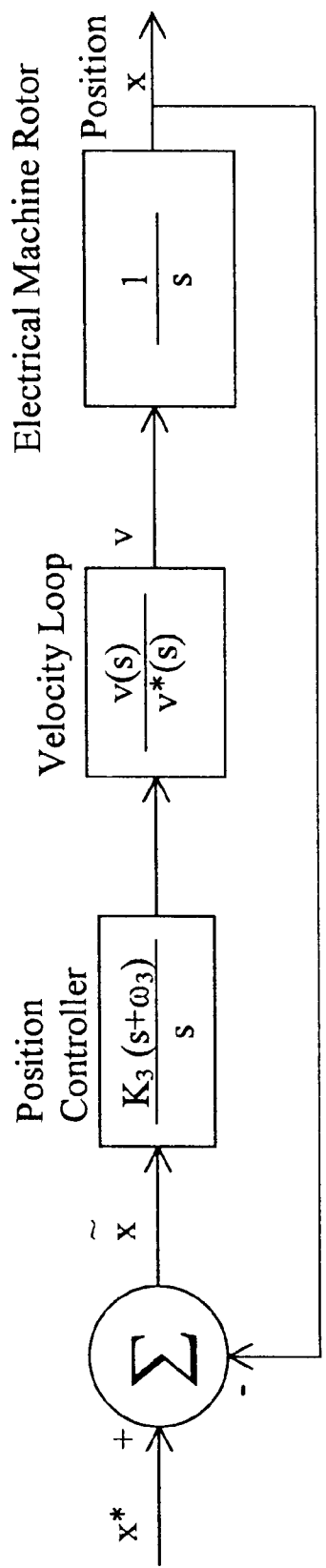
FIG. 28. Shaft speed control loop transfer function showing rotor position controller and PM rotor peripheral velocity.
Figure 29:
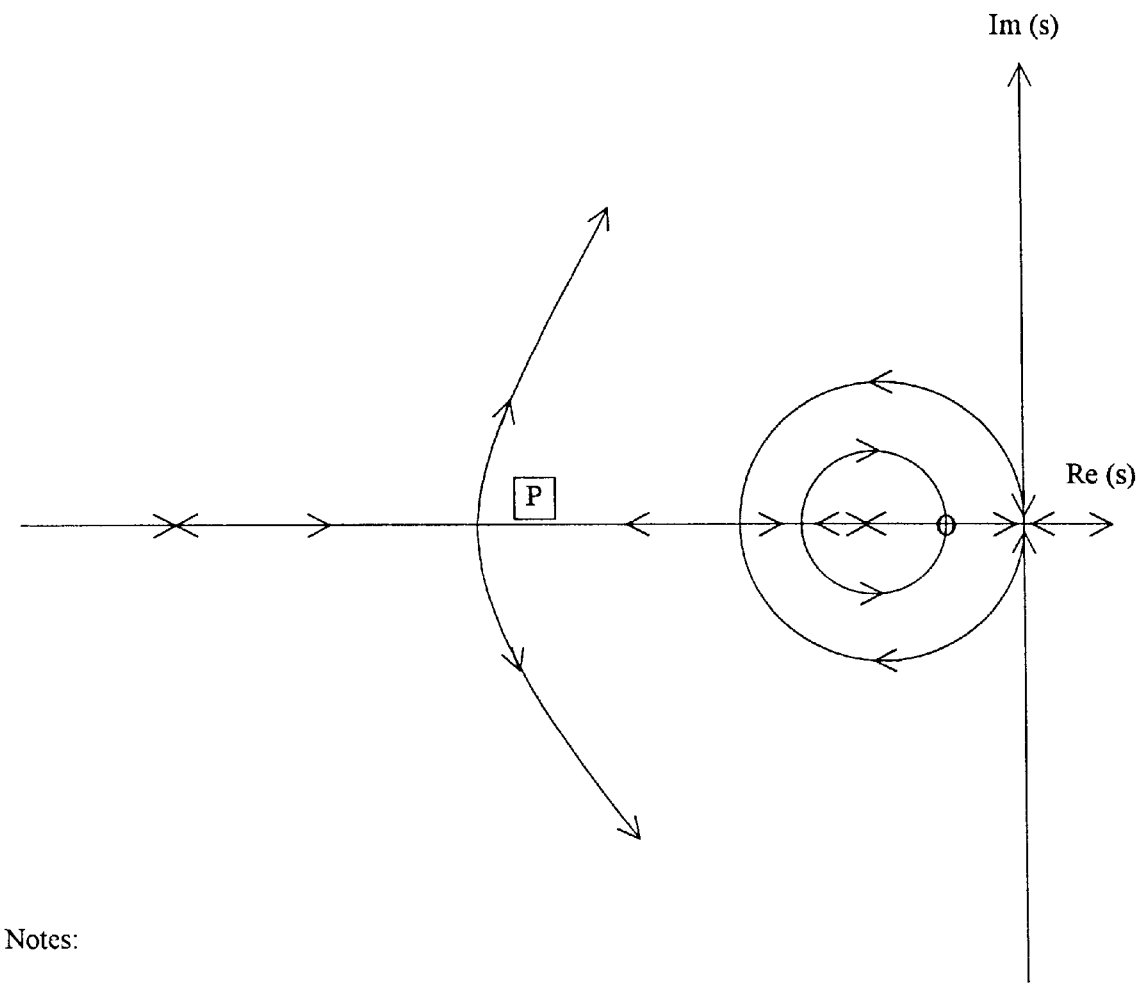
FIG. 29. Root-locus diagram corresponding to FIG. 28 for rotor position loop.

A block diagram for this control loop with shaft speed loop transfer function inserted as a block, is shown in FIG. 28. A diagram of the position loop root locus is shown in FIG. 29. In this diagram the location of the position PI controller's zero has been taken as s=−0.628, corresponding to a natural frequency of 0.1 Hz. As in the case of the velocity controller, the proportional gain coefficient $K_3$=10.19 is selected to place the two left most, closed-loop poles near the breakpoint P shown in FIG. 29. This places the two remaining poles within 3.2 percent of the two open-loop zeroes, so that the effects of these dynamics are minimal. The closed-loop position control system is characterized by its transfer function:

$$\frac{x(s)}{x^*(s)} \approx \frac{48146.1(s+.628)}{[(s+22.277)^2 + .4898^2][(s+.6484)^2 + .00920^2](s+90.94)} \quad (E10)$$

The behavior of this loop is dominated by the two critically damped poles at s=−22.28, corresponding to a closed-loop bandwidth of 3.5 Hz. This response bandwidth is judged acceptable, since position control is only used during the slow-speed maneuvers in which minimal power levels are applied. The main objective of the invention is identifying Type I and Type II stator faults based on stator terminal measurements and damper cage shear-force (torques) which are directly related to the fault currents.

The particular numbers used in equations E8, E9 and E10 are merely representative of one embodiment and can be readily modified to suit different drive motor configurations having variations in pole-number, pole-pitch, phase parallels, mutual inductance, etc.

The following constructional features are assumed to be common to all machines in a class allowing FOV detection of stator faults.

a. The rotor has a permanent-magnet or fixed-MMF field with identical MMF per field pole.
b. The stator is wound with one or greater phase parallels grouped together per common bilateral isolating switch and classified according to Table 8.

TABLE 8

Stator Parallel Group Switching Classification

Figure 30:
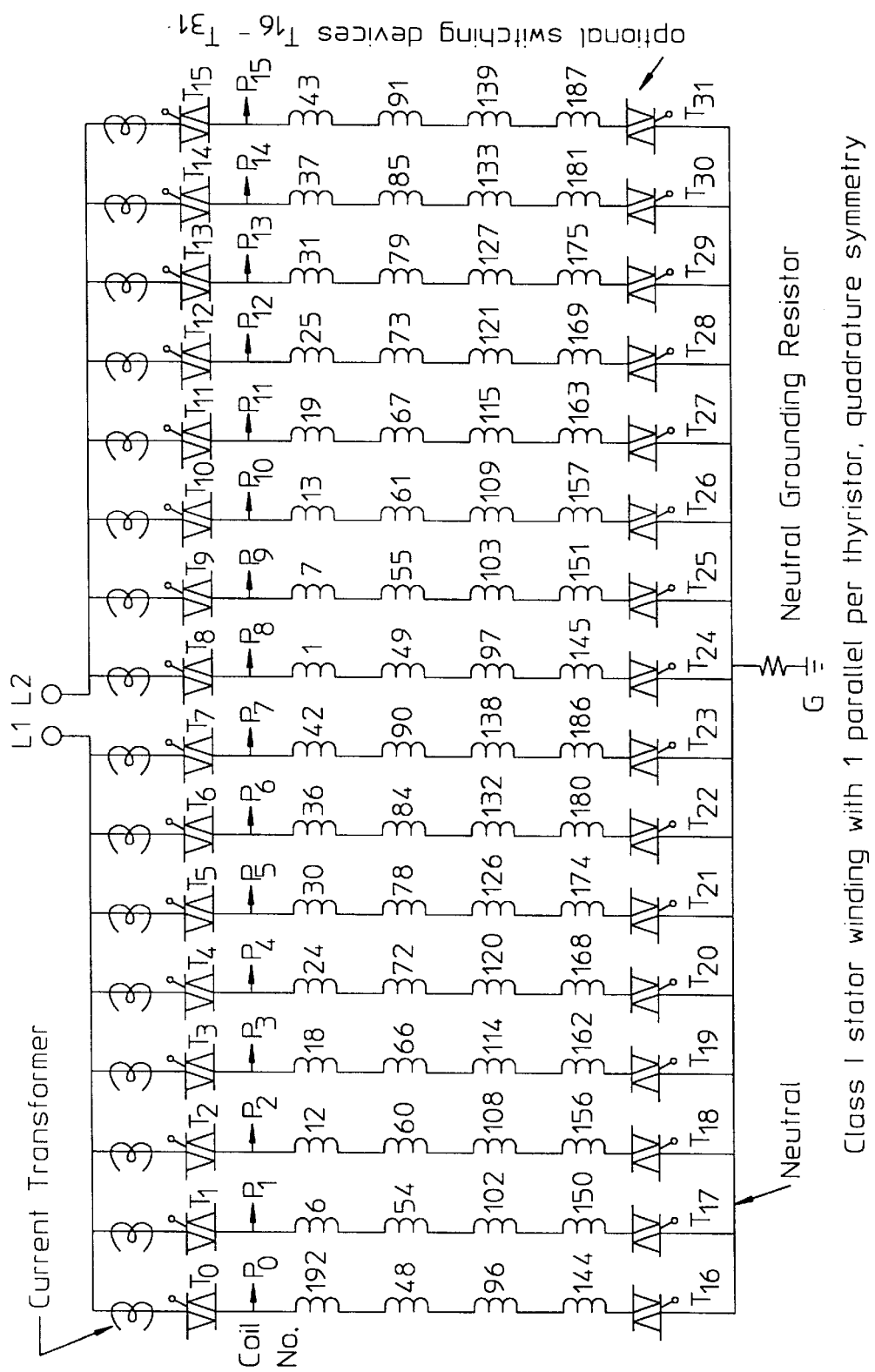
FIG. 30. Class I stator winding (Phases L1 and L2 shown only) with 1 parallel/switching device in 192 coils total, 6 phase example exhibiting quadrature symmetry.
Figure 31:
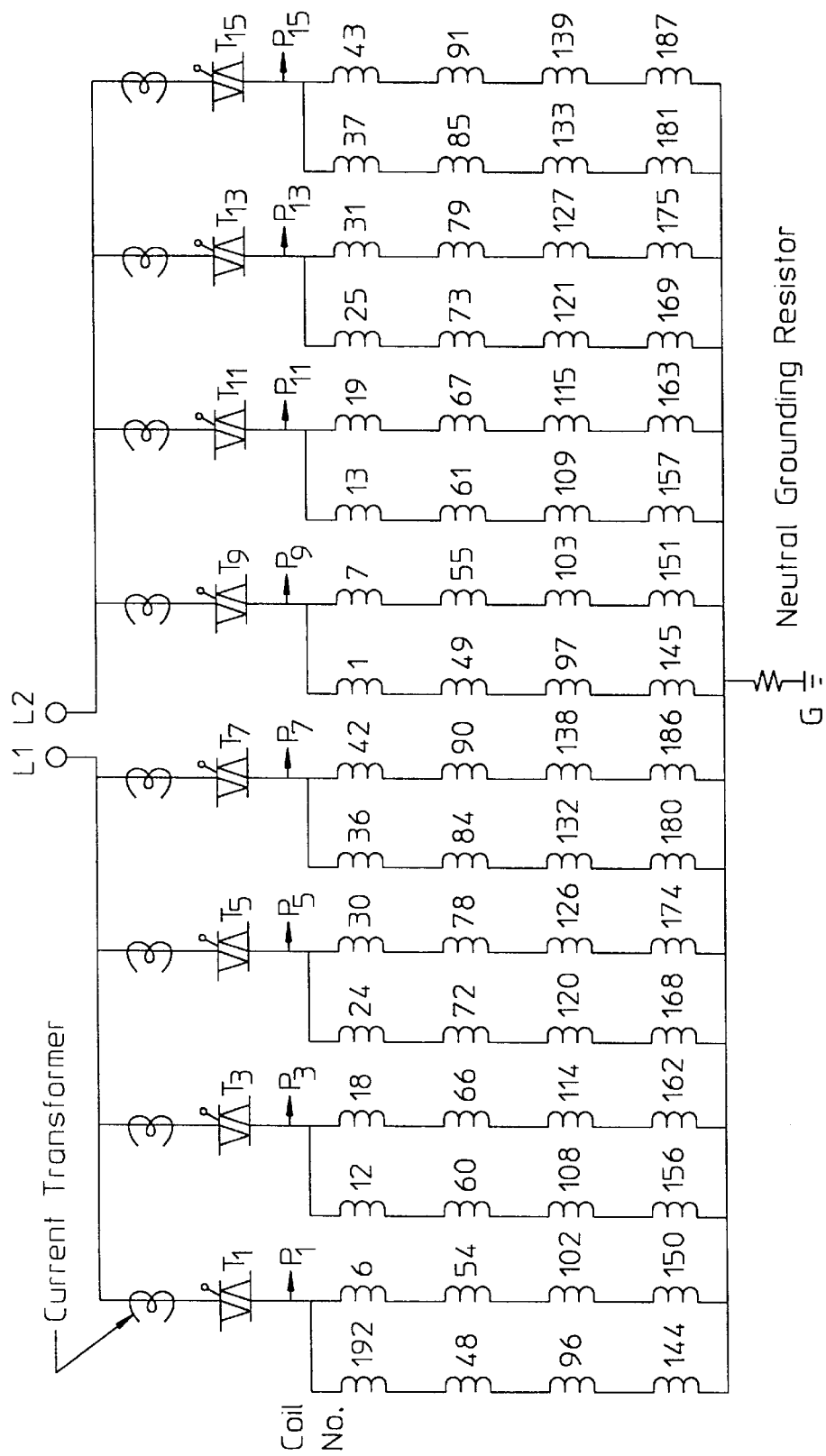
FIG. 31. Class II stator winding (Phases L1 and L2) with 2 parallels/switching device in 192 coils total, 6 phase example exhibiting quadrature symmetry.
Figure 32:
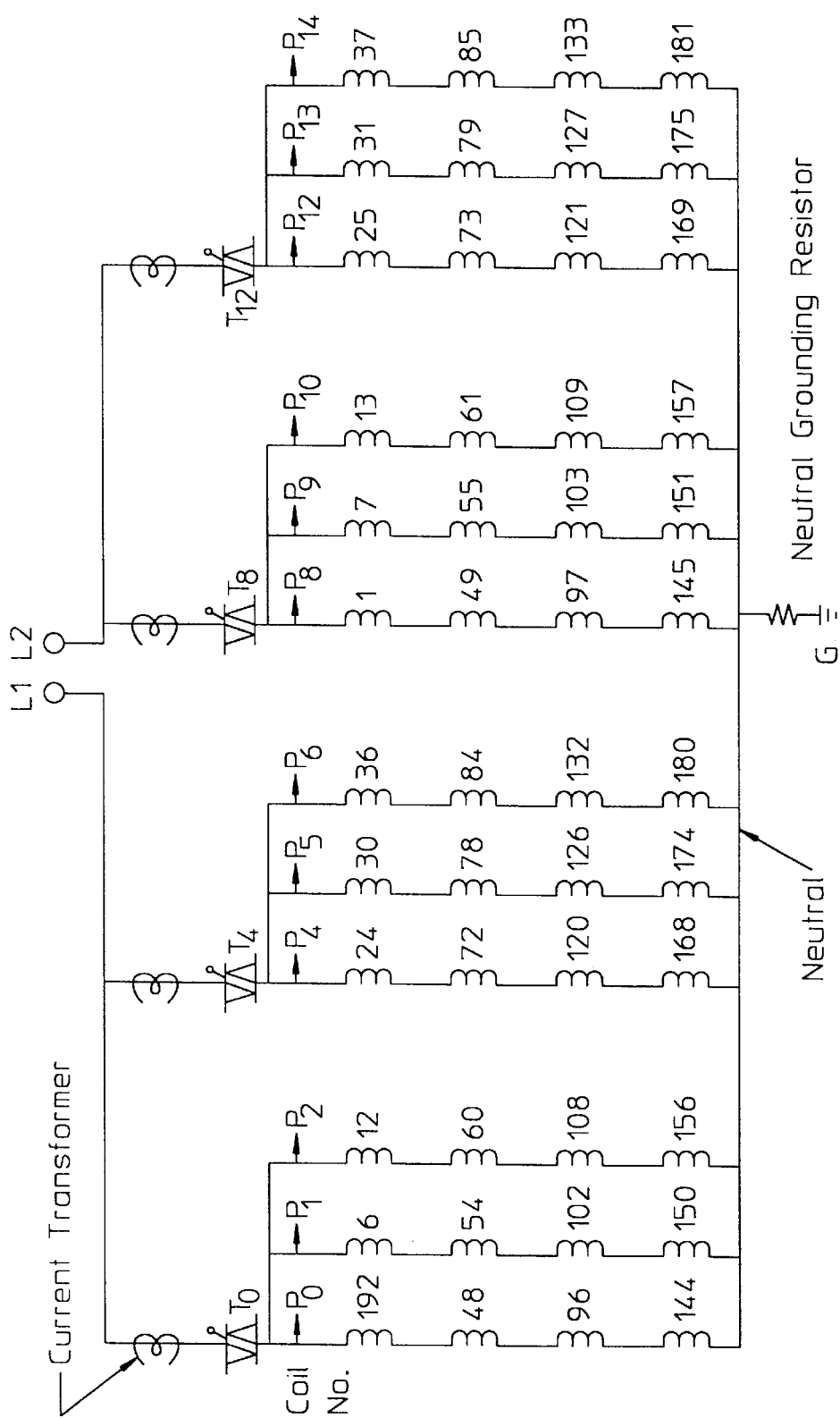
FIG. 32. Class III stator winding (Phases L1 and L2) with 3 parallels/switching device in 192 coils total, 6 phase example exhibiting quadrature symmetry.
Figure 33:
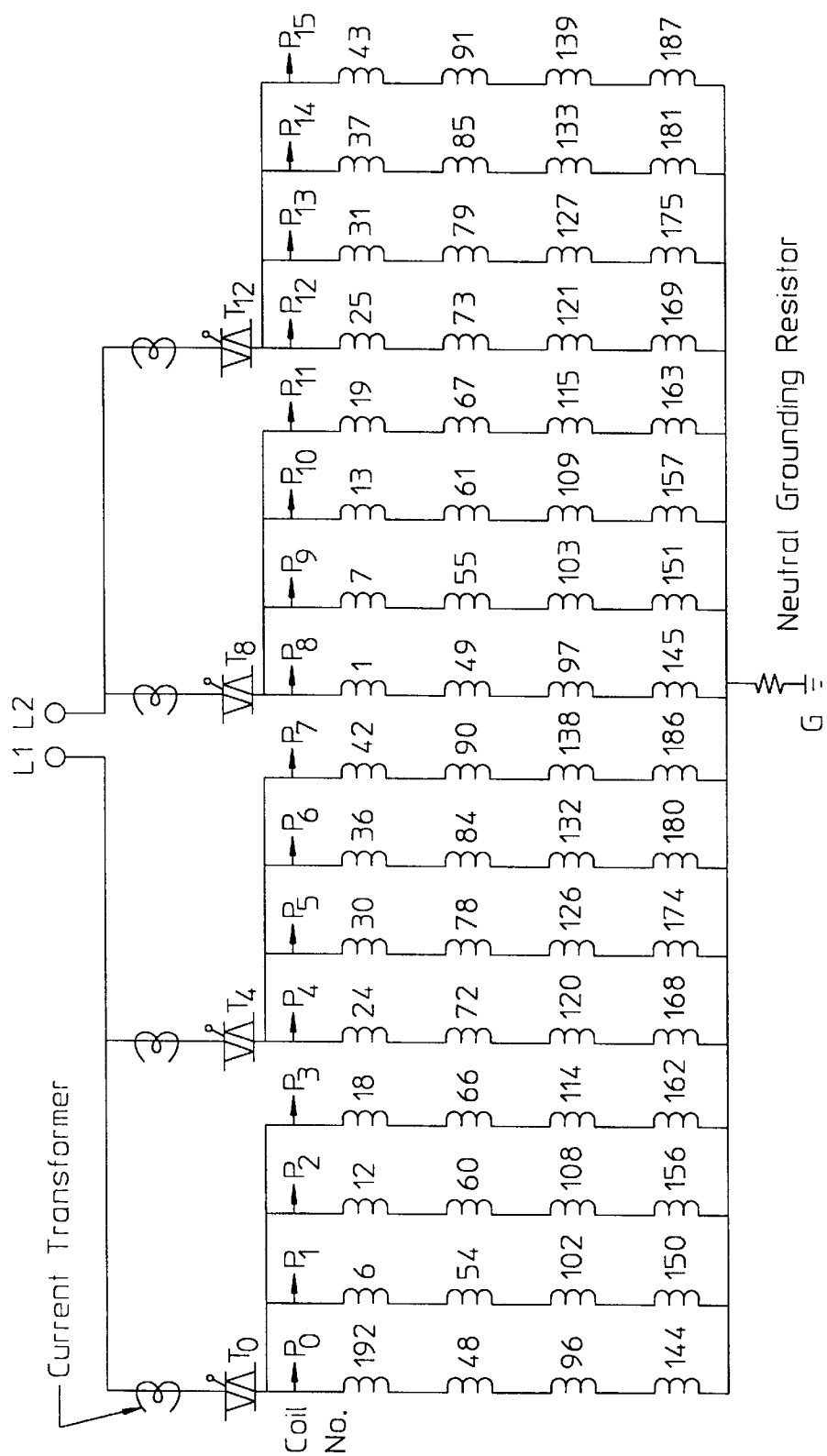
FIG. 33. Class IV stator winding (Phases L1 and L2) with 4 parallels/switching device in 192 coils total, 6 phase example exhibiting quadrature symmetry.
Figure 34:
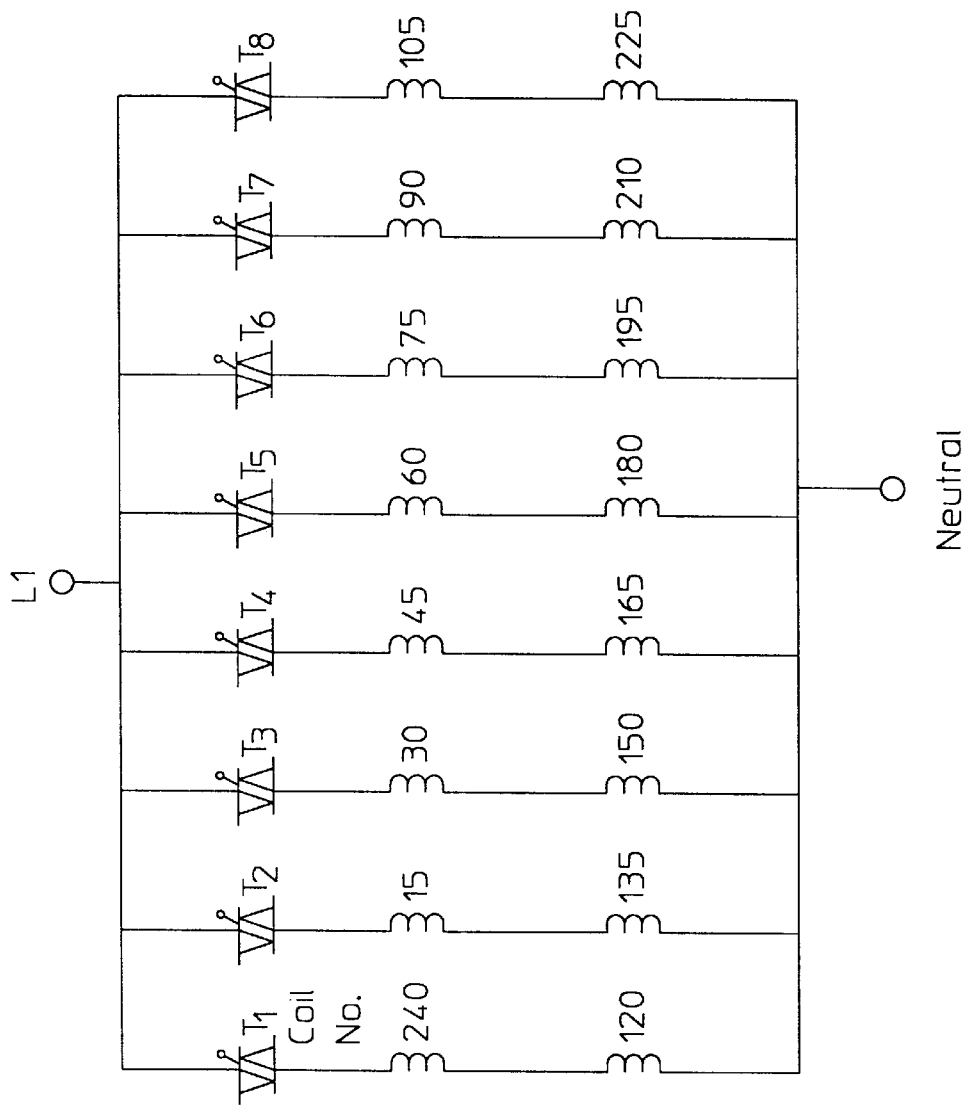
FIG. 34. Class V stator winding (Phase L1 only) with 1 parallel/switching device in 240 coils total, 15 phases exhibiting diammetrical symmetry.
Figure 35:
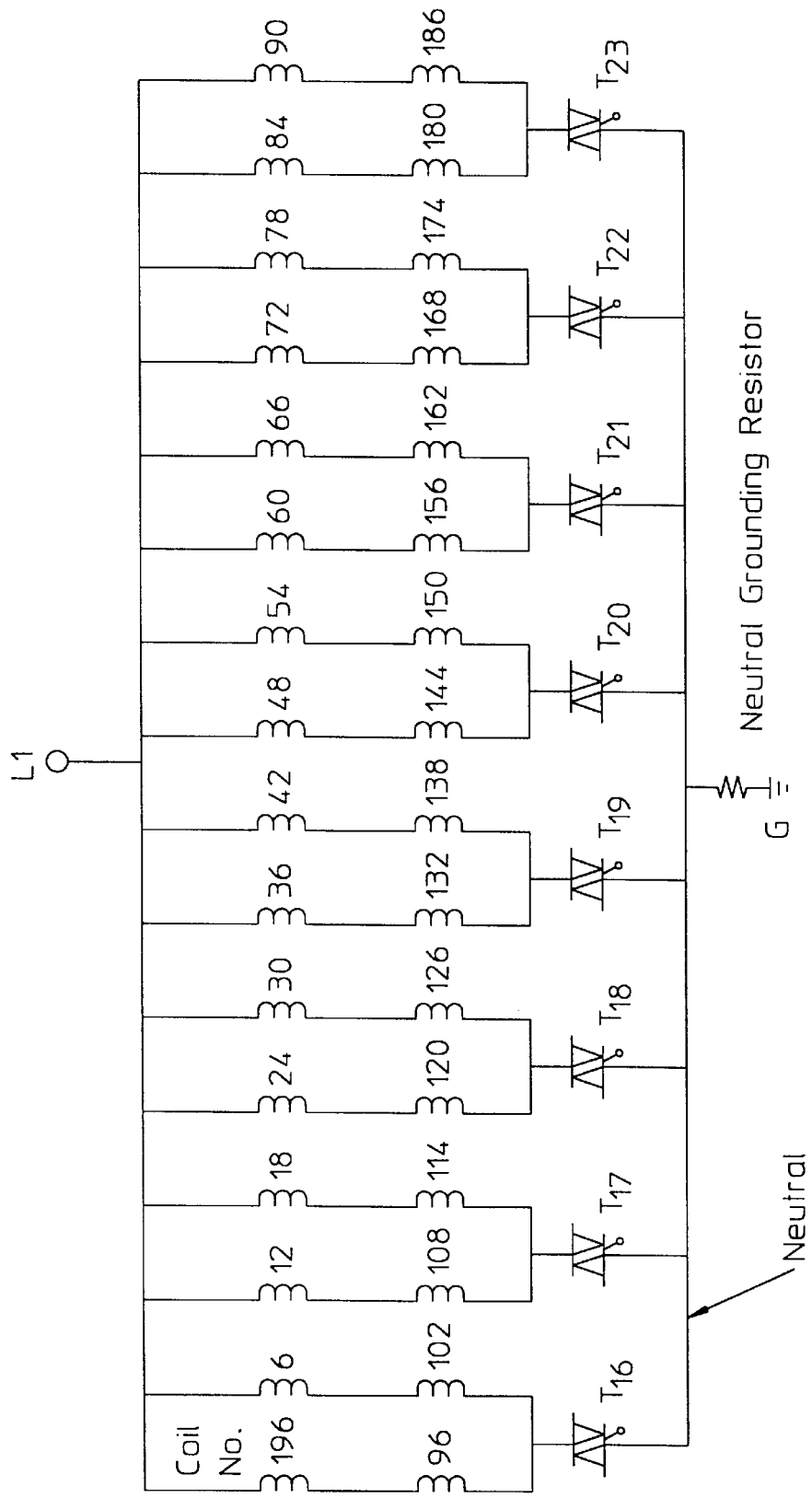
FIG. 35. Class VI stator winding (Phase L1 only) with 2 parallels per switching device in example with 192 total coils, 16 parallels per phase, 6 phases exhibiting diammetrical symmetry.
Figure 36:
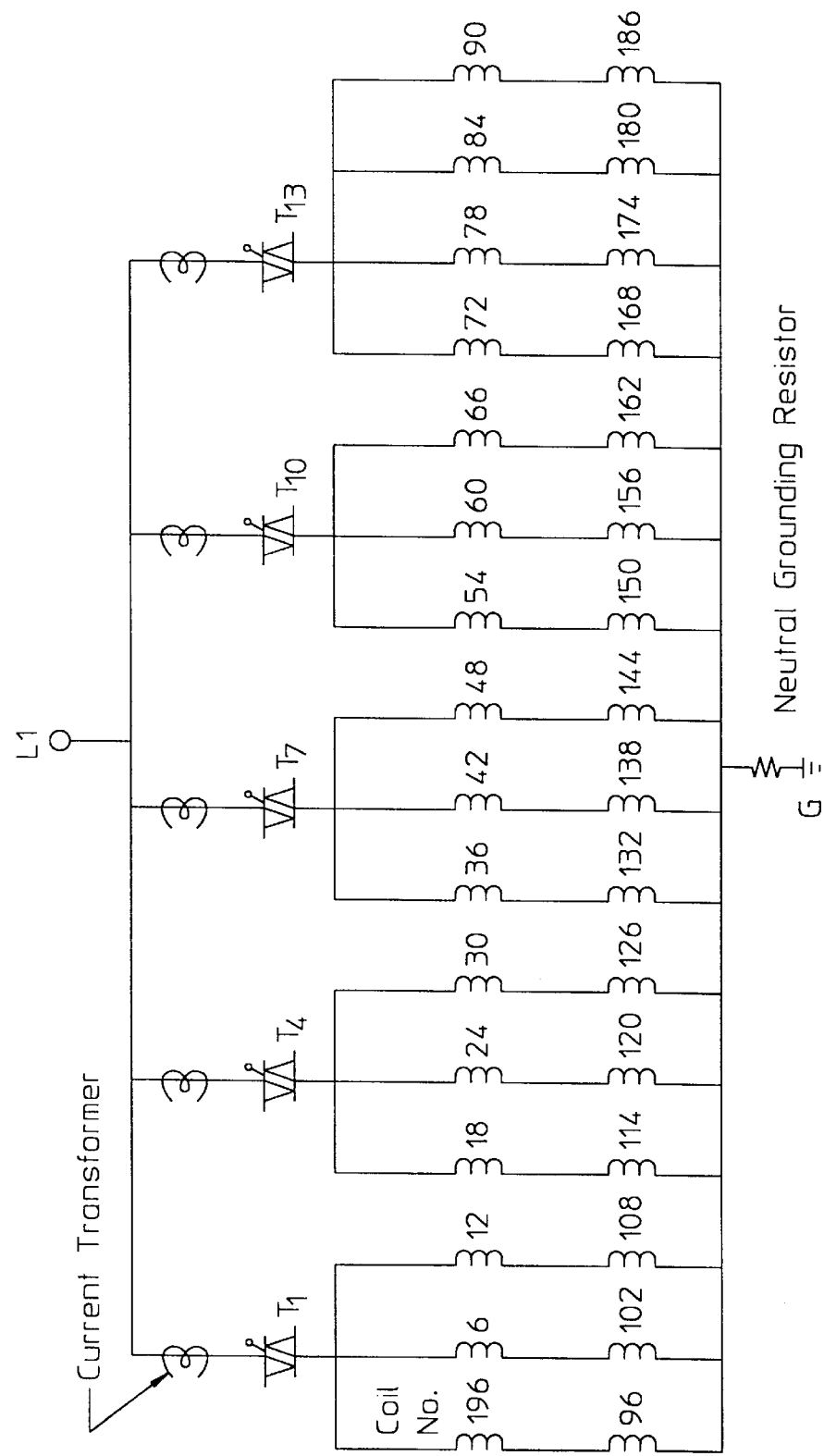
FIG. 36. Class VII stator winding (Phase L1 only) with mixed 3 and 4 parallels per switching device in example with 192 total coils, 16 parallels per phase, 6 phases exhibiting diammetrical symmetry.
Figure 37:
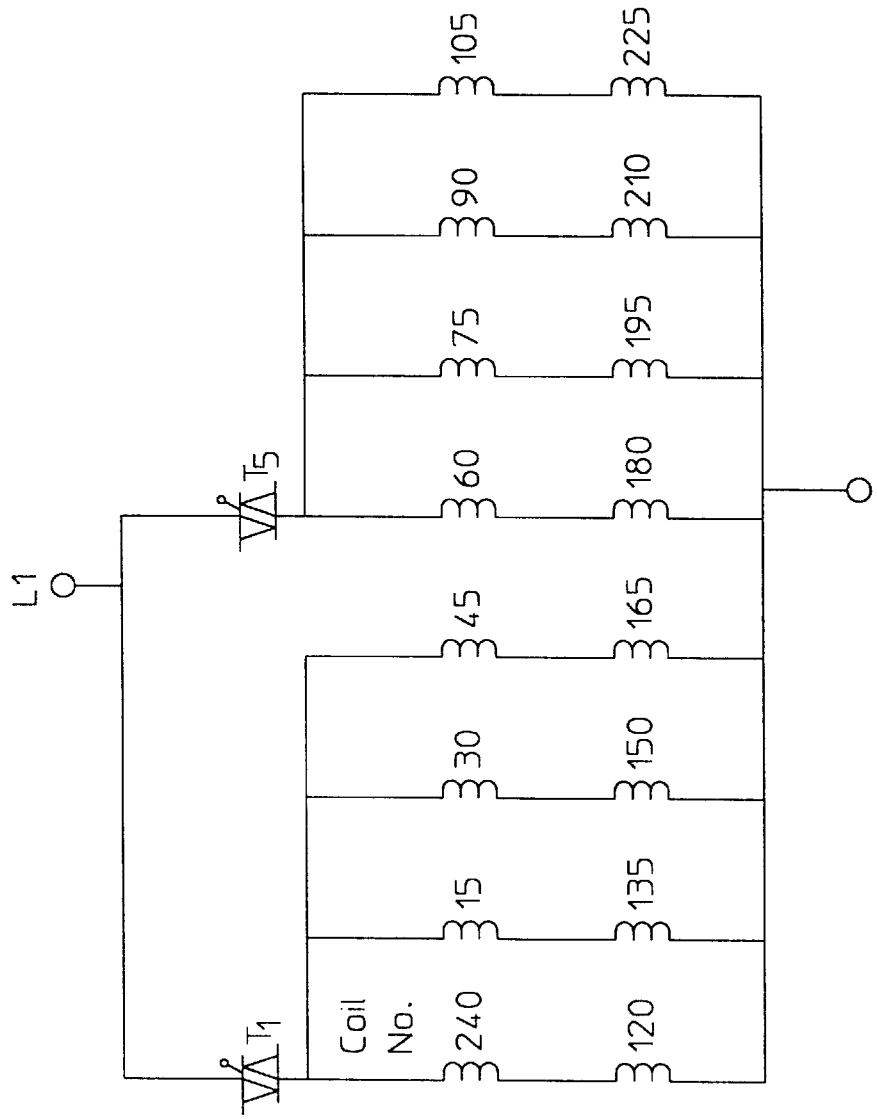
FIG. 37. Class VIII stator winding (Phase L1 only) with 4 parallels per switching device, in example with 240 coils total, 8 parallels per phase, 15 phases exhibiting non-quadrature symmetry.

| No. of Parallels/SD | 1 | 2 | 3 | 4 |
|---|---|---|---|---|
| Class | I | II | III | IV |
| Reference Symmetry | FIG. 30 Quadrature | FIG. 31 Quadrature | FIG. 32 Quadrature | FIG. 33 Quadrature |
| Class | V | VI | VII | VIII |
| Reference Symmetry | FIG. 34 Non-Quadrature | FIG. 35 Non-Quadrature | FIG. 36 Non-Quadrature | FIG. 37 Non-Quadrature | c. The stator has inherent diametrical symmetry for any particular phase parallel in that if a coil is switched out the coil diametrically opposite is switched out due to a series connection of these coils.
d. The stator may or may not have inherent quadrature symmetry for cut-out coils which requires a minimum of four coils in series per phase parallel. Classes I–IV include designs which have inherent quadrature symmetry. Classes V–VIII include designs which do not have inherent quadrature symmetry. (It should be noted that with multiple bilateral switch firing, it is possible to obtain, in effect, quadrature symmetry for cut-out coils, but this is not referred to as inherent symmetry).
e. The rotor has a damper cage, active in both the d-axis and q-axis, of equal reflected surface impedance in both axes.
f. The stator may be instrumented to include provisions for a voltage and current sensor for each set of coils connected to a stator switching device (SSD). Such voltage sensor is able to transmit to the control system, vector quantities for magnitude and phase angle of each input.
g. The stator may or may not include a provision for further instrumenting each phase parallel for voltage drops across individual stator coils.

FIG. 34 shows a Class V stator winding with 1 parallel per switching device, diammetrical magnetic symmetry for a 240 coil synchronous machine with singular winding isolation on the high potential side only.

FIG. 35 shows a Class VI stator winding with 16 parallels/phase and 2 parallels per switching device in example with 192 total stator coils, non-quadrature symmetry with singular winding isolation on low potential side only.

FIG. 36 shows a Class VII stator winding with 16 parallels/phase and 4 sets of 3 parallels per switching device combined with 1 set of 4 parallels per switching device in example with 192 total stator coils, non-quadrature symmetry with singular winding isolation using thyristors on high potential side only.

FIG. 37 shows a Class VIII stator winding with 8 parallels/phase and 4 parallels per switching device in example with 240 total stator coils, non-quadrature symmetry with singular winding isolation on high potential side only.

The analysis which follows applies to variable speed drives of a general nature which follow the general control principal that the fundamental rms voltages applied to the drive motor is increased in (approximately) direct proportion of the output frequency; these drives are termed variable-voltage variable frequency (VVVF) types. The field-oriented vector (FOV) refines this V/F ratio to allow for stator saturation and true calculation of the airgap flux. The generalized FOV fault detection applies both to voltage-source Inverter (VSI) drives and current source inverter (CSI) drives with the following distinctions:

a. In the VSI, the modulation frequency is significantly higher than the fundamental frequency. The current waveform contains higher harmonies and is able to change abruptly, utilizing a small inductance in the input DC power source.

b. In the CSI, the output is a six- or twelve-step output current waveform without higher-order harmonics and the input supply contains a "constant current" DC inductor. The AC voltage output contains higher-order harmonics.

These drives have traditionally assumed the use of hard-switching devices such as GTOs or thyristors. The advent of soft-switching devices such as MOS controlled thyristors or IGBTs offers to improve the waveform quality by reducing the higher order harmonics on both CSI and VSI drives. The concern with using an FOV is the reliability of ensuring both V and I fundamental waveforms are free from distortion or excessive-time-lag due to filter networks.

3.2 Choice of Switching Classification

The choice of switching classification indirectly affects the machine's magnetic design. Machines of the same construction and design can be operated in multiple classes according to the thyristor switching networks available and the level of investment in power electronic isolation devices.

Figure 38:
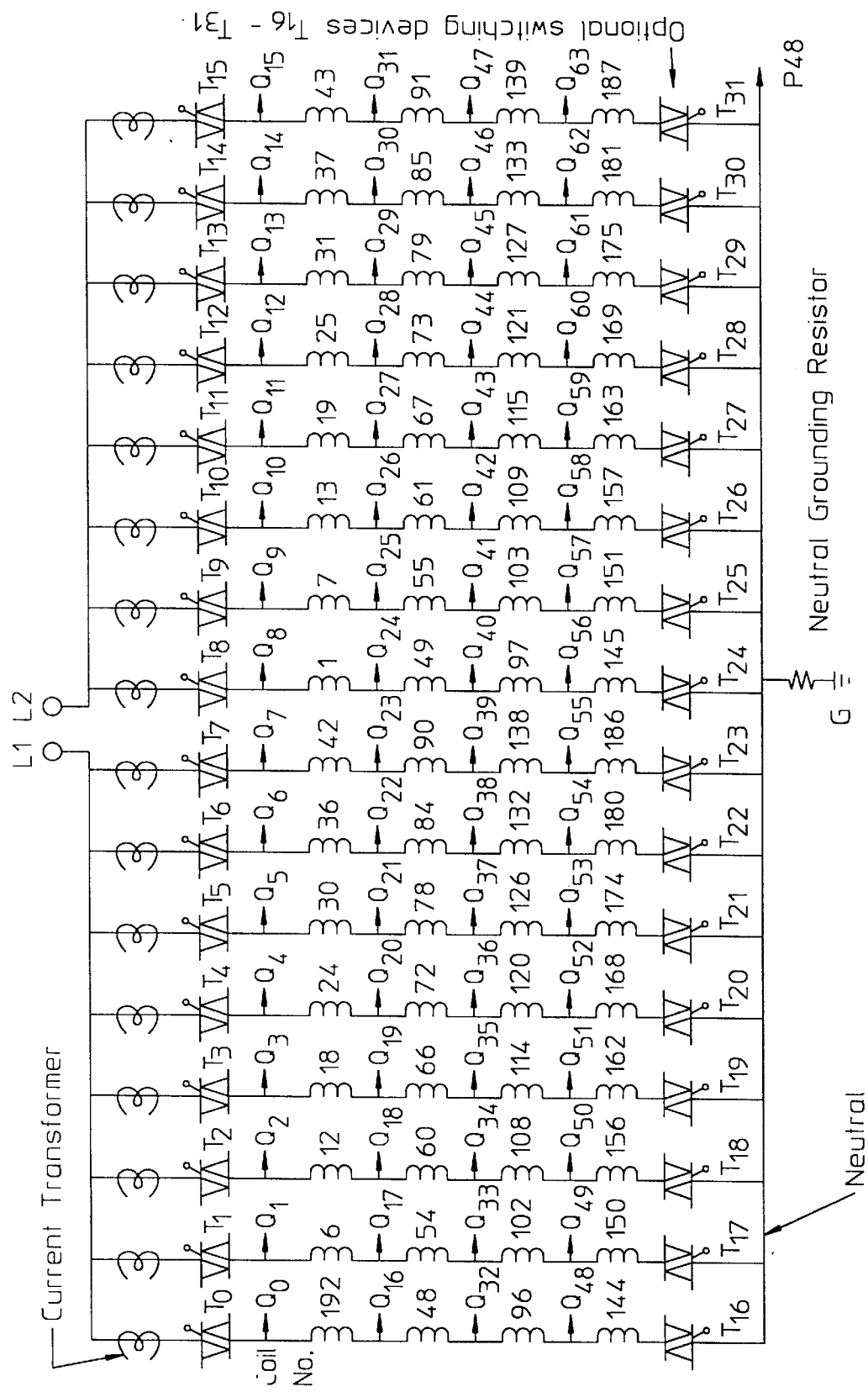
FIG. 38. Winding diagram for two phases of 25,000 HP, 192 total slot stator, 6-phase, 32-pole machine with 8 parallels/phase with quadrature magnetic symmetry showing thyristor sectionalizing on both low and high potential sides of coil.

FIG. 38 shows a representative winding diagram for a 25,000 HP drive motor (Design Designation MT15) with 192 slots, 6-phase, 32 poles designed for 8 parallels/phase and 4 coils in series per phase parallel. This is a Class I switching classification because there is quadrature symmetry. It is fundamental to note that quadrature symmetry is defined for the machine as a whole, not on a pole-by-pole basis. For example, the stator bore diameter is 2.53 m and there are 4 coils spaced at peripheral locations every 1.987 m (along the bore) which are operated by the same switching device, to classify for quadrature symmetry. Since this is a 32-pole machine it is obvious that if the minimum switching step (increment or decrement) for coil cut-out is 4 coils, that some poles will have more active coils than others. This is an acceptable electromagnetic condition for multipolar multimegawatt electric machinery.

The general design approach adhered to throughout the FOV control section is that it is advantageous to minimize the number of cut-out coils at the expense of having a phase-to-phase unbalance in currents so long as the machine can attain either diametrical or quadrature symmetry.

The subsequent analysis and derivation of machine equivalent circuit parameters from terminal (coil-to-coil) measurements assumes one of two operating modes defined as:

Mode I: The d-q axes decomposition and FOV circuitry uses each phase parallel group as a distinct input parameter, thus grouping 2 or more coils together. These instrumentation points are shown by example in FIG. 30 as labels P1, P2 . . . P17 with a potential to the neutral point. Thus, this 192 coil stator has a total of 48 instrumentation points. This is not an excessive number.

Mode II: The d-q axes and FOV circuitry uses each coil terminals as a distinct input parameter, thus adjacent inputs are at different potential levels although these have approximately equal absolute magnitudes. These instrumentation points are shown by example in FIG. 38 as points Q0–Q62 for Phases L1 and L2. A high-voltage differential amplifier input is needed for 8 of 12 input channels.

Figure 39:
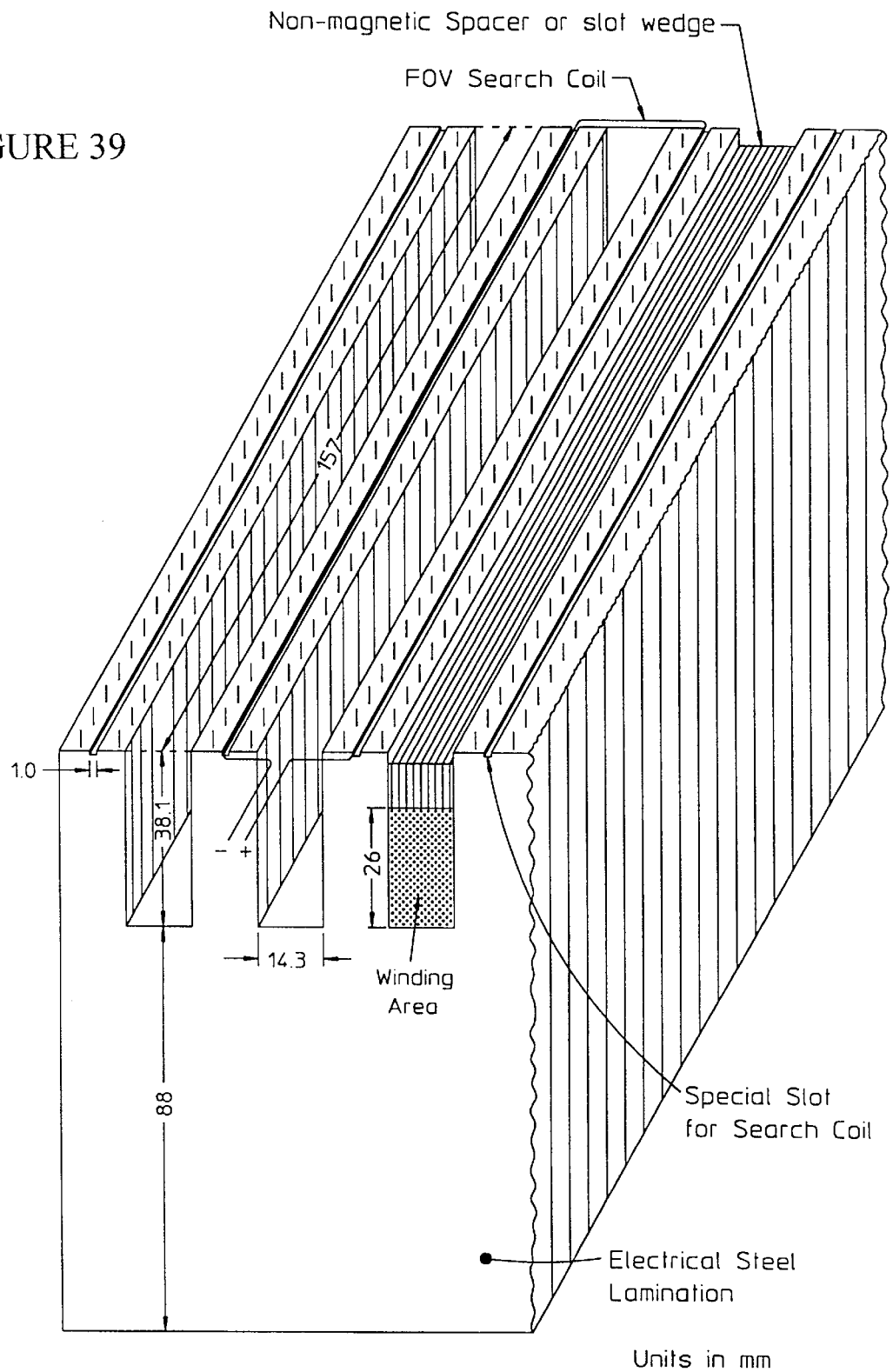
FIG. 39. Preferred location of tooth-top search coils along stator bore when axially-directed search coil slots are engraved in tooth top magnetic steel.

FIG. 39 shows the preferred location of tooth-top search coils which are located in special miniature slots machined in the stator teeth that minimize leakage flux and offer high resolution of the magnetic field in the airgap. This is an alternate embodiment to the search coil ring shown in FIG. 14. Table 9 summarizes the total input channels for the six representative motor designs under the assumption of a Mode I instrumentation, and either a Class I or Class V switching device configuration. This table also indicates two voltages of importance:

a. The voltage impressed per stator coil, and b. The induced stator coil voltage in the upper coil by a full short circuit (at terminals) of the lower coil.

TABLE 9

Instrumentation/Diagnostic Points for Each Stator Winding with Class I and Class V Switching and Showing Thyristor-Isolating Switch Rating Based on Designs MT08–MT15 at 2401 Volts Line-Neutral

| Designation | MT08 | MT10 | MT11 | MT12 | MT13 | MT15 |
|---|---|---|---|---|---|---|
| Poles | 16 | 16 | 32 | 16 | 32 | 32 |
| Npar, No. of Parallels | 8 | 8 | 16 | 4 | 16 | 8 |
| Phases, m | 15 | 15 | 6 | 15 | 6 | 6 |
| Stator Slots | 240 | 240 | 192 | 240 | 192 | 192 |
| No. of Coils in Series Per Parallel Group | 2 | 2 | 2 | 4 | 2 | 4 |
| No. of Thyristor Pair Isolating Switches | 120 | 120 | 96 | 60 | 96 | 48 |
| Class | V | V | V | I | V | I |
| Instrumentation Points for Mode I | 121 | 121 | 97 | 61 | 97 | 49 |
| Instrumentation Points for Mode II | 241 | 241 | 193 | 241 | 193 | 193 |
| Thyristor Pair Rating, Average Current (A) | 71 | 71 | 88 | 142 | 88 | 177 |
| Phase Current (A) @ 2401 Volts LN. | 628 | 628 | 1570 | 628 | 1570 | 1570 |
| Voltage Impressed Per Stator Coil @ No-Load* | 1200 | 1200 | 1200 | 600 | 1200 | 600 |
| Induced Voltage in Top Coil By Short-In Lower Coil | 1151 | 1151 | 1155 | 574 | 1155 | 577 |

*Prior to calculation using distribution factor.

The high volts per coil such as 1200 V rms requires a high number of turns e.g., 37 turns per coil in Designs MT08, MT10, MT11 and MT12. The instrumentation of the coils requires optical isolation of these stator voltage for input to the main controller. Table 10 shows an instrumentation schedule for a 32-pole machine (MT15) with 49 instrumentation points and 48 thyristor switches. Table 11 shows the correlation between the coil numbers and the pole numbers, as also used in Table 10.

TABLE 10

Instrumentation of Diagnostic Points In Stator Winding for MT15 (32-Pole)

| Point | Coils | Switch | Phase No. | Pole No. |
|---|---|---|---|---|
| 0 | 192, 48, 96, 144 | T0 | 1 | 32, 8, 16, 24 |
| 1 | 6, 54, 102, 150 | T1 | 1 | 1, 9, 17, 25 |
| 2 | 12, 60, 108, 156 | T2 | 1 | 2, 10, 18, 26 |
| 3 | 18, 66, 114, 162 | T3 | 1 | 3, 11, 19, 27 |
| 4 | 24, 72, 120, 168 | T4 | 1 | 4, 12, 20, 28 |
| 5 | 30, 78, 126, 174 | T5 | 1 | 5, 13, 21, 29 |
| 6 | 36, 84, 132, 180 | T6 | 1 | 6, 14, 22, 30 |
| 7 | 42, 90, 138, 186 | T7 | 1 | 7, 15, 23, 31 |
| 8 | 1, 49, 97, 145 | T8 | 2 | 1, 9, 17, 25 |
| 9 | 7, 55, 103, 151 | T9 | 2 | 2, 10, 18, 26 |
| 10 | 13, 61, 109, 157 | T10 | 2 | 3, 11, 19, 27 |
| 11 | 19, 67, 115, 163 | T11 | 2 | 4, 12, 20, 28 |
| 12 | 25, 73, 121, 169 | T12 | 2 | 5, 13, 21, 29 |
| 13 | 31, 79, 127, 175 | T13 | 2 | 6, 14, 22, 30 |
| 14 | 37, 85, 133, 181 | T14 | 2 | 7, 15, 23, 31 |
| 15 | 43, 91, 139, 187 | T15 | 2 | 8, 16, 24, 32 |
| 16 | 2, 50, 98, 146 | T16 | 3 | 1, 9, 17, 25 |
| 17 | 8, 56, 104, 152 | T17 | 3 | 2, 10, 18, 26 |
| 18 | 14, 62, 110, 158 | T18 | 3 | 3, 11, 19, 27 |
| 19 | 20, 68, 116, 164 | T19 | 3 | 4, 12, 20, 28 |
| 20 | 26, 74, 122, 170 | T20 | 3 | 5, 13, 21, 29 |
| 21 | 32, 80, 128, 176 | T21 | 3 | 6, 14, 22, 30 |
| 22 | 38, 86, 134, 182 | T22 | 3 | 7, 15, 23, 31 |
| 23 | 44, 92, 140, 188 | T23 | 3 | 8, 16, 24, 32 |
| 24 | 3, 51, 99, 147 | T24 | 4 | 1, 9, 17, 25 |
| 25 | 9, 57, 105, 153 | T25 | 4 | 2, 10, 18, 26 |
| 26 | 15, 63, 111, 159 | T26 | 4 | 3, 11, 19, 27 |
| 27 | 21, 69, 117, 165 | T27 | 4 | 4, 12, 20, 28 |
| 28 | 27, 75, 123, 171 | T28 | 4 | 5, 13, 21, 29 |
| 29 | 33, 81, 129, 177 | T29 | 4 | 6, 14, 22, 30 |
| 30 | 39, 87, 135, 183 | T30 | 4 | 7, 15, 23, 31 |
| 31 | 45, 93, 141, 189 | T31 | 4 | 8, 16, 24, 32 |
| 32 | 4, 52, 100, 148 | T32 | 5 | 1, 9, 17, 25 |
| 33 | 10, 58, 106, 154 | T33 | 5 | 2, 10, 18, 26 |
| 34 | 16, 64, 112, 160 | T34 | 5 | 3, 11, 19, 27 |
| 35 | 22, 70, 118, 166 | T35 | 5 | 4, 12, 20, 28 |
| 36 | 28, 76, 124, 172 | T36 | 5 | 5, 13, 21, 29 |
| 37 | 34, 82, 130, 178 | T37 | 5 | 6, 14, 22, 30 |
| 38 | 40, 88, 136, 184 | T38 | 5 | 7, 15, 23, 31 |
| 39 | 46, 94, 142, 190 | T39 | 5 | 8, 16, 24, 32 |
| 40 | 5, 53, 101, 149 | T40 | 6 | 1, 9, 17, 25 |
| 41 | 11, 59, 107, 155 | T41 | 6 | 2, 10, 18, 26 |
| 42 | 17, 65, 113, 161 | T42 | 6 | 3, 11, 19, 27 |
| 43 | 23, 71, 119, 167 | T43 | 6 | 4, 12, 20, 28 |
| 44 | 29, 77, 125, 173 | T44 | 6 | 5, 13, 21, 29 |
| 45 | 35, 83, 131, 179 | T45 | 6 | 6, 14, 22, 30 |
| 46 | 41, 89, 137, 185 | T46 | 6 | 7, 15, 23, 31 |
| 47 | 47, 95, 143, 191 | T47 | 6 | 8, 16, 24, 32 |
| 48 | — | T48 | N | — |

TABLE 11

Pole Groups for 32 Pole, 6-Phase, 192 slot Machine (MT15)

| Coil No. | Pole No. | Coil No. | Pole No. |
|---|---|---|---|
| 1–6 | 1 | 97–102 | 17 |
| 7–12 | 2 | 103–108 | 18 |
| 13–18 | 3 | 109–114 | 19 |
| 19–24 | 4 | 115–120 | 20 |
| 25–30 | 5 | 121–126 | 21 |
| 31–36 | 6 | 127–132 | 22 |
| 37–42 | 7 | 133–138 | 23 |
| 43–48 | 8 | 139–144 | 24 |
| 49–54 | 9 | 145–150 | 25 |
| 55–60 | 10 | 151–156 | 26 |
| 61–66 | 11 | 157–162 | 27 |
| 67–72 | 12 | 163–168 | 28 |
| 73–78 | 13 | 169–174 | 29 |
| 79–84 | 14 | 175–180 | 30 |
| 85–90 | 15 | 181–186 | 31 |
| 91–96 | 16 | 187–192 | 32 |

The total instrumentation requirement for fault diagnostics is given in Table 12 for the MT 15 example.

TABLE 12

Instrumentation for a Class I, Mode I

| | |
|---|---|
| Stator Coil Groups Voltage Sensors on Each Parallel | 48 |
| Terminal Phase Voltage Measurement | 6 |
| Stator Parallel Group Phase Current | 48 |
| Stator Terminal Phase Current | 6 |
| Total $N_c$ = | 108 Channels |

Thus, the general formula for instrumentation channels can be derived as:

$$N_c = 2(m \times \text{Par}) + 2(m)$$

Where m=number of phases, Par=No. of parallels per phase. It is clear that the other 5 designs (MT08–MT13) will have more channels than 108 since these have a larger products of phases×parallels, e.g., MT08 and MT10 will have 270 channels each.

Figure 40:
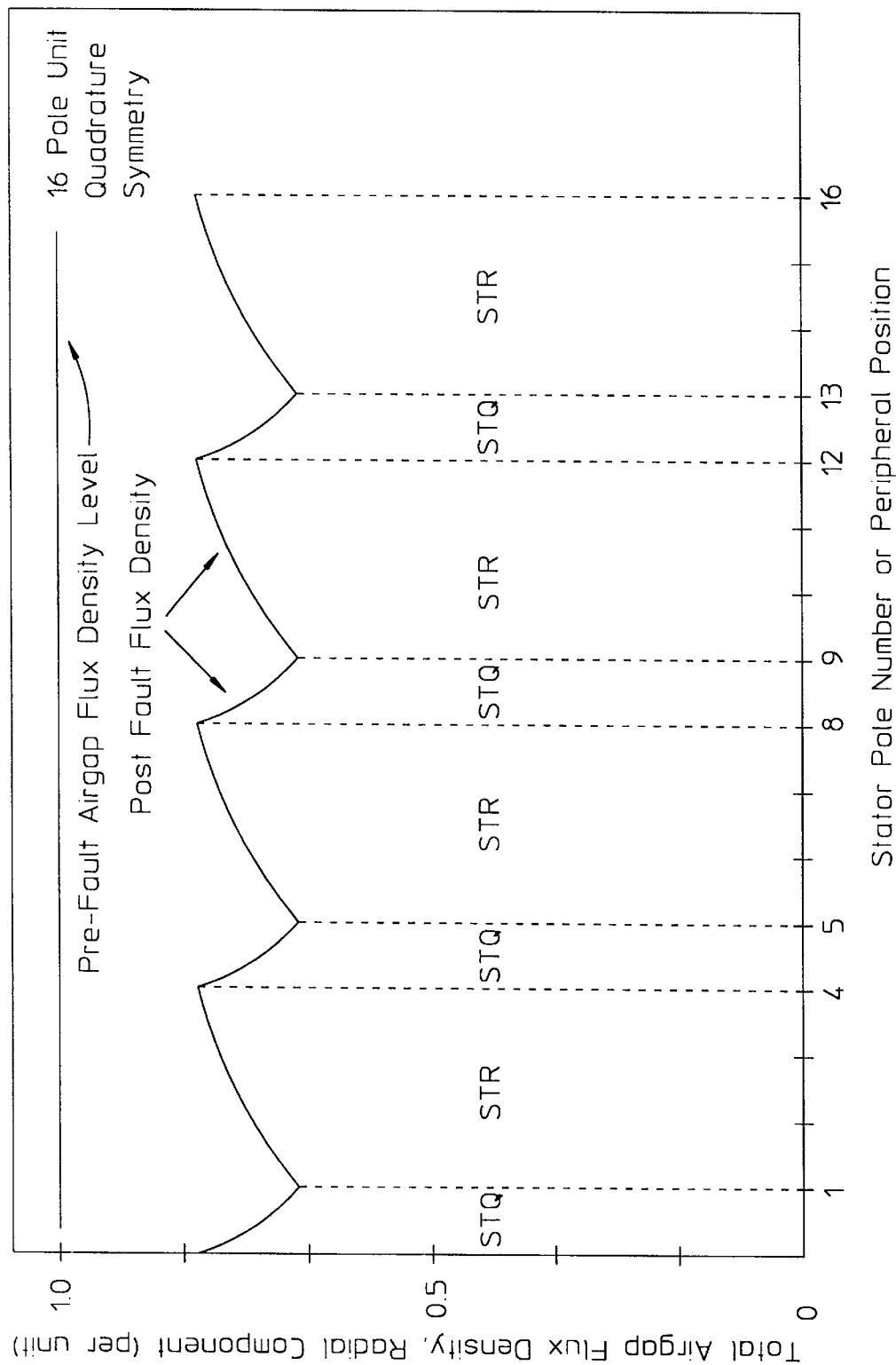
FIG. 40. The total airgap flux density for a 16 pole AC machine with quadrature symmetry versus stator peripheral position.

FIG. 40 shows a graph of the spatial distribution of airgap flux for the case of quadrature symmetry which plots the radial-component of the total airgap magnetic field density versus the peripheral position along the mean airgap for the specific example of a 16-pole machine with the described IFD system and winding switching in effect on 4 of the 16 poles.

Figure 41:
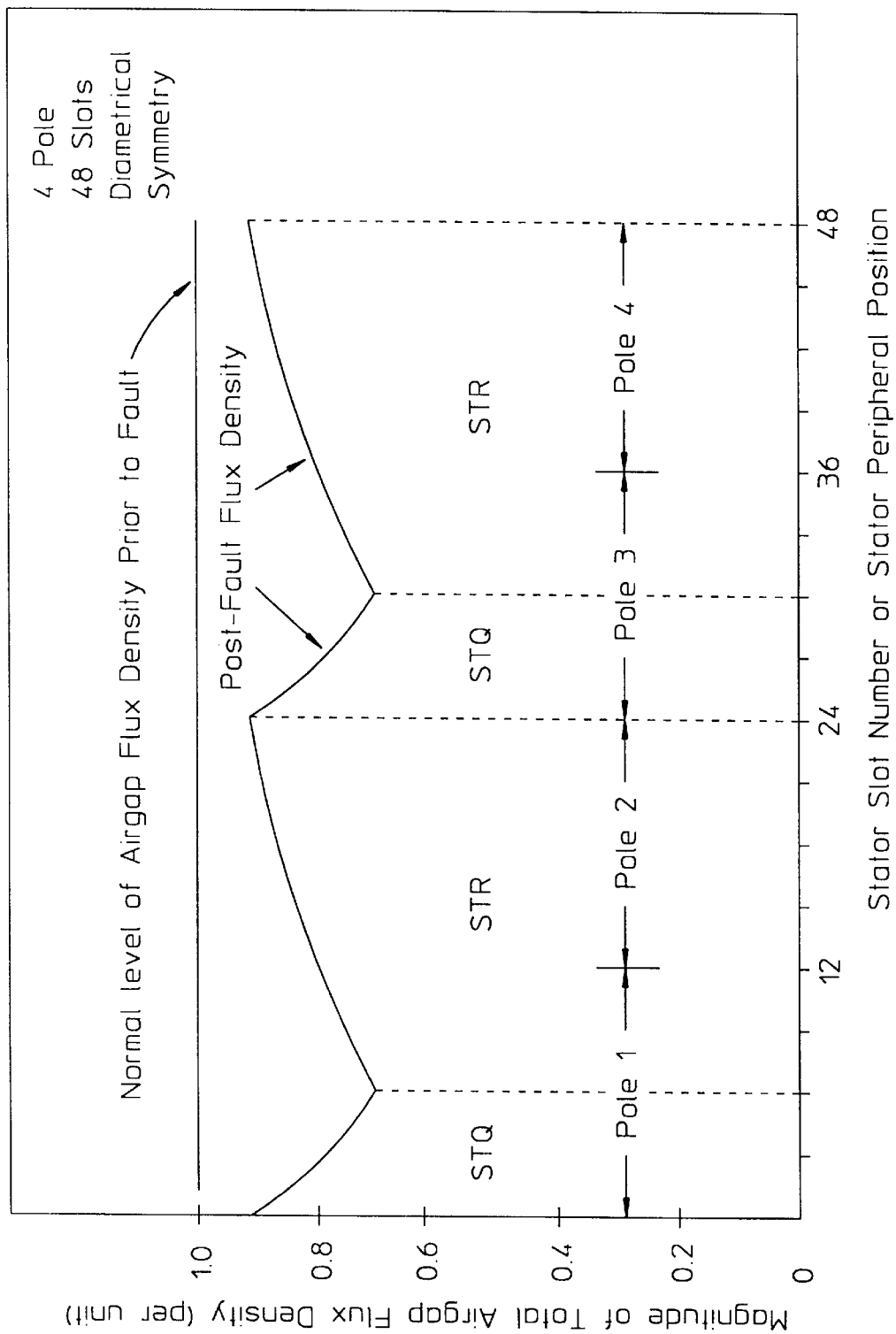
FIG. 41. The total airgap flux density for a 4 pole AC machine with diammetrical symmetry versus stator peripheral position.

FIG. 41 shows a graph of the spatial distribution of airgap flux for the case of diammetrical symmetry which plots the radial-component of the total airgap magnetic field density versus the peripheral position along the mean airgap for the specific example of a 4 pole machine with the described IFD system and winding switching apparatus in effect on a fractional pole in each of two sectors of this machine.

It should be clear to those skilled in the art that the above flux distributions also apply to linear synchronous or linear induction machines where the peripheral position of FIGS. 40 and 41 is substituted with longitudinal position along the airgap of the linear machine. Both FIGS. 40 and 41 show the airgap flux density rising and falling with an exponential characteristic and dependent on the direction of the rotor. Sections STR show an exponential rise in flux density and sections STQ show an exponential fall in flux density, each with separate spatial attenuation constants dependent on the stator pole-pitch, rotor time constant. The described invention in its control scheme attempts to establish magnetic symmetry of the airgap flux with the exponential rise/fall of airgap flux as shown in FIGS. 41 and 42 considered to be a preferred embodiment. A detailed discourse on the physics of electromagnetics of large AC machinery with partially-cutout windings can be found in "Brushless Asynchronous Induction Machines with Leading VAR Capability," Ph.D. Thesis, University of London, Imperial College, UK, 1981, S. B. Kuznetsov, published by the inventor.

TABLE 13

V-CURVES FOR NSWC SYNCHRONOUS MACHINES
PHASES = 15.0 BORE DIAMETER = 2.53 VOLTAGE = 2.4 KV
APPARENT POWER = 22.61 MVA' COS-FI = .85 OVEREXCITED
FREQUENCY = 20.0
POTIER REACTANCE = .207 P.U.
ARMATURE REACTION = 612600. A.T.
1.0 P.U. ROTOR MMF AT RATED VOLTAGE (OPEN CIRCUIT CHARACTERISTIC) = 437800. A.T. 1.0 P.U.
Equivalent Excitation If (A) = 1257.0 AMP
OPEN CIRCUIT CHARACTERISTIC

| FLUX PER METER | | ROTOR MMF | |
|---|---|---|---|
| (VS/M) | (P.U.) | (AT) | (P.U.) |
| .00000 | .000 | 0. | .000 |
| .06200 | .219 | 86000. | .196 |
| .12200 | .431 | 171600. | .392 |
| .18000 | .636 | 257300. | .588 |
| .23200 | .820 | 343100. | .784 |
| .27900 | .986 | 428900. | .980 |
| .28300 | 1.000 | 437800. | 1.000 |
| .30900 | 1.092 | 514700. | 1.176 |
| .33300 | 1.177 | 600400. | 1.371 |
| .34300 | 1.212 | 643000. | 1.469 |
| .35200 | 1.244 | 686000. | 1.567 |
| .35900 | 1.269 | 729000. | 1.665 |
| .36600 | 1.293 | 772000. | 1.763 |
| .37200 | 1.314 | 815000. | 1.862 |
| .37700 | 1.332 | 858000. | 1.960 |
| .38200 | 1.350 | 900000. | 2.056 |
| .36700 | 1.367 | 943000. | 2.154 |
| .39200 | 1.385 | 966000. | 2.252 |
| .39700 | 1.403 | 1029000. | 2.350 |
| .40000 | 1.413 | 1072000. | 2.449 |
| .40400 | 1.428 | 1115000. | 2.547 |
| .40700 | 1.436 | 1158000. | 2.645 |
| .41000 | 1.449 | 1200900. | 2.743 |
| .41500 | 1.466 | 1286700. | 2.939 |
| .00000 | .000 | 0. | .000 |
| .00000 | .000 | 0. | .000 |
| .00000 | .000 | 0. | .000 |
| .00000 | .000 | 0. | .000 |
| .00000 | .000 | 0. | .000 |
| .00000 | .000 | 0. | .000 |

| PER UNIT LOAD | POWER FACTOR | APPARENT PWR (MVA) | INT. VOLTAGE (UI), PU | Equivalent If (A) |
|---|---|---|---|---|
| .25 | .05 UNDEREXCITED | 96.09 | 1.879 | 7475.24 |
| .25 | .10 UNDEREXCITED | 48.05 | 1.438 | 7060.28 |
| .25 | .15 UNDEREXCITED | 32.03 | 1.291 | 4687.36 |
| .25 | .20 UNDEREXCITED | 24.02 | 1.216 | 3716.85 |
| .25 | .25 UNDEREXCITED | 19.22 | 1.171 | 3184.55 |
| .25 | .30 UNDEREXCITED | 16.02 | 1.141 | 2640.50 |
| .25 | .35 UNDEREXCITED | 13.73 | 1.119 | 2591.23 |
| .25 | .40 UNDEREXCITED | 12.01 | 1.102 | 2400.94 |
| .25 | .45 UNDEREXCITED | 10.68 | 1.088 | 2251.52 |
| .25 | .50 UNDEREXCITED | 9.61 | 1.077 | 2132.78 |
| .25 | .55 UNDEREXCITED | 8.74 | 1.068 | 2032.54 |
| .25 | .60 UNDEREXCITED | 8.01 | 1.060 | 1945.82 |
| .25 | .65 UNDEREXCITED | 7.39 | 1.052 | 1869.08 |
| .25 | .70 UNDEREXCITED | 6.86 | 1.046 | 1799.62 |
| .25 | .75 UNDEREXCITED | 6.41 | 1.040 | 1735.26 |
| .25 | .80 UNDEREXCITED | 6.01 | 1.034 | 1674.00 |
| .25 | .85 UNDEREXCITED | 5.65 | 1.028 | 1613.67 |
| .25 | .90 UNDEREXCITED | 5.34 | 1.022 | 1551.12 |
| .25 | .95 UNDEREXCITED | 5.06 | 1.015 | 1479.49 |
| .25 | 1.00 | 4.80 | 1.001 | 1329.27 |
| .25 | .95 OVEREXCITED | 5.06 | .987 | 1188.58 |
| .25 | .90 OVEREXCITED | 5.34 | .980 | 1124.89 |
| .25 | .85 OVEREXCITED | 5.65 | .974 | 1070.14 |
| .25 | .80 OVEREXCITED | 6.01 | .968 | 1017.98 |
| .25 | .80 OVEREXCITED | 6.01 | .968 | 1017.98 |
| .25 | .75 OVEREXCITED | 6.41 | .962 | 965.73 |
| .25 | .70 OVEREXCITED | 6.86 | .956 | 911.69 |
| .25 | .65 OVEREXCITED | 7.39 | .950 | 654.50 |
| .25 | .60 OVEREXCITED | 8.01 | .942 | 792.90 |
| .25 | .55 OVEREXCITED | 8.74 | .934 | 725.77 |
| .25 | .50 OVEREXCITED | 9.61 | .925 | 652.35 |
| .25 | .45 OVEREXCITED | 10.68 | .914 | 573.24 |
| .25 | .40 OVEREXCITED | 12.01 | .900 | 493.62 |
| .25 | .35 OVEREXCITED | 13.73 | .883 | 434.52 |
| .25 | .30 OVEREXCITED | 16.02 | .861 | 450.50 |
| .25 | .25 OVEREXCITED | 19.22 | .831 | 618.42 |
| .25 | .20 OVEREXCITED | 24.02 | .786 | 969.63 |
| .25 | .15 OVEREXCITED | 32.03 | .711 | 1680.16 |
| .25 | .10 OVEREXCITED | 48.05 | .564 | 3097.80 |
| .25 | .05 OVEREXCITED | 96.09 | .129 | 7341.34 |

| PER UNIT LOAD | POWER FACTOR | APPARENT PWR (MVA) | UIM, PU | Equivalent If (A) |
|---|---|---|---|---|
| .50 | .05 UNDEREXCITED | 192.18 | 2.759 | 15095.93 |
| .50 | .10 UNDEREXCITED | 96.09 | 1.877 | 7620.52 |
| .50 | .15 UNDEREXCITED | 64.06 | 1.582 | 5128.34 |
| .50 | .20 UNDEREXCITED | 48.05 | 1.434 | 6993.27 |
| .50 | .25 UNDEREXCITED | 38.44 | 1.344 | 5507.70 |
| .50 | .30 UNDEREXCITED | 32.03 | 1.283 | 4623.54 |
| .50 | .35 UNDEREXCITED | 27.46 | 1.239 | 4043.36 |
| .50 | .40 UNDEREXCITED | 24.02 | 1.205 | 3637.29 |
| .50 | .45 UNDEREXCITED | 21.35 | 1.178 | 3324.30 |
| .50 | .50 UNDEREXCITED | 19.22 | 1.156 | 3079.66 |
| .50 | .55 UNDEREXCITED | 17.47 | 1.137 | 2874.46 |
| .50 | .60 UNDEREXCITED | 16.02 | 1.121 | 2697.66 |
| .50 | .65 UNDEREXCITED | 14.78 | 1.106 | 2541.89 |
| .50 | .70 UNDEREXCITED | 13.73 | 1.093 | 2401.62 |
| .50 | .75 UNDEREXCITED | 12.81 | 1.081 | 2277.46 |
| .50 | .80 UNDEREXCITED | 12.01 | 1.070 | 2160.66 |
| .50 | .65 UNDEREXCITED | 11.31 | 1.055 | 2046.45 |
| .50 | .90 UNDEREXCITED | 10.68 | 1.046 | 1929.09 |
| .50 | .95 UNDEREXCITED | 10.12 | 1.033 | 1796.32 |
| .50 | 1.00 | 9.61 | 1.004 | 1525.84 |
| .50 | .95 OVEREXCITED | 10.12 | .975 | 1290.56 |
| .50 | .90 OVEREXCITED | 10.68 | .961 | 1191.67 |
| .50 | .85 OVEREXCITED | 11.31 | .950 | 1112.14 |
| .50 | .80 OVEREXCITED | 12.01 | .938 | 1042.73 |
| .50 | .75 OVEREXCITED | 12.81 | .927 | 981.05 |
| .50 | .70 OVEREXCITED | 13.73 | .914 | 927.57 |
| .50 | .65 OVEREXCITED | 14.78 | .901 | 885.09 |
| .50 | .60 OVEREXCITED | 16.02 | .287 | 859.13 |
| .50 | .55 OVEREXCITED | 17.47 | .871 | 858.40 |
| .50 | .50 OVEREXCITED | 19.22 | .852 | 894.98 |
| .50 | .45 OVEREXCITED | 21.35 | .830 | 983.57 |
| .50 | .40 OVEREXCITED | 24.02 | .803 | 1139.56 |
| .50 | .35 OVEREXCITED | 27.46 | .770 | 1382.90 |
| .50 | .30 OVEREXCITED | 32.03 | .726 | 1746.24 |
| .50 | .25 OVEREXCITED | 36.44 | .665 | 2288.15 |
| .50 | .20 OVEREXCITED | 48.05 | .576 | 3121.32 |
| .50 | .15 OVEREXCITED | 64.06 | .429 | 4527.12 |
| .50 | .10 OVEREXCITED | 96.09 | .153 | 7346.23 |
| .50 | .05 OVEREXCITED | 192.18 | .762 | 15856.79 |

| PER UNIT LOAD | POWER FACTOR | APPARENT PWR (MVA) | UIM, PU | Equivalent If (A) |
|---|---|---|---|---|
| .75 | .05 UNDEREXCITED | 286.28 | 3.638 | 23333.79 |
| .75 | .10 UNDEREXCITED | 144.14 | 2.317 | 12120.23 |
| .75 | .15 UNDEREXCITED | 96.09 | 1.874 | 8380.80 |
| .75 | .20 UNDEREXCITED | 72.07 | 1.652 | 6508.83 |
| .75 | .25 UNDEREXCITED | 57.66 | 1.517 | 5382.96 |
| .75 | .30 UNDEREXCITED | 48.05 | 1.426 | 6884.41 |
| .75 | .35 UNDEREXCITED | 41.18 | 1.360 | 5806.99 |
| .75 | .40 UNDEREXCITED | 36.03 | 1.309 | 5050.55 |
| .75 | .45 UNDEREXCITED | 32.03 | 1.269 | 4511.31 |
| .75 | .50 UNDEREXCITED | 28.83 | 1.236 | 4090.55 |
| .75 | .55 UNDEREXCITED | 26.21 | 1.208 | 3762.30 |
| .75 | .60 UNDEREXCITED | 24.02 | 1.183 | 3488.80 |
| .75 | .65 UNDEREXCITED | 22.15 | 1.162 | 3256.78 |
| .75 | .70 UNDEREXCITED | 20.59 | 1.142 | 3052.03 |
| .75 | .75 UNDEREXCITED | 19.22 | 1.124 | 2864.40 |
| .75 | .80 UNDEREXCITED | 18.02 | 1.107 | 2688.13 |
| .75 | .85 UNDEREXCITED | 16.96 | 1.090 | 2518.18 |
| .75 | .90 UNDEREXCITED | 16.02 | 1.072 | 2352.45 |
| .75 | .95 UNDEREXCITED | 15.17 | 1.052 | 2167.85 |

TABLE 13-continued

| | | | | |
|---|---|---|---|---|
| .75 | 1.00 | 14.41 | 1.009 | 1806.95 |
| .75 | .95 OVEREXCITED | 15.17 | .966 | 1525.66 |
| .75 | .90 OVEREXCITED | 16.02 | .945 | 1425.19 |
| .75 | .85 OVEREXCITED | 16.96 | .928 | 1357.00 |
| .75 | .80 OVEREXCITED | 18.02 | .911 | 1311.06 |
| .75 | .75 OVEREXCITED | 19.22 | .893 | 1286.32 |
| .75 | .70 OVEREXCITED | 20.59 | .875 | 1285.28 |
| .75 | .65 OVEREXCITED | 22.18 | .856 | 1312.66 |
| .75 | .60 OVEREXCITED | 24.02 | .835 | 1374.94 |
| .75 | .55 OVEREXCITED | 26.21 | .510 | 1479.75 |
| .75 | .50 OVEREXCITED | 28.83 | .783 | 1636.05 |
| .75 | .45 OVEREXCITED | 32.03 | .750 | 1857.49 |
| .75 | .40 OVEREXCITED | 36.03 | .710 | 2163.07 |
| .75 | .35 OVEREXCITED | 41.18 | .660 | 2582.48 |
| .75 | .30 OVEREXCITED | 48.05 | .595 | 3161.10 |
| .75 | .25 OVEREXCITED | 57.66 | .506 | 3988.45 |
| .75 | .20 OVEREXCITED | 72.07 | .377 | 5246.44 |
| .75 | .15 OVEREXCITED | 96.09 | .185 | 7354.41 |
| .75 | .10 OVEREXCITED | 144.14 | .340 | 11583.02 |
| .75 | .05 OVEREXCITED | 288.28 | 1.641 | 22812.28 |

| PER UNIT LOAD | POWER FACTOR | APPARENT PWR (MVA) | UIM, PU | Equivalent If (A) |
|---|---|---|---|---|
| 1.00 | .05 UNDEREXCITED | 384.37 | 4.518 | 30287.67 |
| 1.00 | .10 UNDEREXCITED | 192.18 | 2.756 | 15336.97 |
| 1.00 | .15 UNDEREXCITED | 128.12 | 2.167 | 10352.83 |
| 1.00 | .20 UNDEREXCITED | 96.09 | 1.870 | 7859.87 |
| 1.00 | .25 UNDEREXCITED | 76.87 | 1.691 | 6362.94 |
| 1.00 | .30 UNDEREXCITED | 64.06 | 1.569 | 5363.61 |
| 1.00 | .35 UNDEREXCITED | 54.91 | 1.481 | 4648.25 |
| 1.00 | .40 UNDEREXCITED | 48.05 | 1.414 | 6752.39 |
| 1.00 | .45 UNDEREXCITED | 42.71 | 1.361 | 5897.98 |
| 1.00 | .50 UNDEREXCITED | 38.44 | 1.317 | 5245.00 |
| 1.00 | .55 UNDEREXCITED | 34.94 | 1.279 | 4747.24 |
| 1.00 | .60 UNDEREXCITED | 32.03 | 1.247 | 4339.19 |
| 1.00 | .65 UNDEREXCITED | 29.57 | 1.218 | 4009.11 |
| 1.00 | .70 UNDEREXCITED | 27.46 | 1.193 | 3725.24 |
| 1.00 | .75 UNDEREXCITED | 25.62 | 1.168 | 3472.98 |
| 1.00 | .80 UNDEREXCITED | 24.02 | 1.146 | 3245.16 |
| 1.00 | .85 UNDEREXCITED | 22.61 | 1.123 | 3025.88 |
| 1.00 | .90 UNDEREXCITED | 21.35 | 1.099 | 2805.28 |
| 1.00 | .95 UNDEREXCITED | 20.23 | 1.072 | 2571.66 |
| 1.00 | 1.00 | 19.22 | 1.015 | 2140.06 |
| 1.00 | .95 OVEREXCITED | 20.23 | .958 | 1843.33 |
| 1.00 | .90 OVEREXCITED | 21.35 | .932 | 1759.92 |
| 1.00 | .85 OVEREXCITED | 22.61 | .908 | 1719.58 |
| 1.00 | .80 OVEREXCITED | 24.02 | .886 | 1711.22 |
| 1.00 | .75 OVEREXCITED | 25.62 | .863 | 1733.63 |
| 1.00 | .70 OVEREXCITED | 27.46 | .539 | 1789.17 |
| 1.00 | .65 OVEREXCITED | 29.57 | .814 | 1882.11 |
| 1.00 | .60 OVEREXCITED | 32.03 | .785 | 2017.72 |
| 1.00 | .55 OVEREXCITED | 34.94 | .754 | 2204.70 |
| 1.00 | .50 OVEREXCITED | 38.44 | .717 | 2454.71 |
| 1.00 | .45 OVEREXCITED | 42.71 | .674 | 2784.51 |
| 1.00 | .40 OVEREXCITED | 48.05 | .622 | 3218.09 |
| 1.00 | .35 OVEREXCITED | 54.91 | .558 | 3791.48 |
| 1.00 | .30 OVEREXCITED | 64.06 | .474 | 4574.61 |
| 1.00 | .25 OVEREXCITED | 76.87 | .364 | 5685.91 |
| 1.00 | .20 OVEREXCITED | 96.09 | .224 | 7365.88 |
| 1.00 | .15 OVEREXCITED | 128.12 | .238 | 10176.60 |
| 1.00 | .10 OVEREXCITED | 192.18 | .771 | 15862.89 |
| 1.00 | .05 OVEREXCITED | 384.37 | 2.511 | 30820.51 |

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. An alternating current dynamo electric machine of the synchronous type comprising:

an excitation supply;

electronic switching devices;

a winding fault detection system including means for classification and identification of winding faults or winding malfunctions, said fault detection system connected to the electronic switching devices; and segmented primary windings, each of said primary windings having a phase, each phase is grouped into sub-phases which are individually switched into or out of the excitation supply or isolated through said electronic switching devices in response to signals from the winding fault detection system.

2. A system as described in claim 1 wherein each primary winding includes a stator having a winding, and there is a rotor winding associated with each stator, each of said stators having magnetic sensors which detect phase angle and magnitude of an air gap flux by magnetic blocks between each rotor winding and each stator and derives a signal for a component of airgap flux contributing to electromagnetic torque at each position of each stator's periphery; and including means for continuous storage of instantaneous data derived from said signal, said storage means connected to said magnetic sensors.

3. A system as described in claim 2 including a direct magnetic axis and quadrature magnetic axis decomposition system connected to the magnetic sensors which measures and records input signals derived from the magnetic sensors to derive electromagnetic torque and reactive power component values at elemental positions along the stator periphery and to simultaneously detect and record the instantaneous current and terminal voltage of each sub-phase.

4. A system as described in claim 3 wherein the fault detection system sums elemental torques for each stator peripheral position and derives the instantaneous and average total torque from all the machine stator terminal measurements.

5. A system as described in claim 4 where the fault detection system compares elemental torque and reactive power component values from measured data with reference values and establishes threshold values for establishing if a malfunction condition is present in the stators.

6. A system as described in claim 3 wherein the fault detection system derives the equivalent electrical circuit parameters for selected stators based upon the input signal and is further able to compare these equivalent electrical circuit values with predetermined reference values.

7. A system as described in claim 6 wherein the fault detection system isolates or modulates selected segments of stator windings including a singular stator winding responsive to stator magnetic core or stator winding faults based upon a comparison of measured equivalent circuit values with reference values of equivalent circuit parameters for each stator winding.

8. A system as described in claim 6 wherein the fault detection system isolates or modulates selected segments of stator windings including singular stator coils responsive to stator core or stator winding faults based upon a comparison of airgap-flux equivalent circuit parameters derived from on-line measurements from the magnetic sensors with reference values of equivalent circuit parameters for selected stator coil groupings or stator sub-phases.

9. A system as described in claim 6 wherein the fault detection system utilizes simultaneous input of measured data from the magnetic sensors on elemental torque, reactive power and equivalent circuit parameters for each stator winding coil and an array comprising adjacent stator coils to determine data having the type, magnitude and classification of fault existing in the stator winding; and further including an electronic memory system in which the data determined by the internal fault detection system to constitute the fault classification is stored.

10. A system as described in claim 6 including a retrievable electronic memory system and wherein the fault detection system further determines and records in the retrievable electronic memory system elemental torque data, reactive power data and equivalent circuit parameters for each stator winding sub-phase or coil group to determine the type, magnitude and classification of fault existing in the stator magnetic core due to either coil-to-ground faults or magnetic core internal faults of interlamination insulation breakdown or lamination overheating.

11. A system as described in claim 9 wherein the fault detection system is able to distinguish between and classify different categories of winding faults known as either coil-to-coil conductive faults within the stator end-winding, coil-to-coil conductive faults within the stator core, coil-to-ground conductive faults within the stator, strand-to-strand conductive faults internal to the stator coil, and partial discharge breakdown of insulation of the stator winding.

12. A system as described in claim 11 whereby the fault detector system is able to distinguish between intermittent faults, continuous faults and non-recurrent faults according to a comparison of data derived from slot by slot magnetic field measurements, airgap flux sensors and reference data existing in the memory system.

13. A system as described in claim 12 whereby the electronic switching devices is coordinated by the internal fault detection system to minimize acoustic noise generated by unbalanced magnetic conditions occurring after a fault occurs and to minimize magnetic asymmetry of the airgap magnetic flux.

14. A system as described in claim 12 wherein the electronic switching devices are coordinated by the fault detection system to cause acoustic noise generated by unbalanced magnetic conditions occurring after a fault occurs to be less than 20 dB.

15. A system as described in claim 12 wherein there is at least a three phase to two phase transformation forming devices of a direct and quadrature axis decomposition circuit which is able to electronically calculate components of torque and reactive power from the airgap magnetic flux on a slot by slot or elemental basis.

16. A system as described in claim 12 wherein the fault detection system isolates the primary magnetomotive force of each phase winding by selectively switching-out coils or coil groups for the purpose of producing a near uniform spatial distribution of torque and reactive power along the machine periphery, said electronic switching devices including switchable bistable power devices in series with the primary coils or coil groups which are controlled to act in a sequential fashion in segregating or isolating groups of machine coils.

17. A system as described in claim 16 wherein the fault detection system programs the switchable bistable power devices to yield diametrical or quadrature magnetic symmetry, said system establishing a hierarchical system of control as to a sequence of isolation for the phase groups to yield a maximum magnetic symmetry at each operating speed.

18. A system as described in claim 16 wherein the fault detection system programs the switchable power devices to yield diametrical or quadrature magnetic symmetry of airgap flux and to minimize magneto-acoustic noise and torque pulsations of the machine, said fault detection system being able to display the actual electromagnetic torque and reactive power produced/absorbed by the machine prior to and subsequent to the isolation or shunting of phase windings.

19. A system as described in claim 17 wherein the fault detection system displays and records the elemental torque produced within 1.0 second of the occurrence of the fault and further predicts and displays the elemental torque/power output of the motor and the primary coil/primary winding reconfiguration recommended by the control system prior to enacting a fault mitigation scheme or switching of machine coils.

* * * * *